(12) United States Patent
Cha et al.

(10) Patent No.: US 12,026,015 B2
(45) Date of Patent: Jul. 2, 2024

(54) DISPLAY DEVICE

(71) Applicant: LG ELECTRONICS INC., Seoul (KR)

(72) Inventors: Taesung Cha, Seoul (KR); Kyungmin Jeong, Seoul (KR); Hyeongjun Kwon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 233 days.

(21) Appl. No.: 17/775,752

(22) PCT Filed: Nov. 13, 2019

(86) PCT No.: PCT/KR2019/015431
§ 371 (c)(1),
(2) Date: May 10, 2022

(87) PCT Pub. No.: WO2021/095911
PCT Pub. Date: May 20, 2021

(65) Prior Publication Data
US 2022/0382329 A1 Dec. 1, 2022

(51) Int. Cl.
*G06F 1/16* (2006.01)
(52) U.S. Cl.
CPC .......... *G06F 1/1652* (2013.01); *G06F 1/1656* (2013.01); *G06F 1/1688* (2013.01)
(58) Field of Classification Search
CPC .................................................. G06F 1/1652
See application file for complete search history.

(56) References Cited

U.S. PATENT DOCUMENTS 9,760,975 B2 * 9/2017 Kim ........................ G09F 9/00
9,844,152 B2 * 12/2017 Heo ...................... H05K 1/028
(Continued)

FOREIGN PATENT DOCUMENTS

KR  10-2014-0101611  8/2014
KR  10-2017-0062343  6/2017
(Continued)

OTHER PUBLICATIONS

PCT International Application No. PCT/KR2019/015431, International Search Report dated Aug. 6, 2020, 4 pages.

*Primary Examiner* — Adrian S Wilson
(74) *Attorney, Agent, or Firm* — LEE, HONG, DEGERMAN, KANG & WAIMEY

(57) ABSTRACT

This display device comprises: a housing; a roller; a display panel; a module cover that has a plurality of segments sequentially arranged in the vertical direction of the display panel from the rear side of the display panel, and winds or unwinds from the roller together with the display panel; a foldable link that is located on the rear side of the display panel, and has one side pivotably connected to the housing and the other side pivotably connected to the upper side of the module cover so as to keep the display panel and the module cover erect while unwinding the same from the roller; a speaker assembly that is installed inside the housing and has a curved surface corresponding to the curvature of the roller and spaced apart from the outer circumferential surface of the roller; and a buffering member that is fixed to the curved surface of the speaker assembly between the curved surface of the speaker assembly and the outer circumferential surface of the roller.

8 Claims, 65 Drawing Sheets

(56) References Cited

U.S. PATENT DOCUMENTS

2017/0156219 A1\* 6/2017 Heo ...................... G06F 1/1679
2017/0161868 A1\* 6/2017 Kim ...................... G06F 1/1601
2017/0359911 A1 12/2017 Hayk et al.

FOREIGN PATENT DOCUMENTS

KR  10-2017-0066838    6/2017
KR  10-2018-0107065    10/2018

\* cited by examiner

FIG.1
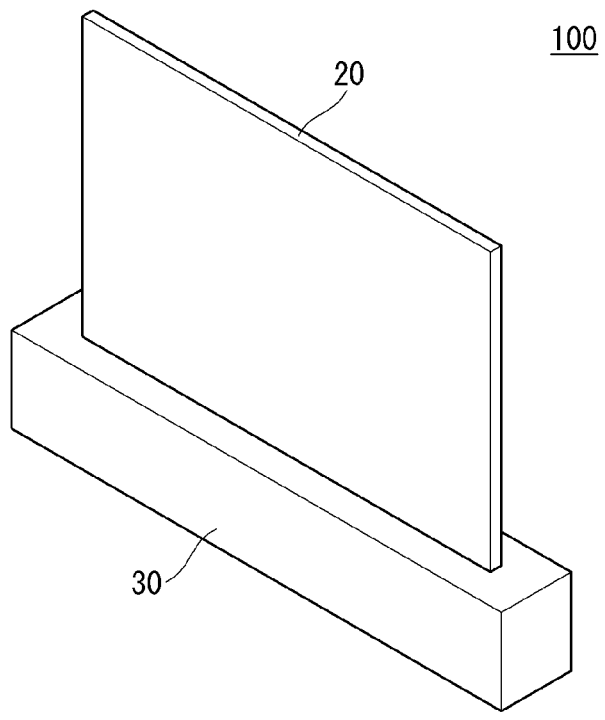
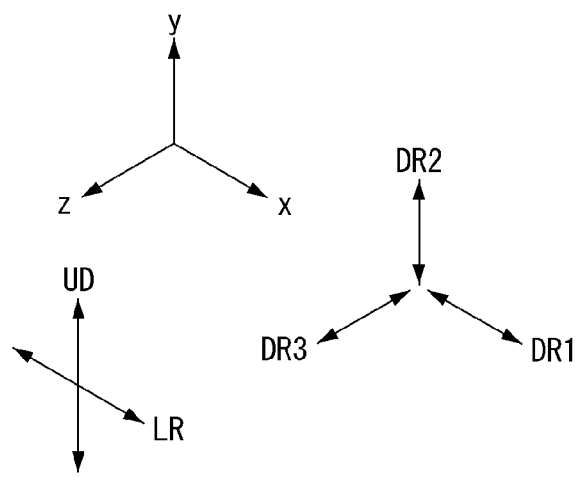

FIG.10
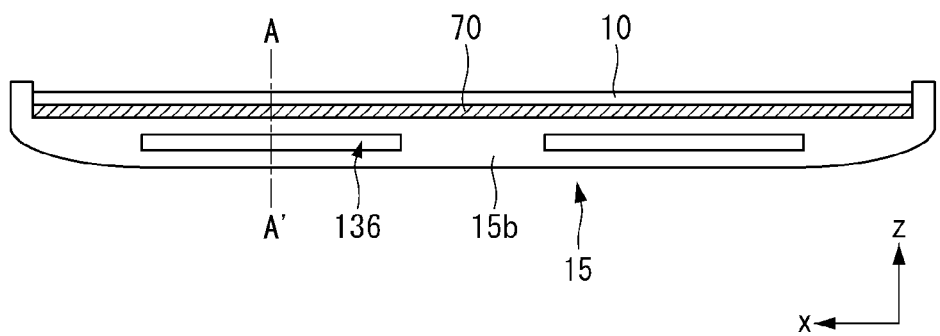
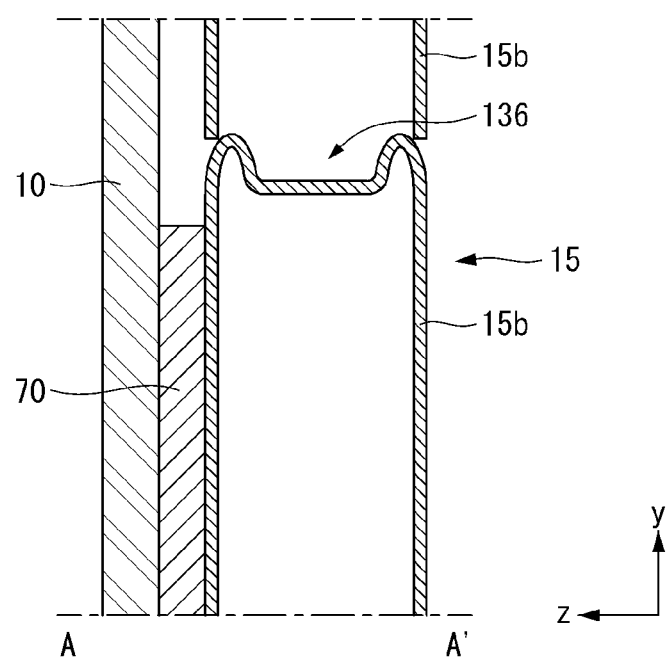

FIG.12
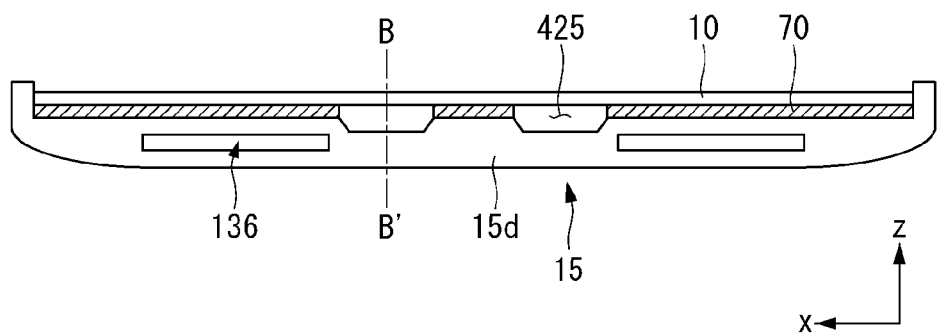
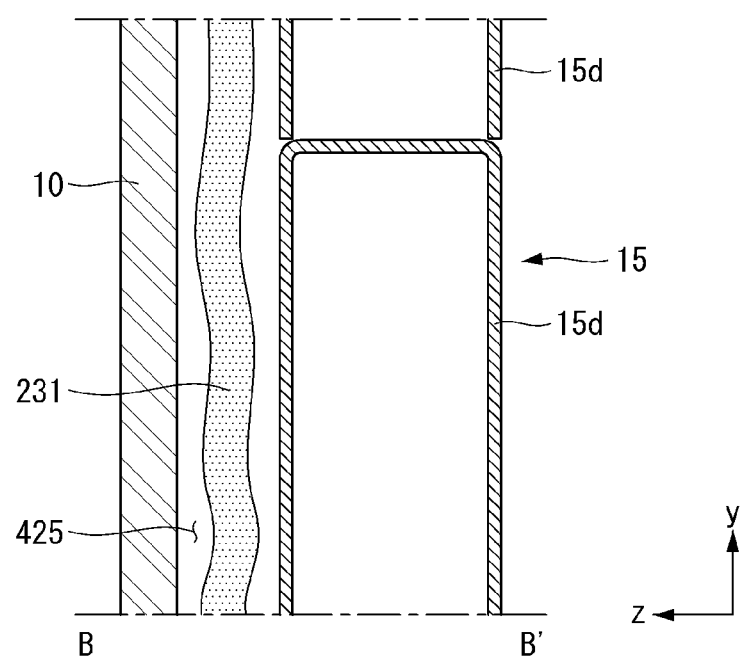

FIG.13
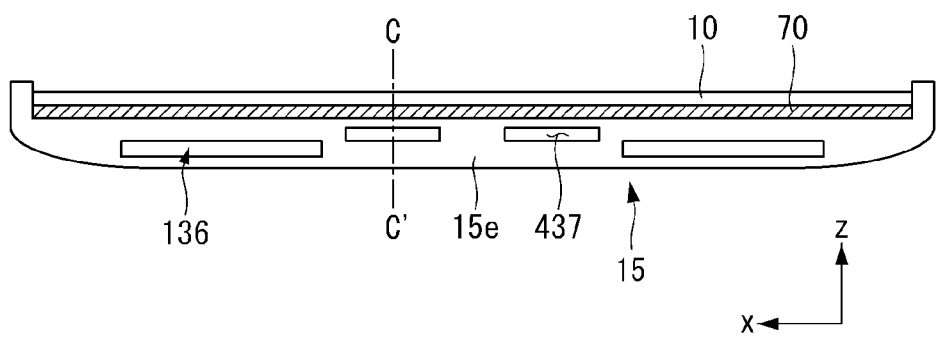
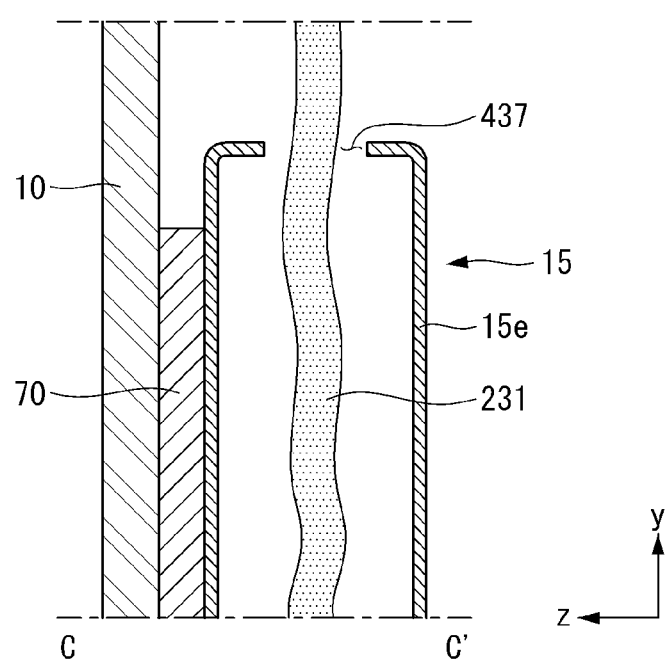

DISPLAY DEVICE

CROSS-REFERENCE TO RELATED APPLICATIONS

This application is the National Stage filing under 35 U.S.C. 371 of International Application No. PCT/KR2019/015431, filed on Nov. 13, 2019, the contents of which are \hereby incorporated by reference herein its entirety.

TECHNICAL FIELD

The present disclosure relates to a display device.

BACKGROUND ART

With the development of an information society, a demand for a display device increases in various forms, and according to the demand, in recent years, various display devices including a liquid crystal display device (LCD), a plasma display panel (PDP), an electro luminescent display (ELD), a vacuum fluorescent display (VFD), etc., have been researched and used.

Among them, the display device using the organic light emitting diode (OLED) has an advantage of being excellent in terms of luminance characteristics and viewing angle characteristics, ultra-thin because a backlight unit is not required as compared with the liquid crystal display device (LCD).

Further, a flexible display panel may be bent or rolled on a roller. A display device unrolled from the roller or rolled on the roller may be implemented by using the flexible display panel. A lot of researches into a structure for rolling the flexible display panel on the roller or unrolling the flexible display panel from the roller are made.

DISCLOSURE

Technical Problem

The present disclosure provides solving the problems and other problems.

Another object may be to prevent a damage which occurs as a panel or a module cover rolled on a roller is unrolled from the roller due to an external shock or vibration.

Yet another object may be to prevent deformation of the module cover exposed to the outside while being unrolled by the roller.

Still yet another object may be to prevent a damage which may occur due to a mutual collision of internal structures of a housing.

Technical Solution

In order to achieve the above-described object, in an aspect of the present, provided is a display device including: a housing which elongates, and has a base; a roller installed on the base inside the housing; a display panel rolled on or unrolled from the roller; a module cover which elongates in a longitudinal direction of the housing, and including a plurality of segments sequentially arranged in an up-down direction of the display panel in a rear of the display panel, and rolled on unrolled from the roller jointly with the display panel; a foldable link which is positioned in the rear of the display panel, and of which one side is pivotably connected to the housing and the other side is pivotably connected to a top of the module cover to erect the display panel and the module cover while unrolling the display panel and the module cover from the roller; a speaker assembly installed inside the housing, and including a curved surface corresponding to a curvature of the roller and spaced apart from an outer peripheral surface of the roller; and a buffer member fixed to the curved surface of the speaker assembly between the curved surface of the speaker assembly and the outer peripheral surface of the roller.

Further, according to another aspect of the present disclosure, the buffer member may include a first sub buffer member positioned at the top of the curved surface, and a second sub buffer member positioned at a bottom of the curved surface and positioned adjacent to the first sub buffer member.

Further, according to another aspect of the present disclosure, the segment of the module cover may include a first bead positioned adjacent to one end of the segment and penetrating the segment up and down, a second bead positioned adjacent to the other end of the segment and penetrating the segment up and down, and a penetration portion positioned between the first bead and the second bead, and penetrating the segment up and down, and the module cover may include a first area positioned between one end of the segment and the first bead, a second area positioned between the first bead and the penetration portion, a third area positioned between the penetration portion and the second bead, and a fourth area positioned between the second bead and the other end of the segment.

Further, according to another aspect of the present disclosure, the speaker assembly may include a first speaker assembly which elongates in the longitudinal direction of the housing toward the center from one side of the housing, and a second speaker assembly which elongates in the longitudinal direction of the housing toward the center from the other side of the housing, and a length of the segment of the module cover may be larger than a sum of the length of the first speaker assembly and the length of the second speaker assembly.

Further, according to another aspect of the present disclosure, the buffer member may include a first buffer member corresponding to the first area and positioned in the first speaker assembly, a second buffer member corresponding to the second area and positioned in the first speaker assembly, a third buffer member corresponding to the third area and positioned in the second speaker assembly, and a fourth buffer member corresponding to the fourth area and positioned in the second speaker assembly.

Further, in another aspect, provided is a display device including: a housing which elongates; a roller installed inside the housing; a display panel rolled on or unrolled from the roller; a module cover which elongates in a longitudinal direction of the housing, and including a plurality of segments sequentially arranged in an up-down direction of the display panel in a rear of the display panel, and rolled on unrolled from the roller jointly with the display panel; a foldable link which is positioned in the rear of the display panel, and of which one side is pivotably connected to the housing and the other side is pivotably connected to a top of the module cover to erect the display panel and the module cover while unrolling the display panel and the module cover from the roller; a base mounted on a lower end of the housing; and a bumper which protrudes toward an outer peripheral surface of the roller from the base and spaced apart from the outer peripheral surface of the roller.

Further, according to another aspect of the present disclosure, the display device may further include a buffer member fixed to an upper end of the buffer.

Further, according to another aspect of the present disclosure, the base may include a vertical portion extended toward the roller from the base, and a horizontal portion bent from the vertical portion of the base and positioned adjacent to a lower end of the outer peripheral surface of the roller, and he bumper may be formed on the horizontal portion.

Advantageous Effects

Effects of a display device according to the present disclosure will be described below.

According to at least one of embodiments of the present disclosure, it is possible to prevent a damage which occurs as a panel or a module cover rolled on a roller is unrolled from the roller due to an external shock or vibration.

According to at least one of embodiments of the present disclosure, it is possible to prevent deformation of the module cover exposed to the outside while being unrolled by the roller.

According to at least one of embodiments of the present disclosure, it is possible to prevent a damage which may occur due to a mutual collision of internal structures of a housing.

An additional range of an applicability of the present disclosure will be apparent from the following detailed description. However, since various changes and modifications can be clearly appreciated by those skilled in the art within the spirit and the scope of the present disclosure, the detailed description and a specific embodiment such as a preferred embodiment of the present disclosure should be appreciated as being just given as an example.

DESCRIPTION OF DRAWINGS

FIGS. 1 to 65 are diagrams illustrating examples of a display device according to embodiments of the present disclosure.

BEST MODE FOR DISCLOSURE

Figure 2:
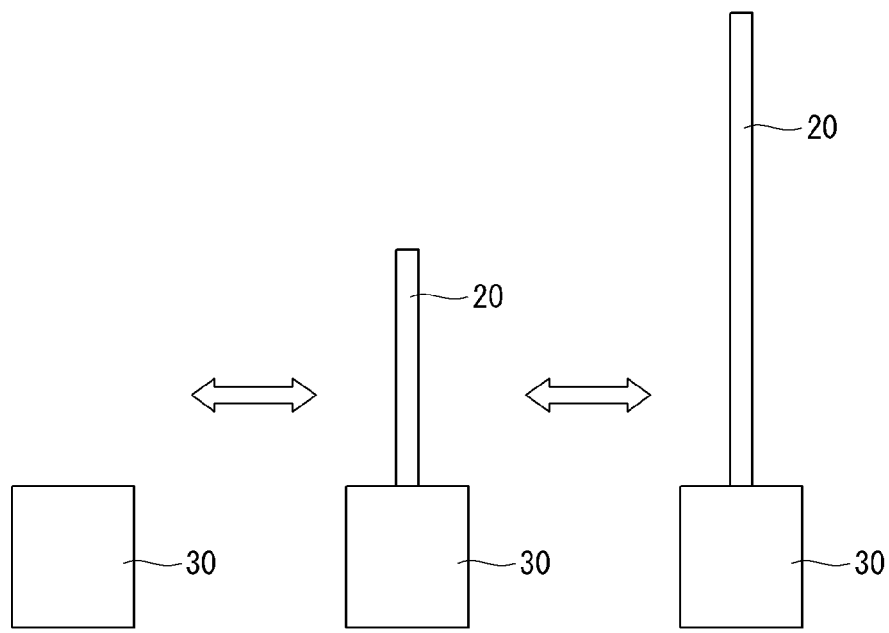

Hereinafter, embodiments disclosed in the present disclosure will be described in detail with reference to the accompanying figures and the same or similar components are denoted by the same reference numerals regardless of a sign of the figure, and duplicated description thereof will be omitted.

Suffixes "module" and "unit" for components used in the following description are given or mixed in consideration of easy preparation of the present disclosure only and do not have their own distinguished meanings or roles.

Further, in describing the embodiment of the present disclosure, a detailed description of related known technologies will be omitted if it is determined that the detailed description makes the gist of the embodiment disclosed in the present disclosure unclear. Further, it is to be understood that the accompanying figures are just used for easily understanding the embodiments disclosed in the present disclosure and a technical spirit disclosed in the present disclosure is not limited by the accompanying figures and all changes, equivalents, or substitutes included in the spirit and the technical scope of the present disclosure are included.

Terms including an ordinary number, such as first and second, are used for describing various elements, but the elements are not limited by the terms. The terms are used only to discriminate one element from another element.

It should be understood that, when it is described that a component is "connected to" or "accesses" another component, the component may be directly connected to or access the other component or a third component may be present therebetween. In contrast, when it is described that a component is "directly connected to" or "directly accesses" another component, it is understood that no element is present between the element and another element.

A singular form includes a plural form if there is no clearly opposite meaning in the context.

In the following description, even though the embodiment are described with reference to a specific figure, a reference numeral which is not illustrated in the specific figure can be mentioned if necessary, and the reference numeral not illustrated in the specific figure is used only when the reference numeral is illustrated in remaining figures.

Referring to FIG. 1, a display device 100 may include a display unit 20 and a housing 30. The housing 30 may include an internal space. At least a part of the display unit 20 may be positioned inside the housing 30. At least a part of the display unit 20 may be positioned outside the housing 30. The display unit 20 may display a screen.

Directions parallel to a longitudinal direction of the housing 30 may be referred to a first direction DR1, a +x-axis direction, a −x-axis direction, a left direction, or a right direction. A direction in which the display unit 20 displays the screen may be referred to as a +z-axis direction, a front direction, or a front side. An opposite direction to the in which the display unit 20 displays the screen may be referred to as a −z-axis direction, a rear direction, or a rear side. A third direction DR3 may be parallel to the +z-axis direction or the −z-axis direction. Directions parallel to a height direction of the display device 100 may be referred to a second direction DR2, a +y-axis direction, a −y-axis direction, an upper direction, or a lower direction.

The third direction DR3 may be a direction vertical to the first direction DR1 and/or the second direction DR2. The first direction DR1 and the second direction DR2 may be collectively referred to as a horizontal direction. Moreover, the third direction DR3 may be referred to as a vertical direction. A left-right direction LR may be parallel to the first direction DR1 and an up-down direction UD may be parallel to the second direction DR2.

Referring to FIG. 2, the entirety of the display unit 20 may be positioned inside the housing 30. At least a part of the display unit 20 may be positioned outside the housing 30. A degree at which the display unit 20 is exposed to the outside of the housing 30 may be adjusted as necessary.

Figure 3:
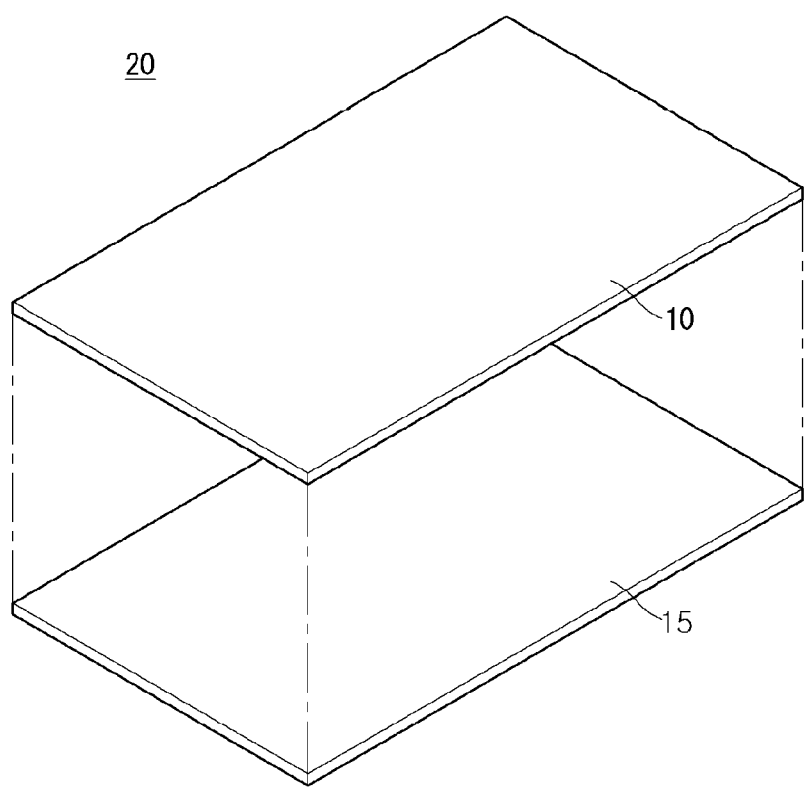

Referring to FIG. 3, the display unit 20 may include a display panel 10 and a plate 15. The display panel 10 may be flexible. For example, the display panel 10 may be an organic light emitting display (OLED).

The display panel 10 may have a front surface displaying an image. The display panel 10 may have a rear surface opposite to the front surface. The front surface of the display panel 10 may be covered with a light transmissive material. For example, the light transmissive material may be a synthetic resin or film.

The plate 15 may be coupled, fastened, or attached to the rear surface of the display panel 10. The plate 15 may include a metallic material. The plate 15 may be referred to as a module cover 15, a cover 15, a display panel cover 15, a panel cover 15, and an apron 15.

Figure 4:
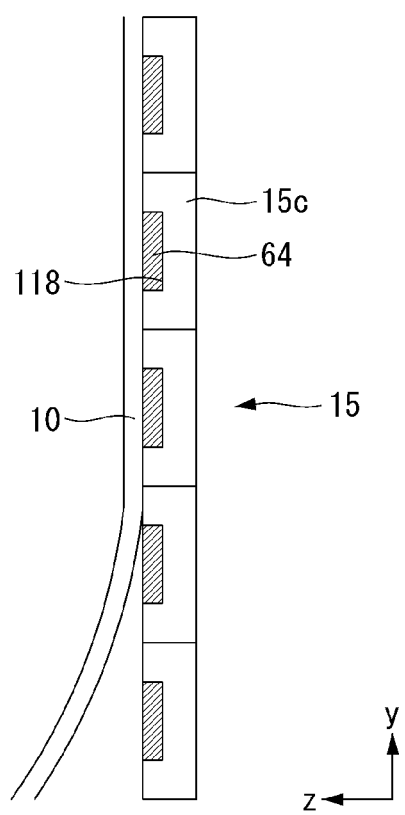

Referring to FIG. 4, the plate 15 may include a plurality of segments 15c. The magnet 64 may be positioned inside a recess 118 of the segment 15c. The recess 118 may be positioned on a surface facing the display panel 10 of the segment 15c. The recess 118 may be positioned on the front surface of each segment 15c. Since the magnet 64 is accommodated in the recess 118, the magnet 64 may not protrude to the outside of the segment 15c. Even though the display panel 10 contacts the segment 15c, the display panel 10 may not be crumpled but may be flat.

Figure 5:
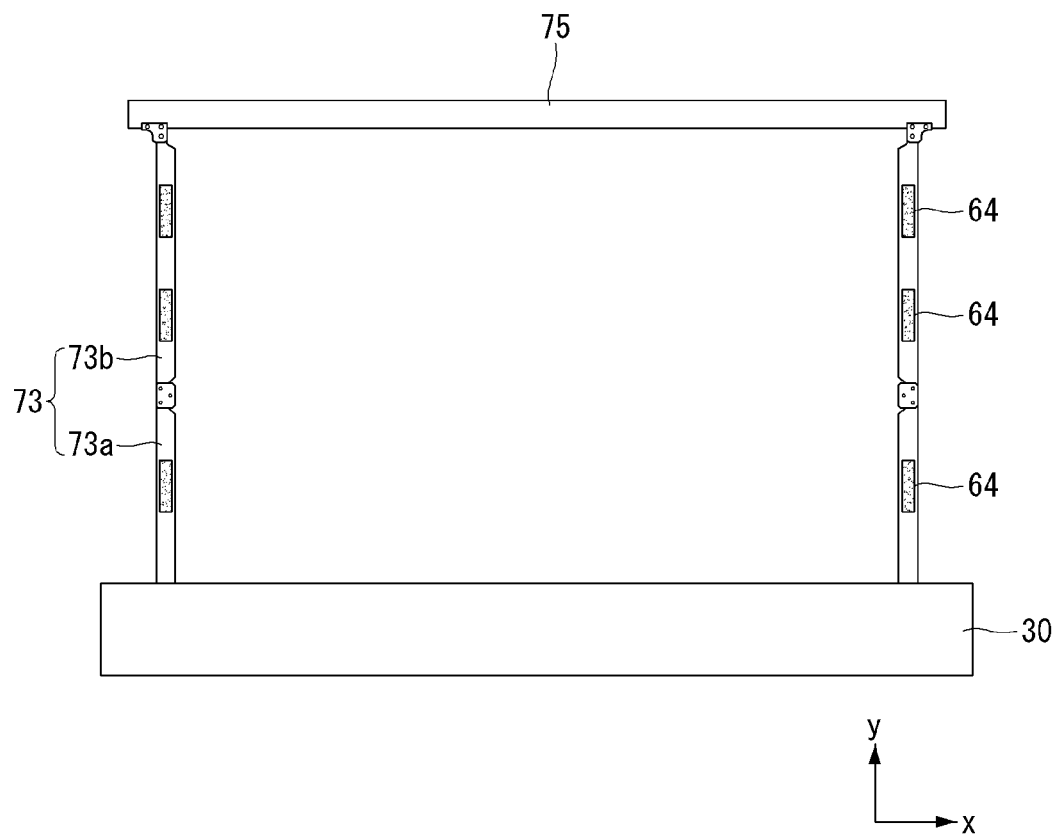

Referring to FIG. 5, a plurality of magnets 64 may be positioned on a link 73. For example, at least one magnet 64 may be positioned on a first arm 73a and at least one magnet 64 may be positioned on a second arm 73b. The plurality of magnets 64 may be spaced apart from each other.

Figure 6:
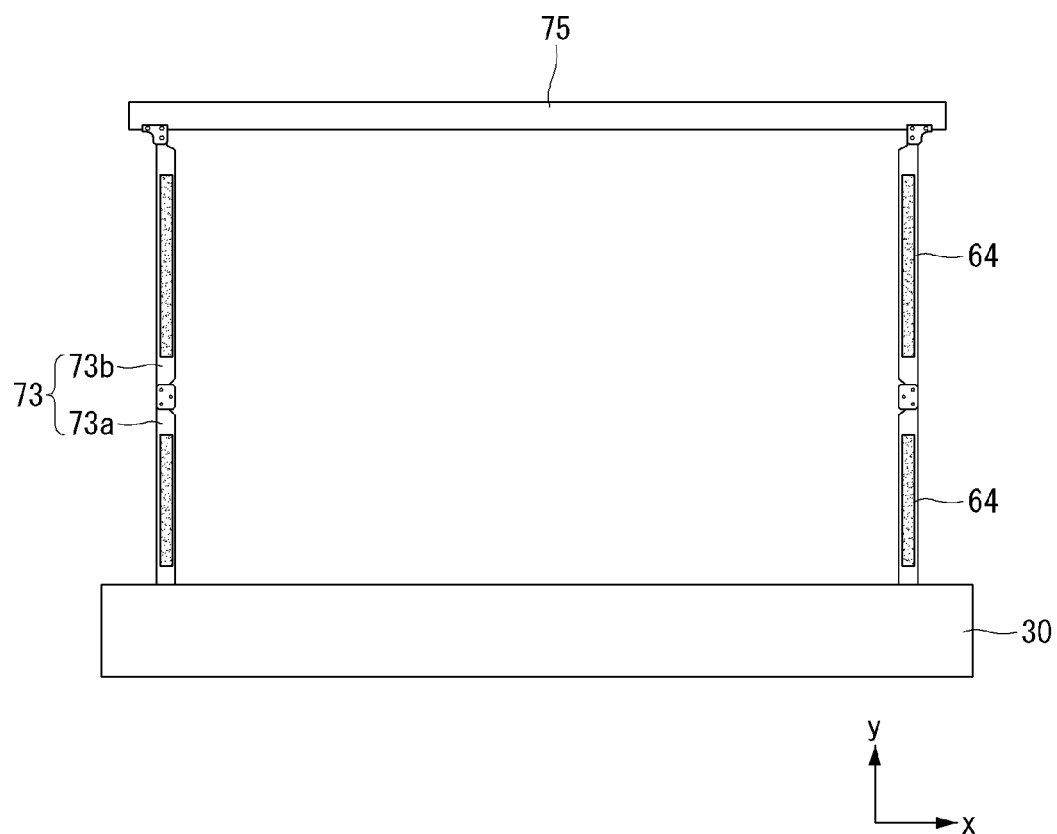

Referring to FIG. 6, one magnet 64 may be positioned on each of the first arm 73a and the second arm 73b. The magnet 64 may be a shape which elongates in long-side directions of the first arm 73a and the second 73b. Since the magnet 64 may be the shape which elongates in the long-side directions of the first arm 73a and the second 73b, an area of a portion where the link 73 is in close contact with the display panel and the module cover may be increased. As a result, a close contact force of the link 73, and the display panel and the module cover may be enhanced.

Figure 7:
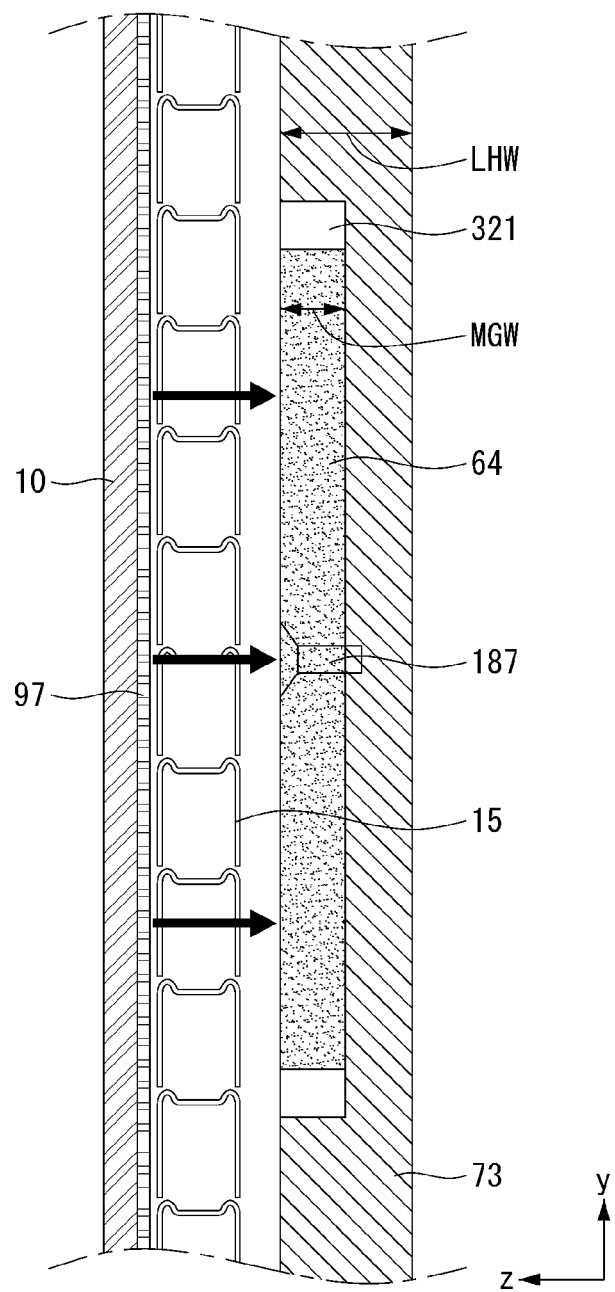

Referring to FIG. 7, the magnet 64 may be positioned at a depression 321 formed on the link 73. The depression 321 may be a shape depressed to an inner side of the link 73. The magnet 64 may be coupled to the link 73 through at least one screw 187.

A width LHW by which the depression 321 is depressed to the inner side of the link 73 may be equal to or larger than a thickness MGW of the magnet 64. When the thickness MGW of the magnet 64 is larger than the width LHW of the depression 321, the display panel 10 and the module cover 15 may not be in close contact with the link 73. In this case, the display panel 10 may not be crumpled or flat.

A panel protection unit 97 may be positioned on the rear surface of the display panel 10. The panel protection unit 97 may prevent a damage of the display panel 10 suffered due to a friction with the module cover 15. The panel protection unit 97 may include the metallic material. The panel protection unit 97 may have a very small thickness. For example, the panel protection unit 97 may have a thickness of approximately 0.1 mm.

Since the panel protection unit 97 includes the metallic material, the panel protection unit 97 may have a mutual attraction with the magnet 64. As a result, even though the module cover 15 positioned between the panel protection unit 97 and the link 73 does not include the metallic material, the module cover 15 may be in close contact with the magnet 64.

Figure 8:
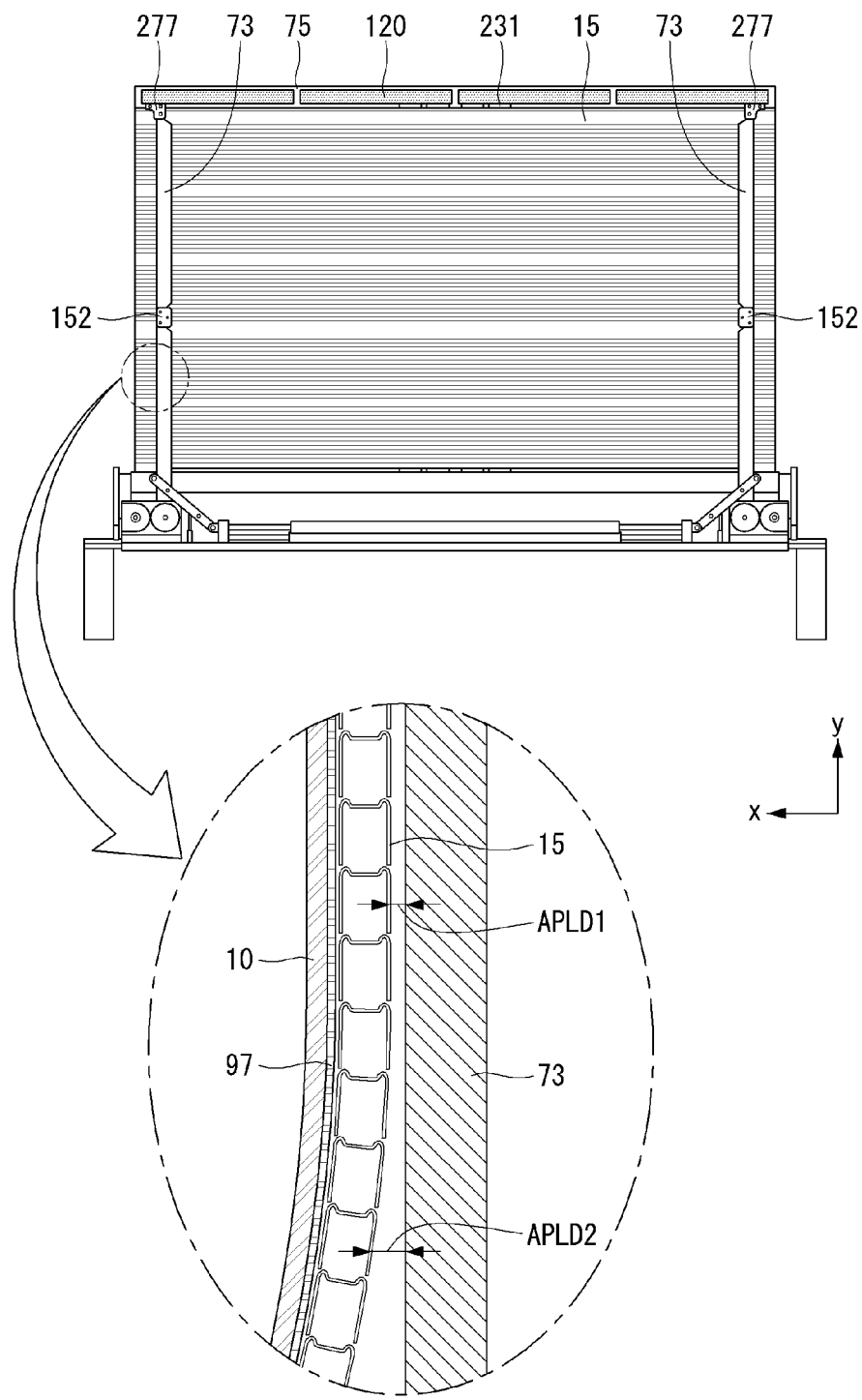
Figure 15:
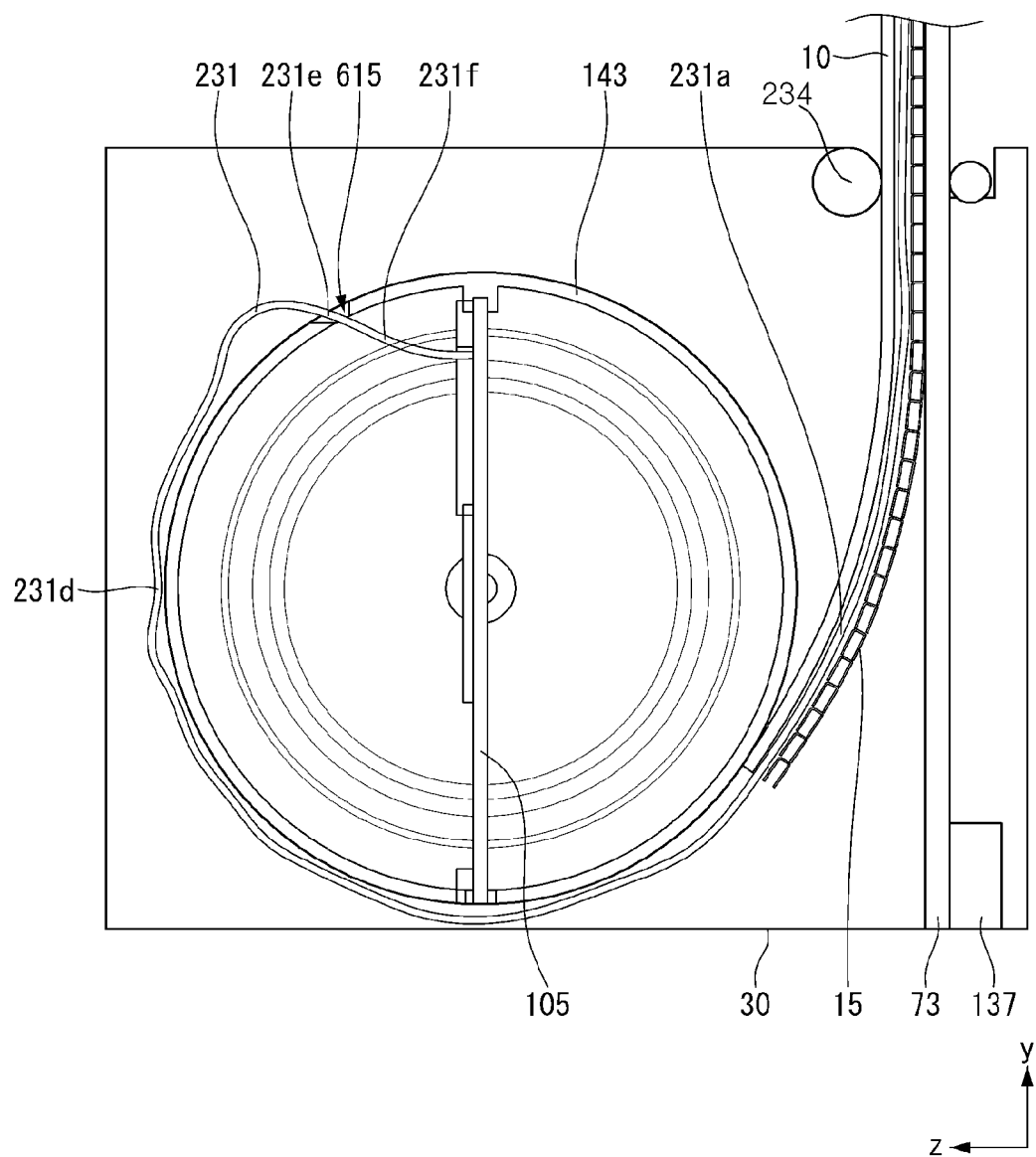

Referring to FIG. 8, the module cover 15 may be in close contact with the link 73 by an upper bar 75 at an upper side and a lower guide bar 234 (see FIG. 15). A portion of the link 73 between the upper bar 75 and the guide bar 234 may not be in close contact with the module cover 15. Alternatively, a center of the link 73 may not be in close contact with the module cover 15. The center of the link 73 may be a vicinity of an arm joint 152. In this case, distances APRD1 and APLD2 between the module cover 15 and the link 73 may not be constant. In this case, the display panel 10 may be bent or crooked.

Figure 9:
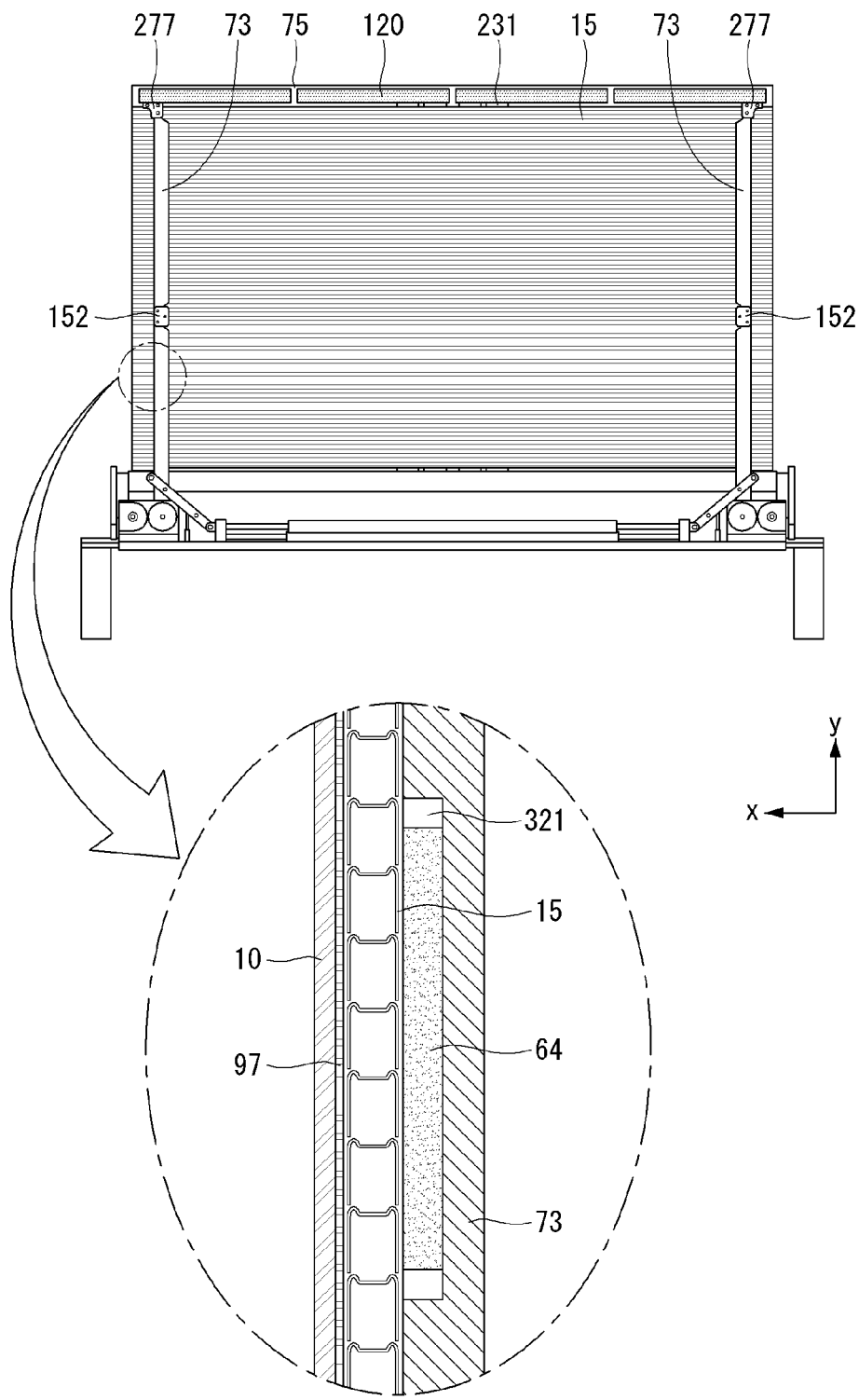

Referring to FIG. 9, when the magnet 64 is positioned on the depression 321 of the link 73, the magnet 64 attracts the panel protection unit 97, and as a result, the module cover 15 may also be simultaneously in close contact with the magnet 64. That is, the center of the link 73 may not be in close contact with the module cover 15.

Referring to FIG. 10, a bead 136 may be formed on an upper surface of the segment 15b. The bead 136 may be a shape depressed to the inner side of the segment 15b. The bead 136 may be a shape depressed in the −y-axis direction.

For example, the bead 136 may be formed by pressing the segment 15b. For example, a plurality of beads 136 may be formed on the segment 15b. The plurality of beads 136 may be spaced apart from each other. The bead 136 may enhance a rigidity of the segment 15b. The bead 136 may prevent the shape of the segment 15b from being deformed due to an external shock.

Figure 11:
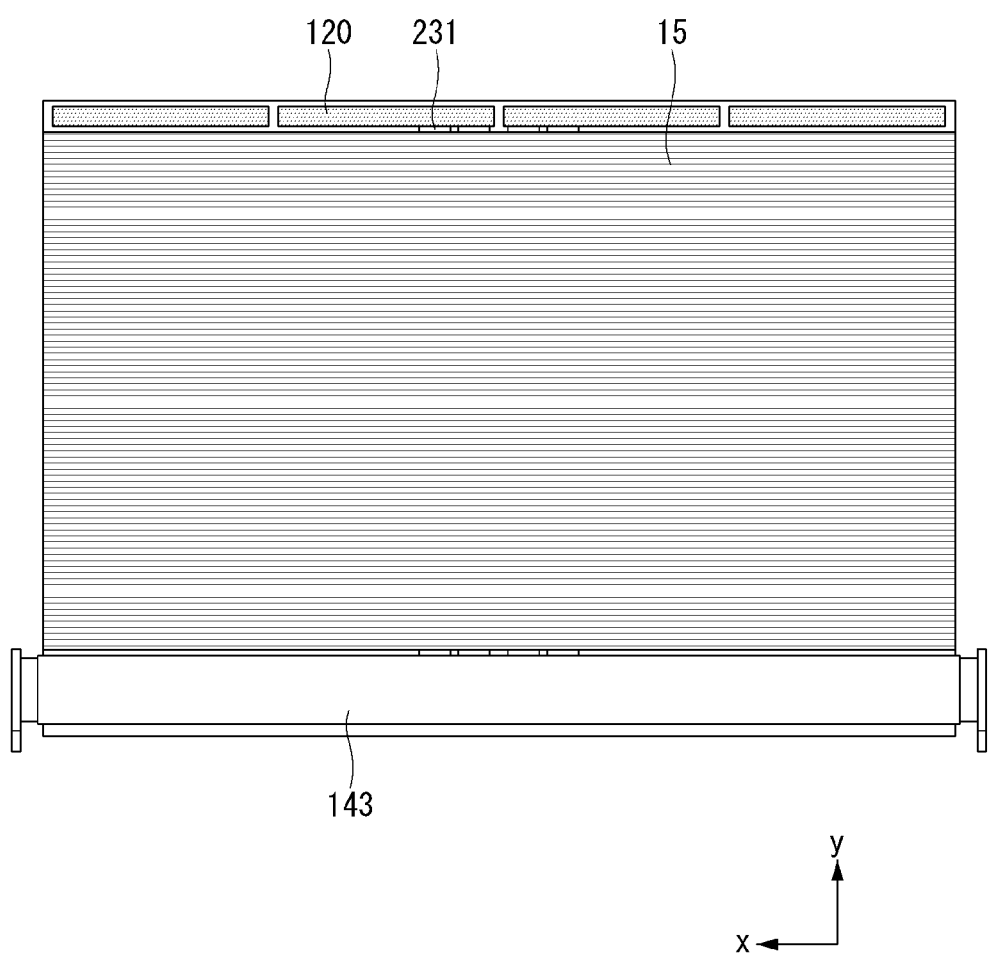

Referring to FIG. 11, a source PCB 120 may be positioned at the top of the module cover 15. When the source PCB 120 is rolled up or rolled down, a location of the source PCB 120 may be changed together with movement of the module cover 15. An FFC cable 231 may be positioned at the center of the module cover 15 based on a first direction. The FFC cable 231 may also be positioned at both ends of the module cover 15 based on the first direction.

Referring to FIG. 12, the segment 15d may include a depression 425 depressed in the −z-axis direction. The depression 425 may form a space between the display panel 10 and the module 15. The FFC cable 231 may be accommodated in the space in which the depression 425 is formed. Further, the depression 425 may enhance the rigidity of the segment 15d.

The bead 136 may be positioned on the segment 15d except for a portion where the depression 425 is positioned. Since a third-direction thickness of the segment 15d decreases, the bead 136 may not be positioned at the portion where the depression 425 is positioned.

Referring to FIG. 13, a penetration portion 437 may be positioned in a segment 15e based on the first direction. The penetration portion 437 may penetrate the center of the segment 15e in the second direction. That is, the penetration portion may be a hole positioned within the segment 15e. The penetration portion 437 may be a portion where the FFC cable 231 is positioned. Since the penetration portion 437 is formed within the segment 15e, the thickness of the segment 15e may be further reduced than a case where the FFC cable 231 is positioned in the depression 425.

The bead 136 may be positioned on the segment 15e except for the portion where the penetration portion 437 is positioned. Since the third-direction thickness of the segment 15e decreases, the bead 136 may not be positioned at the portion where the penetration portion 437 is positioned.

Figure 14:
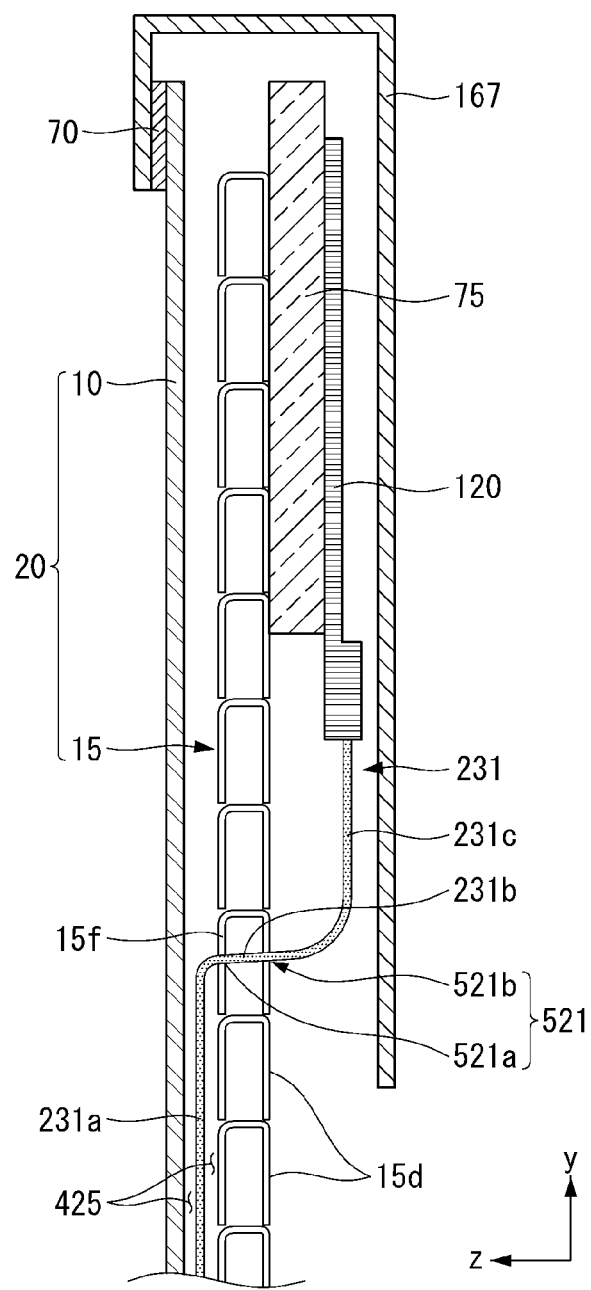

Referring to FIG. 14, a top case 167 may cover the source PCB 120 and the upper bar 75 in addition to the display panel 10 and the module cover 15. One surface of the upper bar 75 may be coupled to the rear surface of the module cover 15 and the other surface may be coupled to the source PCB 120. The upper bar 75 is fixed to the module cover 15 to support the source PCB 120.

A lower end of the FFC cable 231 may be connected to a timing controller board 105 (see FIG. 15) inside a panel roller 143 (see FIG. 15). The FFC cable 231 may be rolled on or unrolled from the roller 143 jointly with the display unit 20.

A part of the FFC cable 231 may be positioned between the display panel 10 and the module cover 15. A portion of the FFC cable 231, which is positioned between the display panel 10 and the module cover 15 may be referred to as a first portion 231a. The first portion 231a may be positioned in the depression 425 formed by the plurality of segments 15d. Alternatively, the first portion 231a may be accommodated in the depression 425 formed by the plurality of segments 15d.

A part of the FFC cable 231 may penetrate a segment 15f. The portion of the FFC cable 231, which penetrates the segment 15f may be referred to as the second portion 231b. The segment 15f may include a first hole 521a formed on the front surface and a second hole 521b formed on the rear surface. The first hole 521a and the second hole 521b are connected to each other to form one hole 521. The hole 521 may penetrate the segment 15f in the third direction. The second portion 231b may penetrate the hole 521. The hole 521 may also be referred to as a connection hole 521.

An upper end of the FFC cable 231 may be electrically connected to the source PCB 120. A part of the FFC cable 231 may be positioned on the rear surface of the module cover 15. The portion of the FFC cable 231, which is positioned on the rear surface of the module cover 15 may be referred to as a third portion 231c. The third portion 231c may be electrically connected to the source PCB 120.

The third portion 231c may be covered by the top case 167. As a result, the third portion 231c may not be exposed to the outside.

Referring to FIG. 15, the FFC cable 231 may be connected to the timing controller board 105 mounted on the panel roller 143. A penetration hole 615 may be formed on the panel roller 143 and the FFC cable 231 may be connected to the timing controller board 105 through the penetration hole 615.

The penetration hole 615 may be positioned at one side of the panel roller 143, and may penetrate an outer peripheral portion of the panel roller 143. The FFC cable 231 may be connected to one side of the timing controller board 105 through the penetration hole 615.

Even though the FFC cable 231 is positioned on an outer periphery of the panel roller 143, the FFC cable 231 may maintain a connection with the timing controller board 105 due to the penetration hole 615. As a result, the FFC cable 231 may rotate together with the panel roller 143 and may not be twisted.

A part of the FFC cable 231 may be rolled on the panel roller 143. The portion of the FFC cable 231, which is rolled on the panel roller 143 may be referred to as a fourth portion 231d. The fourth portion 231d may be in contact with an outer peripheral surface of the panel roller 143.

A part of the FFC cable 231 may penetrate the penetration hole 615. The portion of the FFC cable 231, which passes through the penetration hole 615 may be referred to as a fifth portion 231e.

A lower end of the FFC cable 231 may be electrically connected to the timing controller board 105. A part of the FFC cable 231 may be positioned inside the panel roller 143. The portion of the FFC cable 231, which is positioned inside the panel roller 143 may be referred to as a sixth portion 231f The sixth portion 231f may be electrically connected to the timing controller board 105.

Figure 16:
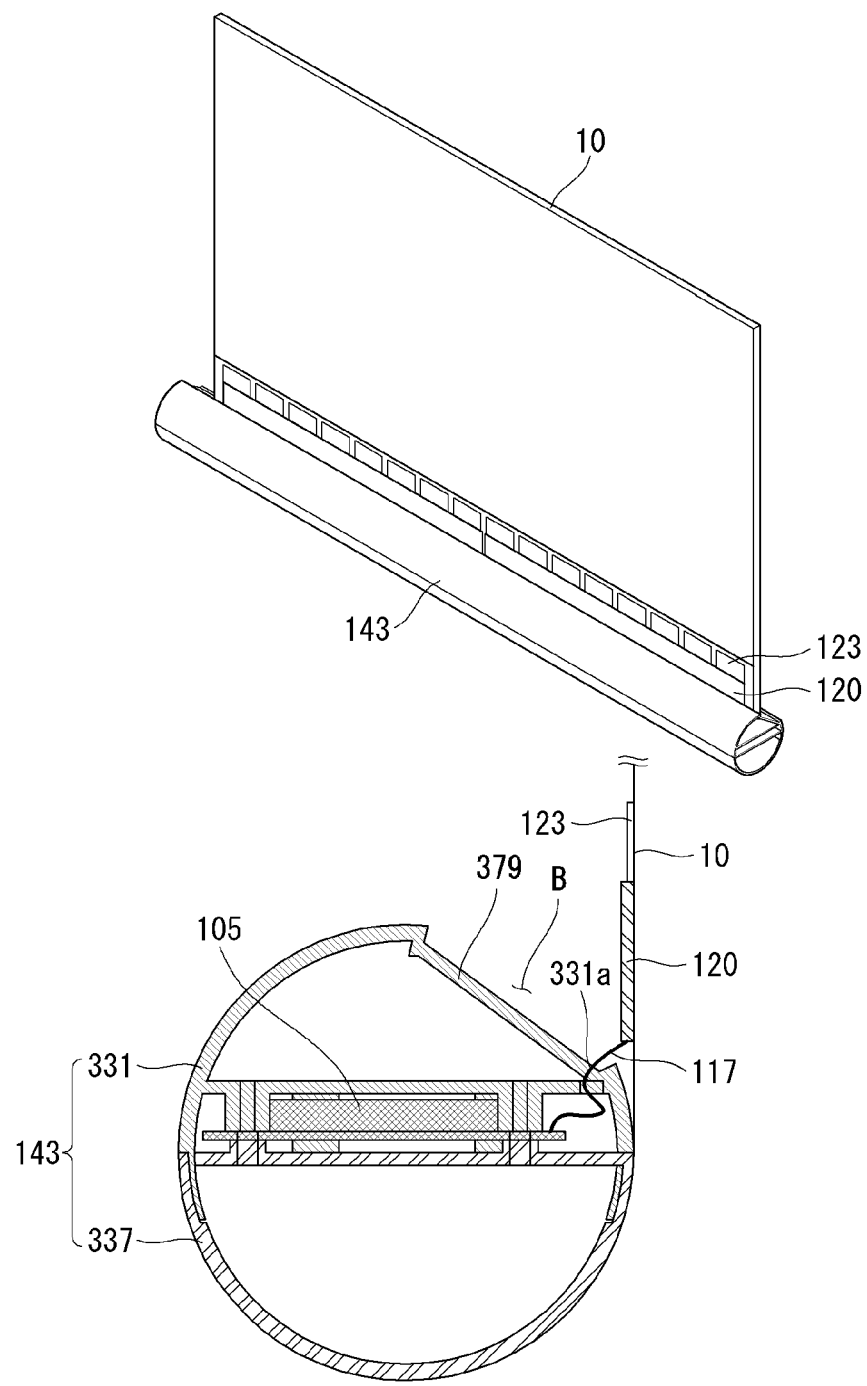

Referring to FIG. 16, the lower end of the display panel 10 may be connected to the roller 143. The display panel 10 may be rolled on or unrolled from the roller 143. The front surface of the display panel 10 may be coupled to the plurality of source PCBs 120. The plurality of source PCBs 120 may be spaced apart from each other.

A source chip on film (COF) 123 may connect the display panel 10 and the source PCB 120. The source COF 123 may be positioned on the front surface of the display panel 10. The roller 143 may include a first part 331 and a second part 337. The first part 331 and the second part 337 may be fastened by a screw. The timing controller board 105 may be mounted inside the roller 143.

The source PCB 120 may be electrically connected to the timing controller board 105. The timing controller board 105 may transfer digital video data and a timing control signal to the source PCB 120.

A cable 117 may electrically connect the source PCB 120 and the timing controller board 105. For example, the cable 117 a flexible flat cable (FFC). The cable 117 may pass through a hole 331a. The hole 331a may be formed at a seating portion 379 or the first part 331. The cable 117 may be positioned between the display panel 10 and the second part 337.

The seating portion 379 may be formed on the outer periphery of the first part 331. The seating portion 379 may be formed as a part of the outer periphery of the first part 331 is stepped. The seating portion 379 may form a space B. When the display unit 20 is rolled on the roller 143, the source PCB 120 may be accommodated in the seating portion 379. The source PCB 120 is accommodated in the seating portion 379, and as a result, the source PCB 12 may not be bent or crumpled, and the durability of the source PCB 120 may be enhanced.

The cable 117 may electrically connect the timing controller board 105 and the source PCB 120.

Figure 17:
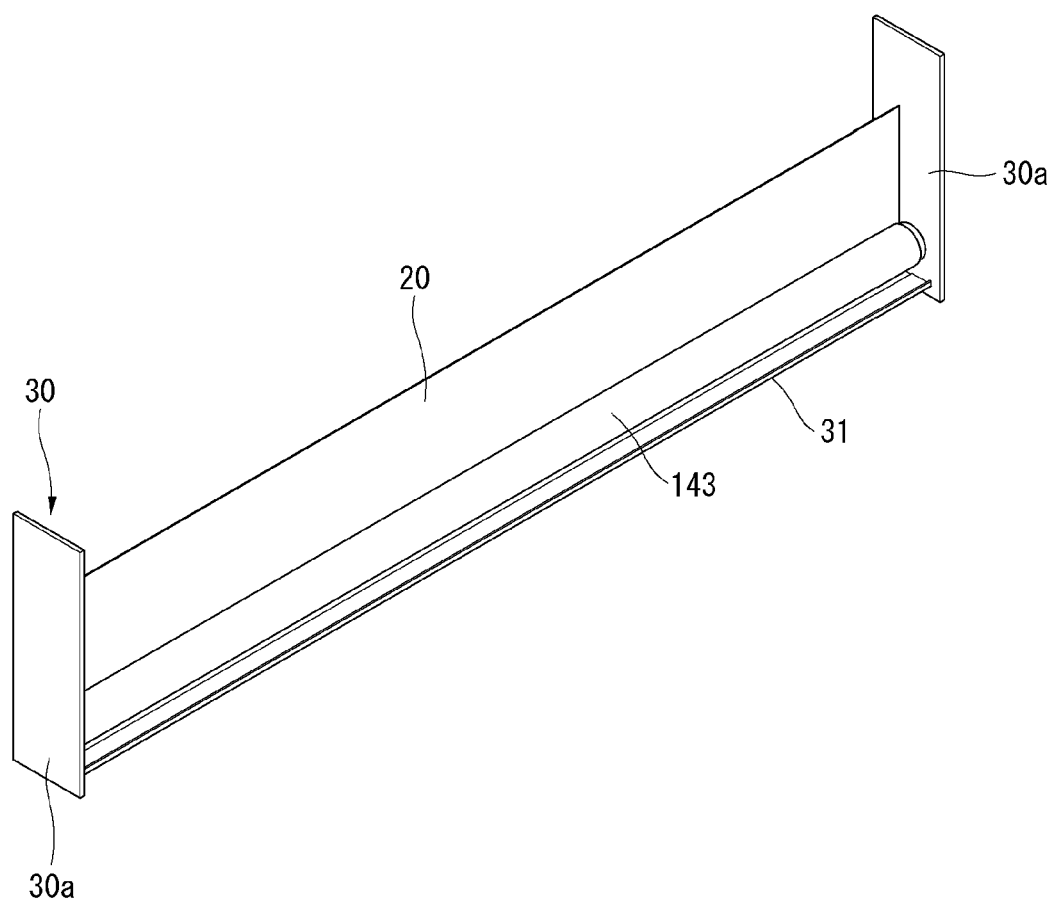

Referring to FIG. 17, the roller 143 on which the display unit 20 is rolled may be installed in a first base 31. The first base 31 may be a lower end of the housing 30. The roller 143 may elongate in the longitudinal direction of the housing 30. The first base 31 may be connected to a side surface 30a of the housing 30.

Figure 18:
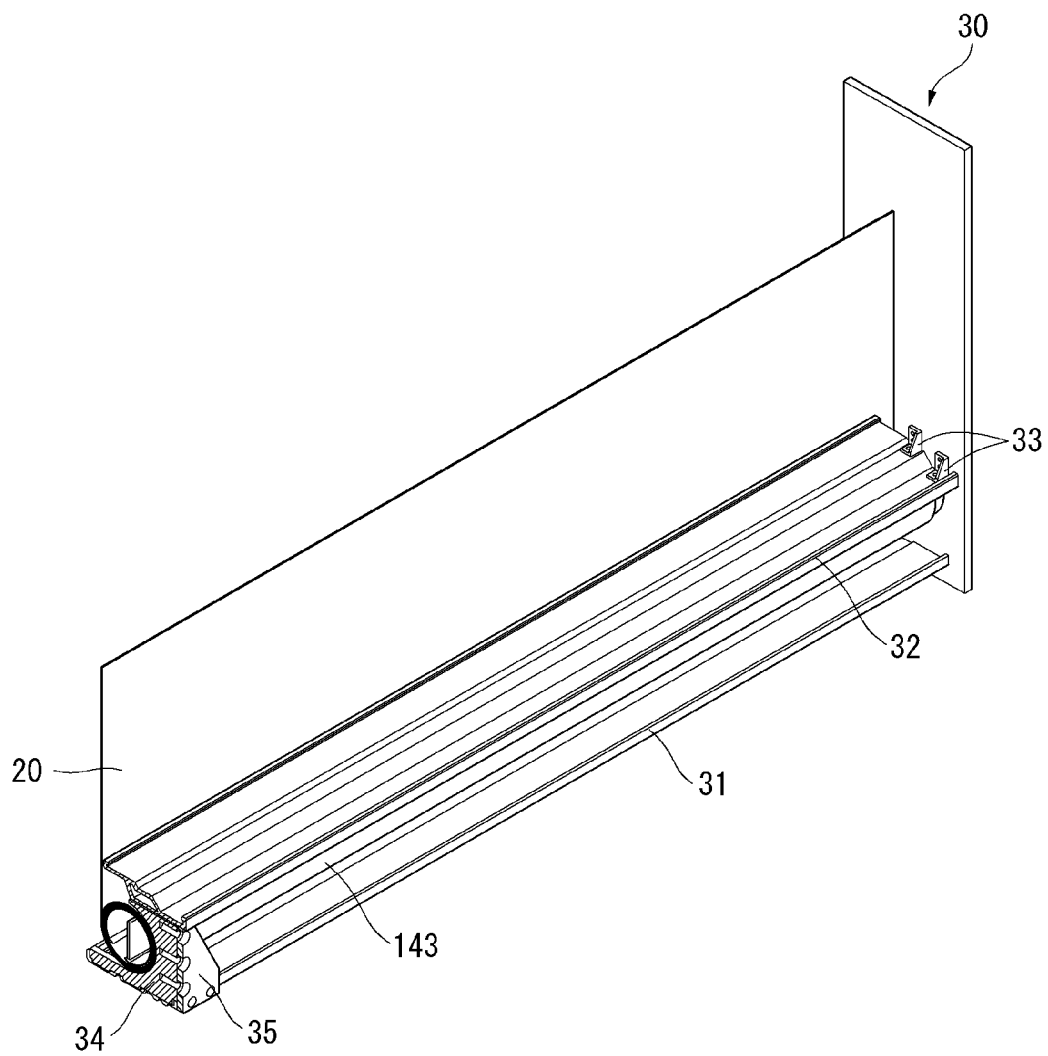
Figure 19:
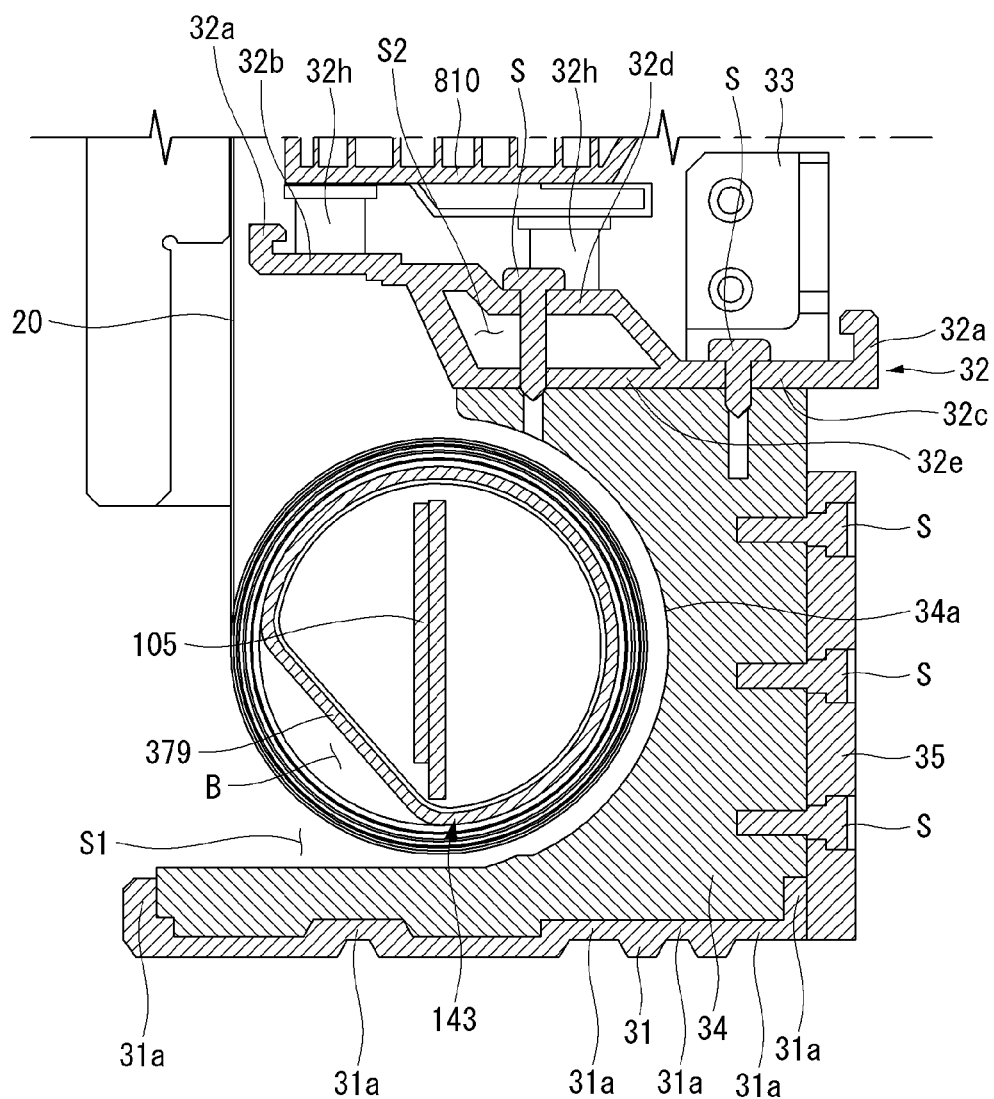

Referring to FIGS. 18 and 19, a beam 31a may be formed in the first base 31. The beam 31a may enhance a crumpling or twisting rigidity. A lot of parts may be installed in the first base 31 and the first base 31 may receive a large load. The rigidity of the first base 31 is enhanced to prevent sagging by the load. For example, the beam 31a may be formed by a press process.

A second base 32 may be spaced apart to a top of the first base 31. A space S1 may be formed in the first base 31 and the second base 32. The roller 143 on which the display unit 20 is rolled may be accommodated in the space S1. The roller 143 may be positioned between the first base 31 and the second base 32.

The second base 32 may be connected to the side surface 30a of the housing 30. A bracket 33 may be fastened to an upper surface of the first base 31. The bracket 33 may be fastened to the side surface 30a of the housing 30.

A beam 32a may be formed in the second base 32. The beam 32a may enhance the crumpling or twisting rigidity of the second base 32. For example, the beam 32a may be formed by the press process.

A third part 32d may be connected to the first part 32b and the second part 32c. A fourth part 323 may be connected to the first part 32b and the second part 32c. A space S2 may be formed between the third part 32d and the fourth part 32e. As a result, the crumpling or twisting rigidity of the second base 32 may be enhanced. The third part 32d may be referred to as a reinforcement rib 32d or a rib 32d. The fourth part 32e may be referred to as a reinforcement rib 32e or a rib 32e.

A lot of parts may be installed in the second base 32 and the second base 32 may receive the large load. The rigidity of the second base 32 is enhanced to prevent sagging by the load.

A first reinforcement plate 34 may be positioned between the first base 31 and the second base 32. The first reinforcement plate 34 and the second base 32 may be fastened by the screw. The first reinforcement plate 34 may support the second base 32. The first reinforcement plate 34 may prevent sagging of the second base 32. The first reinforcement plate 34 may be positioned at the center of the first base 31 or the center of the second base 32. The first reinforcement plate 34 may include a curved portion 34a. The curved portion 34a may be formed along the roller 143. The curved portion 34*a* may not contact the roller 143 or the display unit 20 on which the roller 143 is rolled. The curved portion 34*a* may maintain a predetermined interval from the roller 143 so as to prevent rotation of the roller 143 from being interrupted.

A second reinforcement plate 35 may be fastened to the first base 31 and the first reinforcement plate 34. The second reinforcement plate 35 may support the first reinforcement plate 34. The second reinforcement plate 35 may be positioned in the rear of the first reinforcement plate 34. The second reinforcement plate 35 may be positioned in the rear of the first base 31. The second reinforcement plate 35 may be positioned vertically to the first base 31. The second reinforcement plate 35 may be fastened to the beam 31*a* of the first base 31. The second base 32 may face a front surface or a rear surface of the housing 30.

Figure 20:
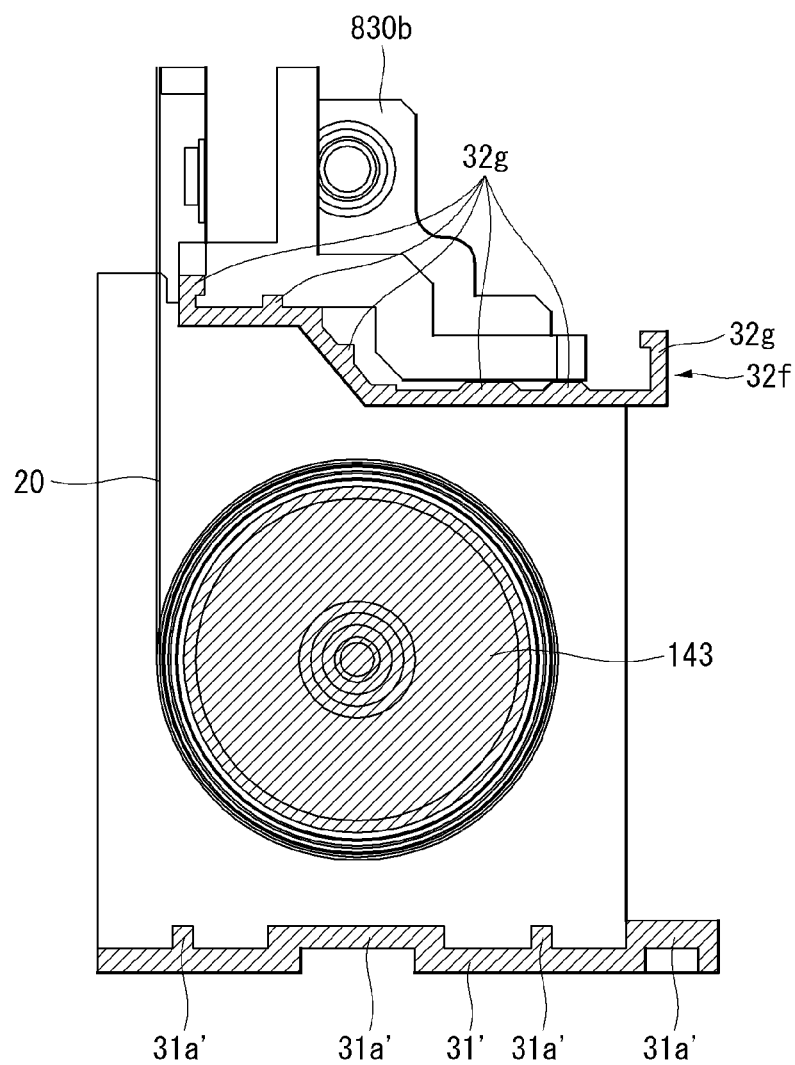

Referring to FIG. 20, a second base 32*f* may not form the space. When the load received by the second base 32*f* is not large, the second base 32*f* includes a beam 32*g* to maintain a sufficient rigidity. A first base 31' may include a beam 31*a'*.

Figure 21:
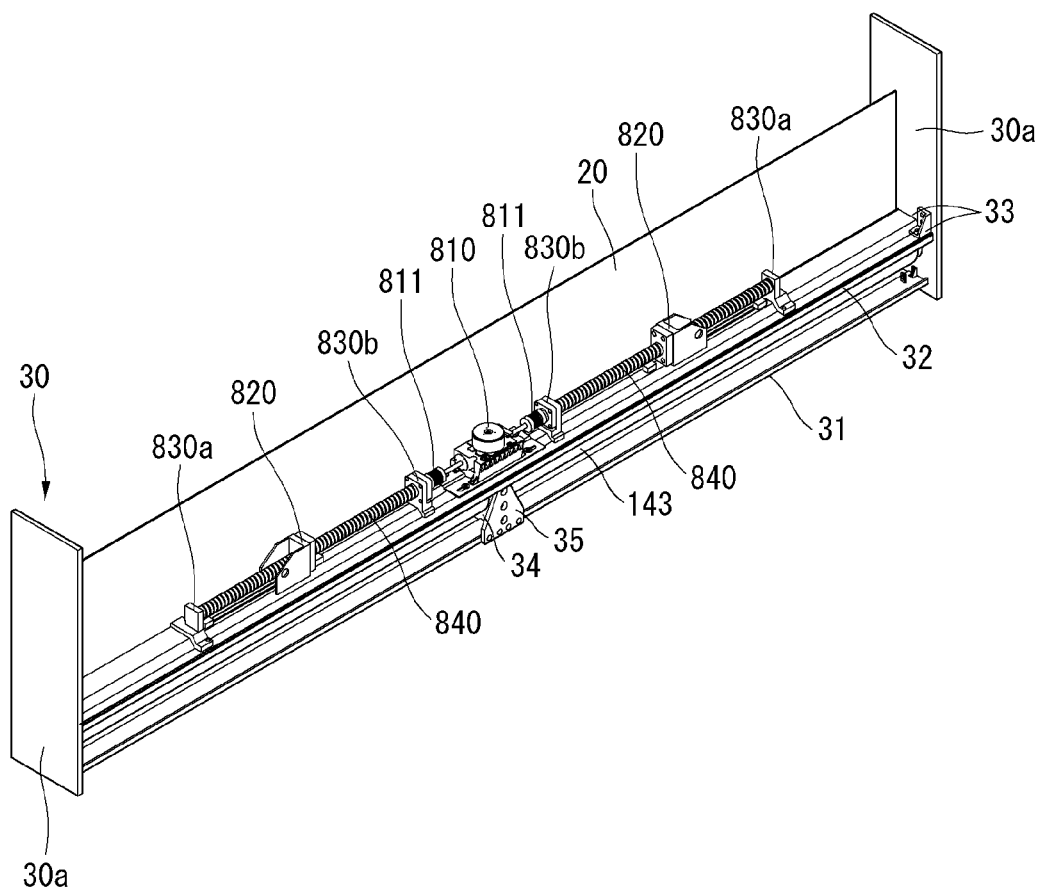
Figure 22:
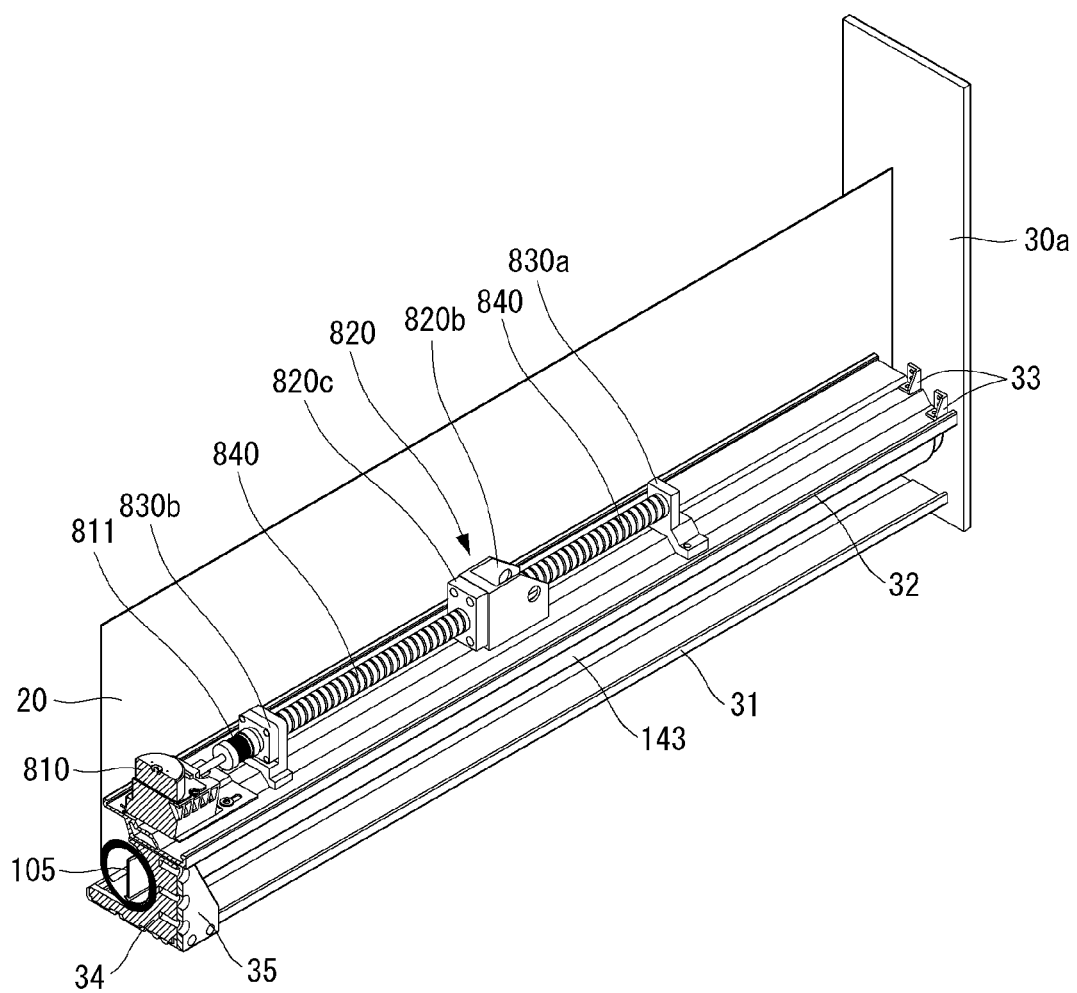

Referring to FIGS. 21 and 22, a motor assembly 810 may be installed in the second base 32. A driving shaft of the motor assembly 810 may be formed at both sides. A right driving shaft and a left driving shaft of the motor assembly 810 may rotate in the same direction as each other. Alternatively, the right driving shaft and the left driving shaft of the motor assembly 810 may rotate in opposite directions to each other.

The motor assembly 810 may include a plurality of motors. The plurality of motors may be connected to each other in series. In the motor assembly 810, the plurality of motors are connected in series to output a high torque.

A lead screw 840 may be positioned at each of a left side and a right side of the motor assembly 810. The motor assembly 810 may be connected to the lead screw 840. A coupling 811 may connect the lead screw 840 and the driving shaft of the motor assembly 810.

In the lead screw 840, a thread may be formed in the longitudinal direction. A direction of the thread formed in the right lead screw 840 and a direction of the thread formed in the left lead screw 840 may be opposite to each other. The direction of the thread formed in the right lead screw 840 and the direction of the thread formed in the left lead screw 840 may be the same as each other. Pitches of the left lead screw 840 and the right lead screw 840 may be equal to each other.

Bearings 830*a* and 830*b* may be installed in the second base 32. The bearings 830*a* and 830*b* may support both sides of the lead screw 840. The bearings 830*a* and 830*b* may include an inner bearing 830*b* positioned close to the motor assembly 810 and an outer bearing 830*a* positioned distant from the motor assembly 810. The lead screw 840 may rotate stably by the bearings 830*a* and 830*b*.

A slide 820 may be engaged with the lead screw 840. The slide 820 may advance and retreat in the longitudinal direction of the lead screw 840 according to the rotation of the lead screw 840. The slide 820 may move between the outer bearing 830*a* and the inner bearing 830*b*. The slide 820 may be positioned in each of the left lead screw 840 and the right lead screw 840. A left slide 820 may be engaged with the left lead screw 840. A right slide 820 may be engaged with the right lead screw 840.

The left slide 820 and the right slide 820 may be positioned symmetric to each other with respect to the motor assembly 810. Due to driving of the motor assembly 810, the left slide 820 and the right slide 820 may be distant from or close to each other by the same distance.

Figure 23:
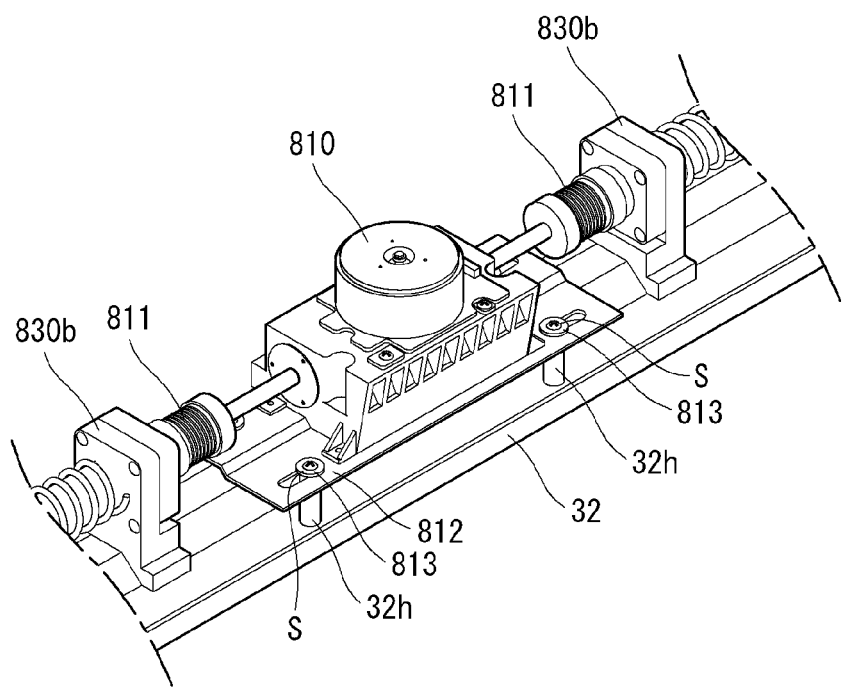

Referring to FIG. 23, the motor assembly 810 may include a plate 813. The plate 813 may be referred to as a mount plate 813 or a motor mount plate 813. A coupling portion 32*h* may be formed on the upper surface of the second base 32. The plate 813 may be fastened to the coupling portion 32*h* through a screw S. The motor assembly 810 may be spaced apart from the upper surface of the second base 32. A washer 813 may be positioned between the upper surface of the plate 813 and the screw S. The washer 813 may include a rubber material. The washer 813 may reduce vibration generated from the motor assembly 810. The washer 813 may enhance a driving stability of the display device 100.

Figure 24:
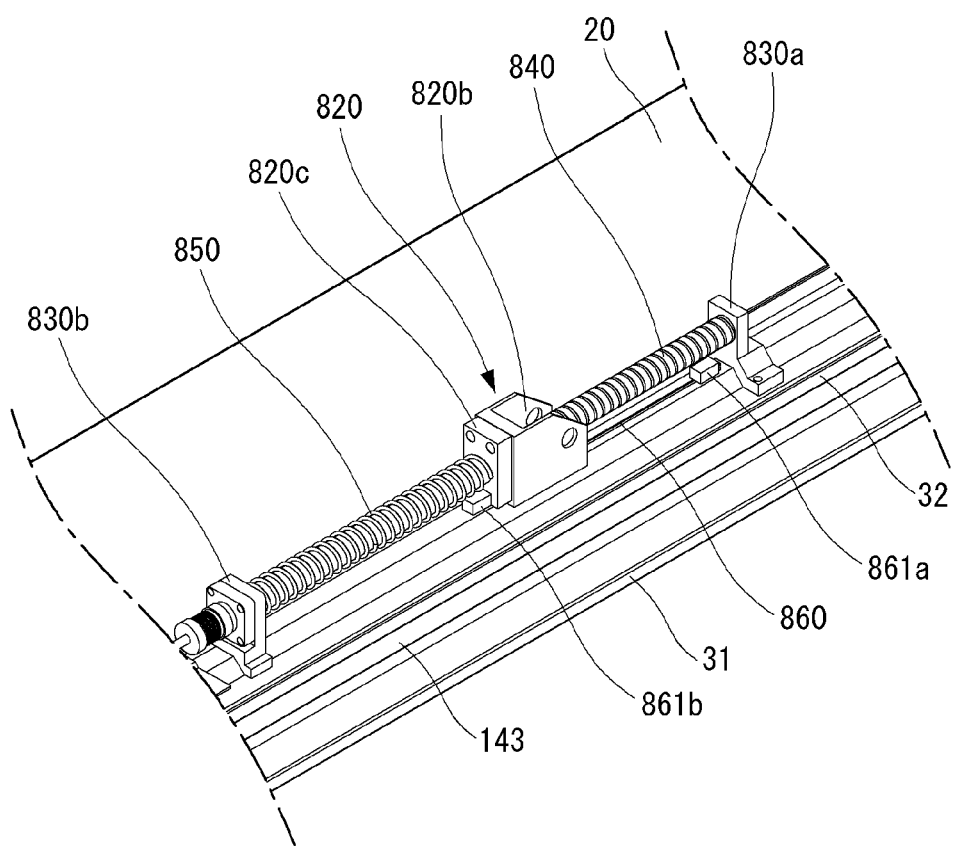

Referring to FIG. 24, a guide rail 860 may be installed in the second base 32. The guide rail 860 may be positioned in line with the lead screw 840. The slide 820 may be engaged with the guide rail 860. A first stopper 861*b* may be positioned at one side of the guide rail 860 and a second stopper 861*a* may be positioned at the other side of the guide rail 860. A range in which the slide 820 may move may be limited between the first stopper 861*b* and the second stopper 861*a*.

A spring 850 may cover the lead screw 840. The lead screw 840 may penetrate the spring 850. The spring 850 may be positioned between the inner bearing 830*b* and the slide 820. One side of the spring 850 may contact the inner bearing 830*b* and the other side of the spring 850 may contact the slide 820. The spring 850 may provide an elastic force to the slide 820.

When the slide 820 is suspended on the first stopper 861*b*, the spring 850 may be maximally compressed. When the slide 820 is suspended on the first stopper 861*b*, a length of the spring 850 may be the minimum. When the slide 820 is suspended on the first stopper 861*b*, a distance between the slide 820 and the inner bearing 830*b* may be the minimum.

Figure 25:
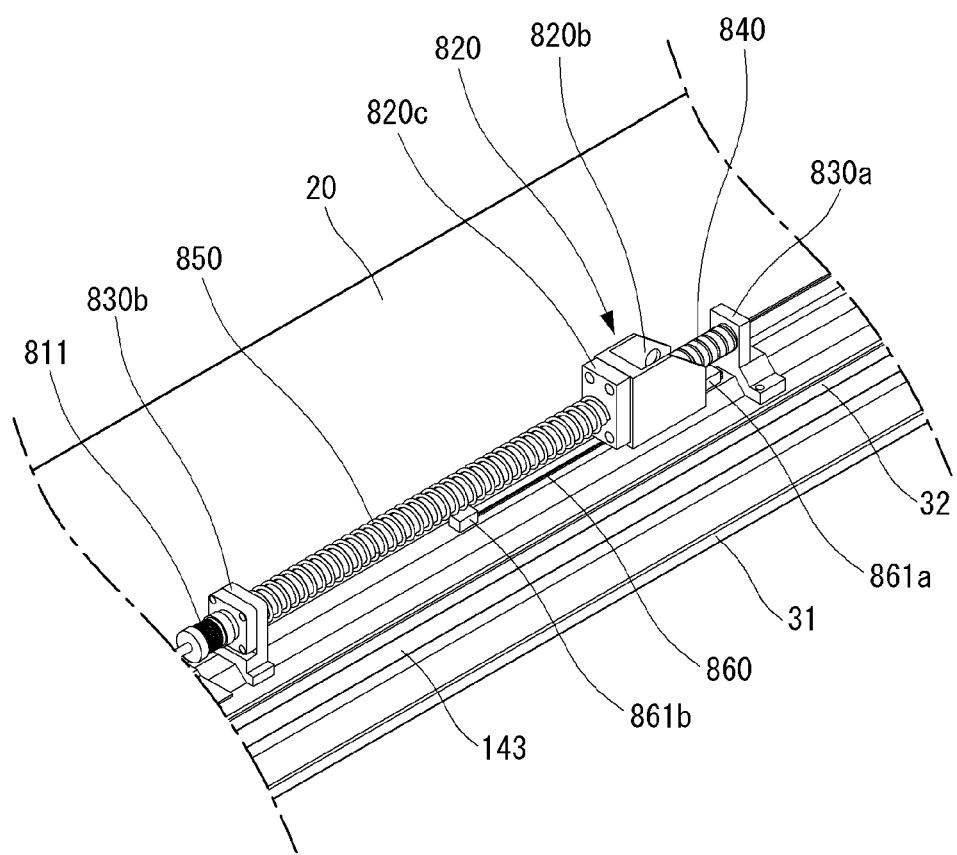

Referring to FIG. 25, when the slide 820 is suspended on the second stopper 861*a*, the spring 850 may be maximally tensioned. When the slide 820 is suspended on the second stopper 861*b*, the length of the spring 850 may be the maximum. When the slide 820 is suspended on the second stopper 861*a*, the distance between the slide 820 and the inner bearing 830*b* may be the maximum.

Figure 26:
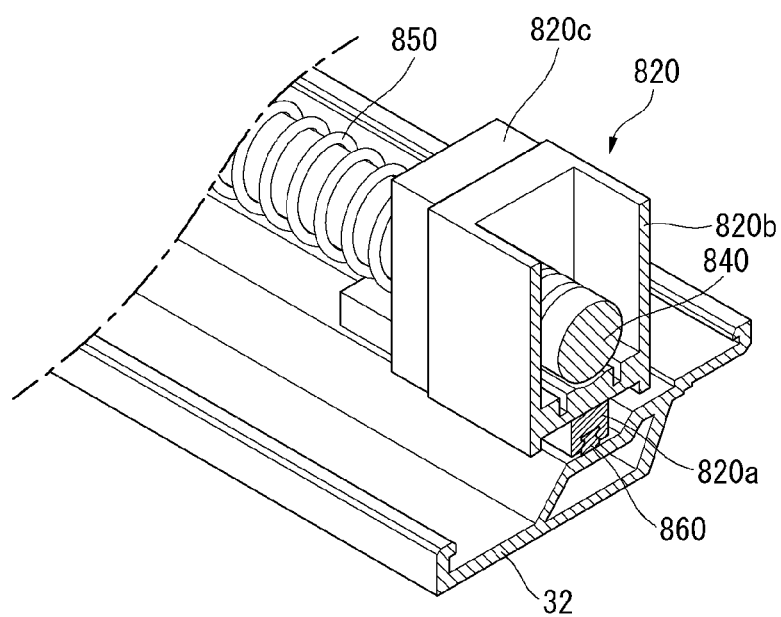

Referring to FIG. 26, the first part 820*a* may be engaged with the guide rail 860. The first part 820*a* may move along the guide rail 860. The movement of the first part 820*a* may be restrained in the longitudinal direction of the guide rail 860. The second part 820*b* may be positioned at the top of the first part 820*a*. The first part 820*a* and the second part 820*b* may be fastened through the screw. The second part 820*b* may be spaced apart from the guide rail 860. The lead screw 840 may penetrate the second part 820*b*. For example, the second part 820*b* may include a male thread which is engaged with a female thread of the lead screw 840. As a result, even though the lead screw 840 rotates, the slide 820 does not rotate, but may stably advance and retreat along the guide rail 860.

The third part 820*c* may be coupled to one side of the second part 820*b*. The third part 820*c* may contact the spring 850. The third part 820*c* may receive the elastic force from the spring 850.

Figure 27:
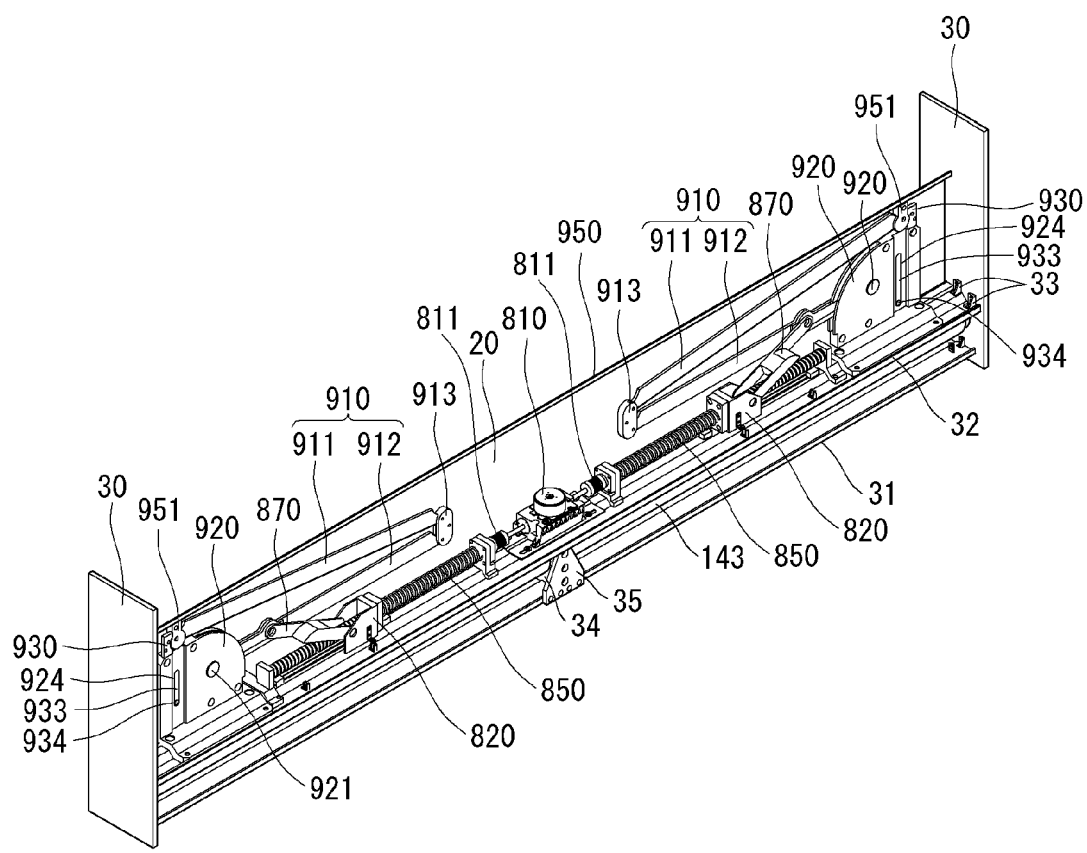
Figure 28:
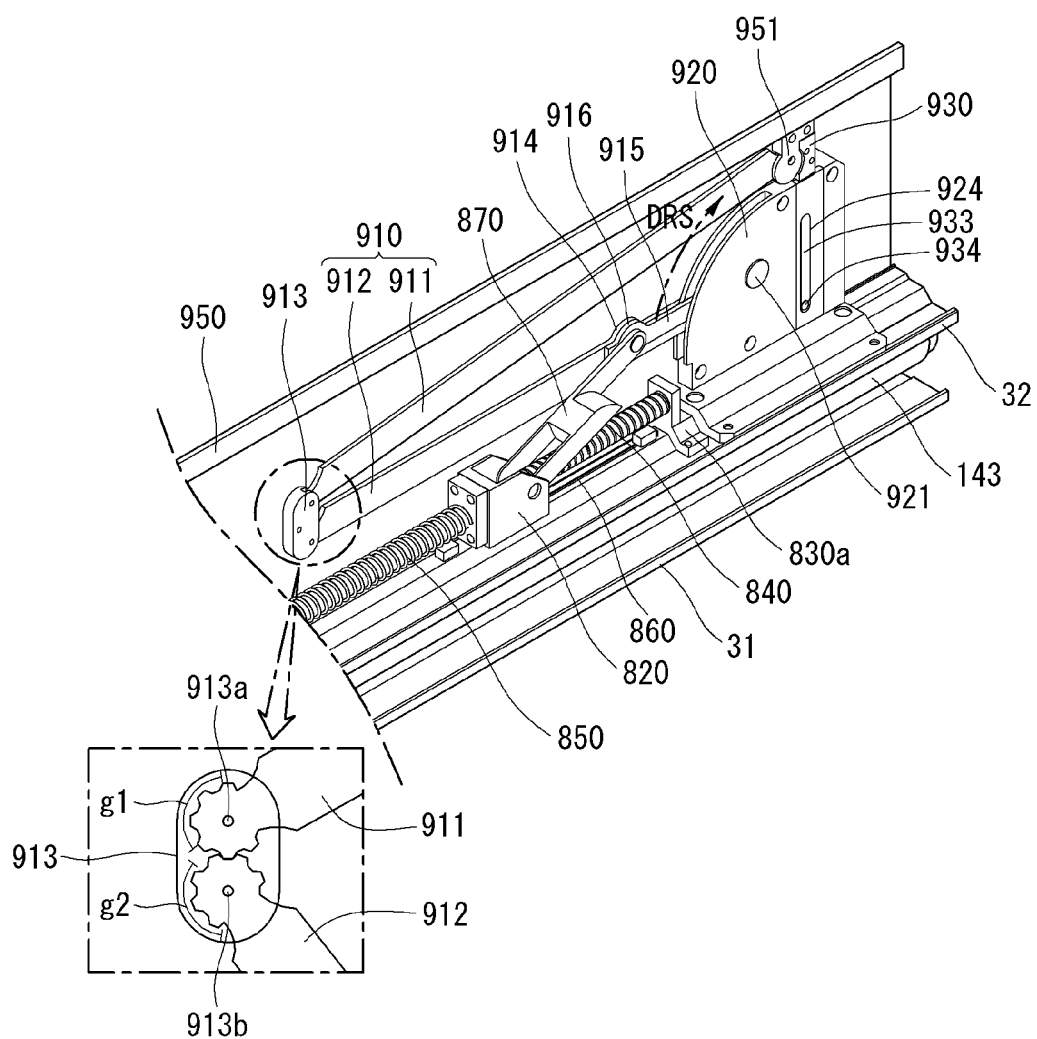

Referring to FIGS. 27 and 28, a link mount 920 may be installed in the second base 32. One side of a second arm 912 may be pivotably connected to the link mount 920. The other side of the second arm 912 may be pivotably connected to a joint 913. The other side of the second arm 912 may be pivotably connected to a second shaft 913*b*. One side of a rod 870 may be pivotably connected to the slide 820. The other side of the rod 870 may be pivotably connected to the second arm 912 or a third arm 915. One side of the third arm 915 may be pivotably connected to the link mount 920. The other side of the third arm 915 may be pivotably connected to the other side of the rod 870. The link mount 920 may include a shaft 921. The arm 912 or the third arm 911 may be pivotably connected to the shaft 921.

A link bracket 951 may be referred to as a link cap 951. The link bracket 951 may be coupled to the top case 950. The top case 950 may be referred to as a case top 950, an upper bar 950, a top 950, or a bar 950. The top case 950 may be positioned on an upper end of the display unit 20. The display unit 20 may be fixed to the top case 950.

One side of the first arm 911 may be pivotably connected to the joint 913. One side of the first arm 911 may be pivotably connected to the first shaft 913a. The other side of the first arm 911 may be pivotably connected to the link bracket 951 or the top case 950.

A gear g1 may be formed at one side of the first arm 911. A gear g2 may be formed at the other side of the second arm 912. The gear g1 of the first arm 911 and the gear g2 of the second arm 912 may be engaged with each other.

When the slide 820 moves to be close to the outer bearing 830a, the second arm 912 or the third arm 915 may be erected. In this case, a direction in which the second arm 912 or the third arm 915 is erected may be an erection direction (DRS).

The second arm 912 may include a protrusion 914 which protrudes in the erection direction (DRS). The protrusion 914 may be referred to as a connection portion 914. The third arm 915 may include a protrusion 916 which protrudes in the erection direction (DRS). The protrusion 916 may be referred to as a connection portion 916. The protrusion 914 of the second arm 912 and the protrusion 916 of the third arm 915 may face or contact each other. The other side of the rod 870 may be fastened to the protrusion 914 of the second arm 912 or the protrusion 916 of the third arm 915.

The link 910 may include the first arm 911, the second arm 912, the third arm 915, and/or the joint 913.

Figure 29:
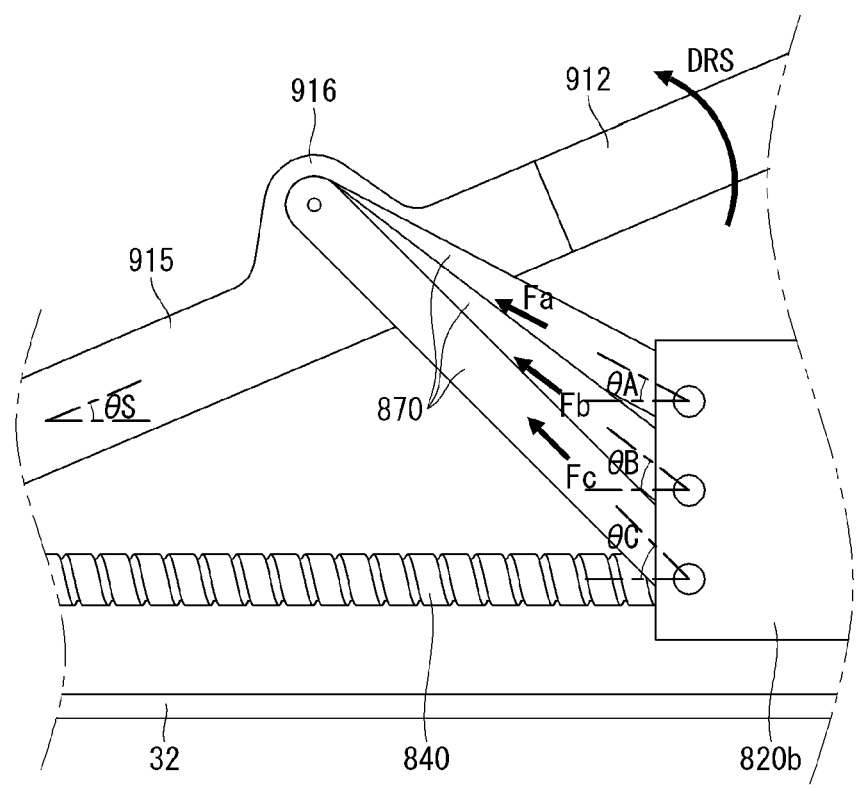
Figure 30:
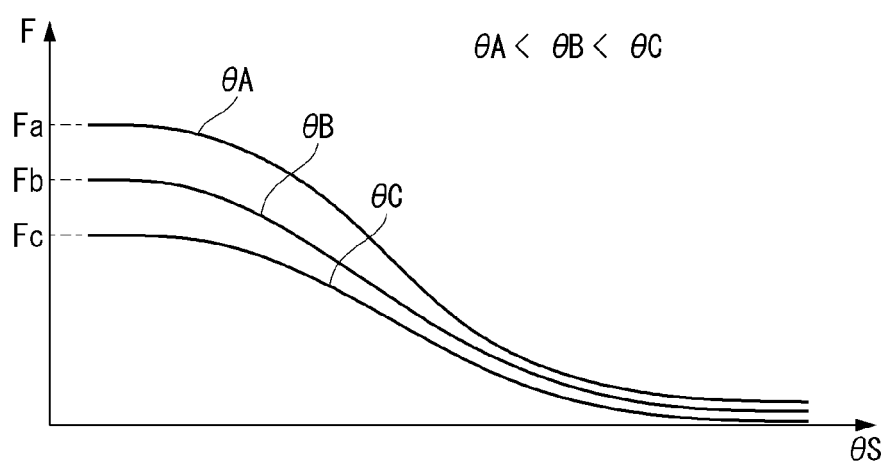

Referring to FIGS. 29 and 30, an angle formed by the second arm 912 or the third arm 915 and the second base 32 may be referred to as theta S. When the rod 870 is connected to the top of the second part 820b, an angle formed by the rod 870 and the second base 32 may be referred to as theta A and a minimum force for the rod 870 to erect the second arm 912 or the third arm 915 may be referred to as Fa. When the rod 870 is connected to a middle of the second part 820b, the angle formed by the rod 870 and the second base 32 may be referred to as theta B and a minimum force for the rod 870 to erect the second arm 912 or the third arm 915 may be referred to as Fb. When the rod 870 is connected to the bottom of the second part 820b, the angle formed by the road 870 and the second base 32 may be referred to as theta C and the minimum force for the rod 870 to erect the second arm 912 or the third arm 915 may be referred to as Fc.

A relationship of theta A<theta B<theta C may be established for the same theta S. Further, the relationship of Fc<Fb<Fa may be established for the same theta S. If an angle formed by the second arm 912 or the third arm 915 and the second base 32 is equal, as the angle formed by the rod 870 and the second base 32 increases, a force required for erecting the second arm 912 or the third arm 915 may decrease. The rod 870 is connected to the bottom of the second part 820b to reduce the load applied to the motor assembly 810.

Figure 31:
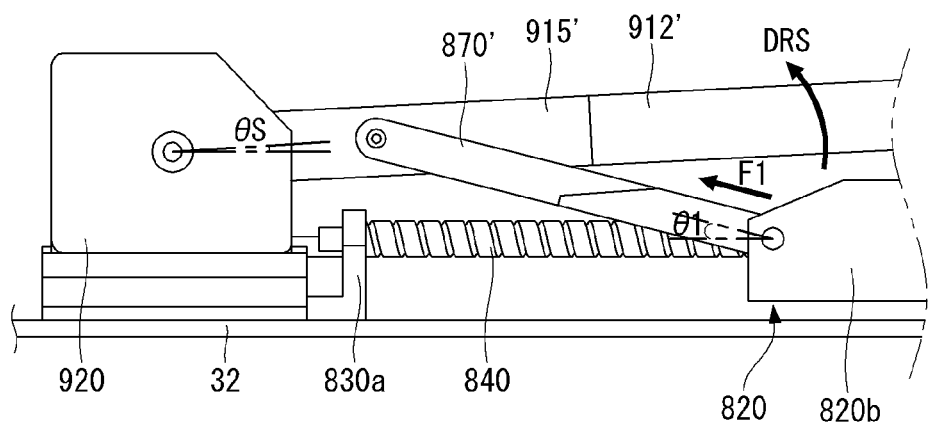

Referring to FIG. 31, a rod 870' may not be connected to the protrusion of a second arm 912' or the protrusion of a third arm 915'. When an angle formed by the second arm 912' or the third arm 915' and the second base 32 is theta S, an angle formed by the rod 870' and the second base 32 may be referred to as theta 1 and a minimum force for the rod 870' to erect the second arm 912' or the third arm 915' may be referred to as F1.

Figure 32:
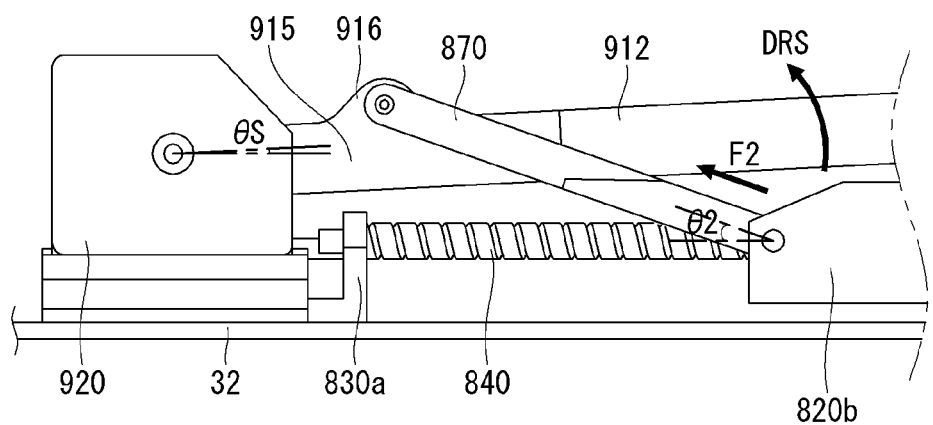

Referring to FIG. 32, the rod 870 may be connected to the protrusion 914 of the second arm 912 or the protrusion 916 of the third arm 915. When an angle formed by the second arm 912 or the third arm 915 and the second base 32 is theta S, an angle formed by the rod 870 and the second base 32 may be referred to as theta 2 and a minimum force for the rod 870 to erect the second arm 912 or the third arm 915 may be referred to as F2.

Figure 33:
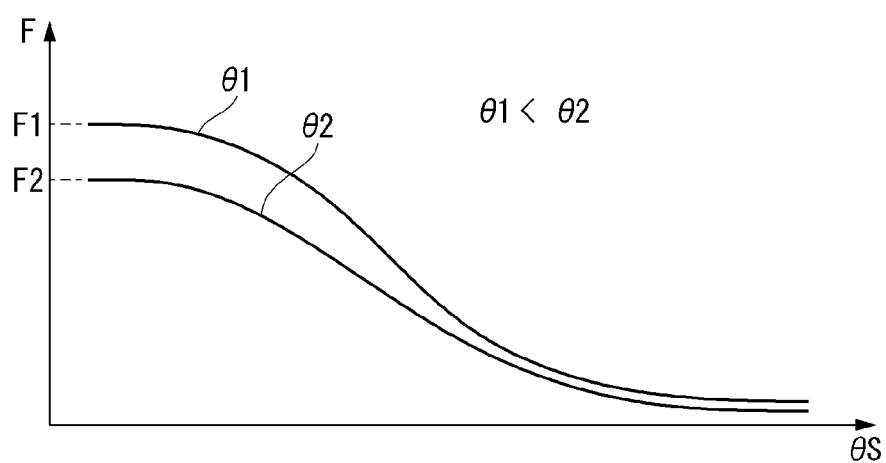

Referring to FIG. 33, when theta S is equal, theta 2 may be larger than theta 1. When theta S is equal, F1 may be larger than F2. If the angles formed by the second arms 912 and 912' and the second base 32 are equal, as the angles formed by the rods 870 and 870' and the second base 32 increase, the forces required for erecting the second arms 912 and 912' may decrease. The rod 870 is connected to the protrusions 914 and 916 to erect the second arm 912 with a smaller force than a case where the road 870' is not connected to the protrusion. The rod 870 is connected to the protrusions 914 and 916 to reduce the load applied to the motor assembly 810.

Figure 34:
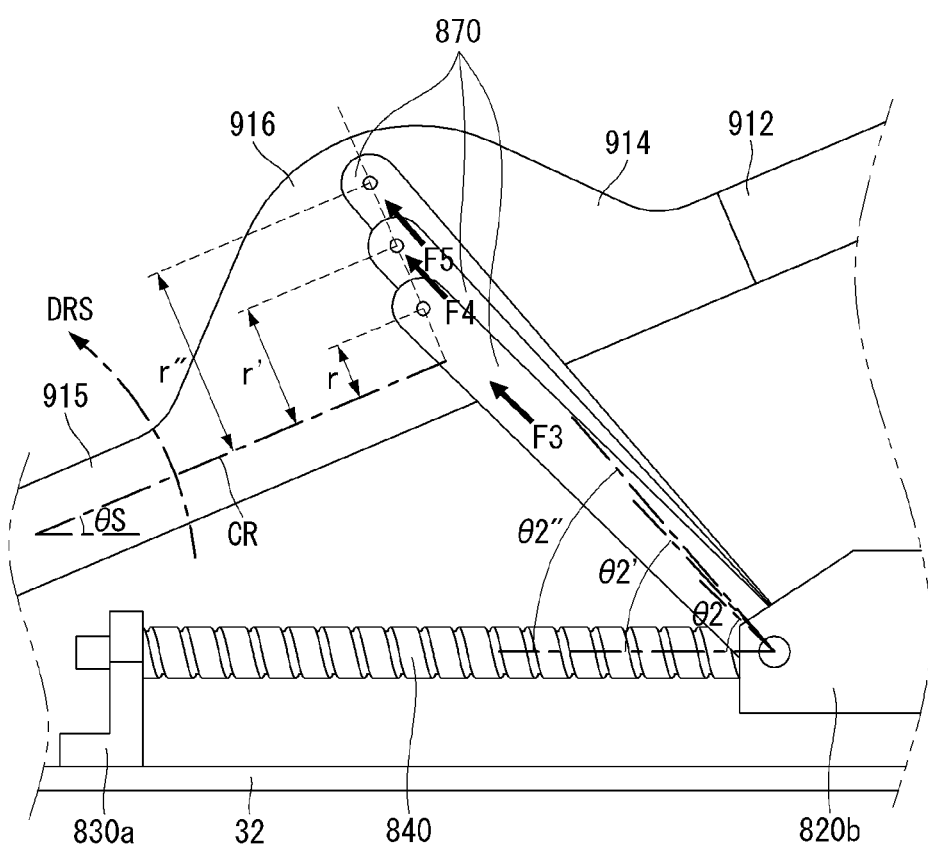

Referring to FIG. 34, the second arm 912 or the third arm 915 may have a central shaft CR. When the rod 870 is spaced apart from the central shaft CR by r and fastened to the second arm 912, the angle formed by the rod 870 and the second base 32 may be referred to as theta 2 and the minimum force for the rod 870 to erect the second arm 912 or the third arm 915 may be referred to as F3. When the rod 870 is spaced apart from the central shaft CR by r' and fastened to the second arm 912, the angle formed by the rod 870 and the second base 32 may be referred to as theta 2' and the minimum force for the rod 870 to erect the second arm 912 or the third arm 915 may be referred to as F4. When the rod 870 is spaced apart from the central shaft CR by r" and fastened to the second arm 912, the angle formed by the rod 870 and the second base 32 may be referred to as theta 2" and the minimum force for the rod 870 to erect the second arm 912 or the third arm 915 may be referred to as F5.

Figure 35:
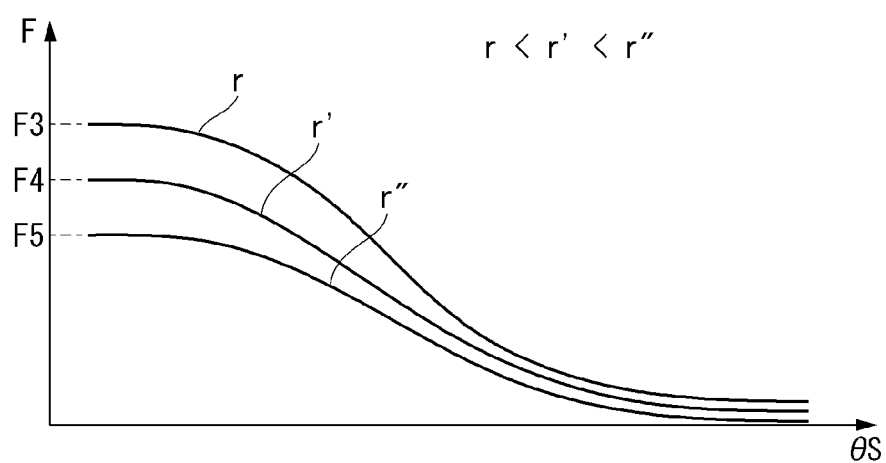

Referring to FIG. 35, when theta S is equal, theta 2" may be larger than theta 2 and theta2' may be larger than theta 2. When theta S is equal, F3 may be larger than F4 and F4 may be larger than F5. As the rod 870 is fastened far from the central shaft CR, a force required for erecting the second arm 912 may decrease. The rod 870 is fastened far from the central shaft CR to reduce the load applied to the motor assembly 810.

Figure 36:
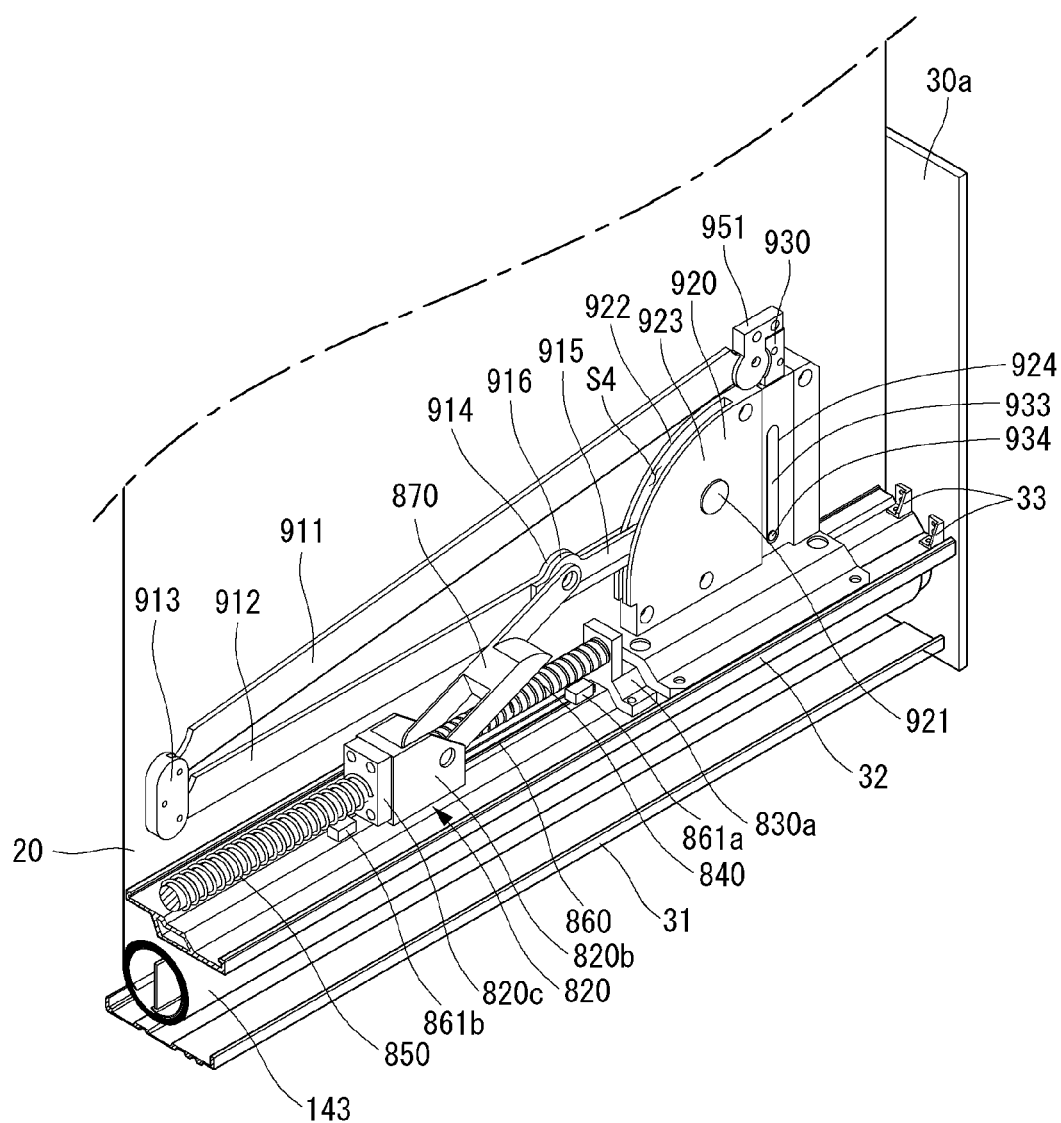

Referring to FIG. 36, the first arm 911 and the second arm 912 may contact or may be positioned close to the rear surface of the display unit 20. The first arm 911 and the second arm 912 contact or are positioned close to the rear surface of the display unit 20, and as a result, the display unit 20 may be stably unrolled from or rolled on the roller. The link mount 920 may include a first part 922 and a second part 923. The first part 922 and the second part 923 may face each other. A space S4 may be formed between the first part 922 and the second part 923. The first part 922 may face the display unit 20. The first part 922 may be positioned closer to the display unit 20 than the second part 923. The second arm 912 may be pivotably connected to the front surface of the first part 922. A part of the third arm 915 may be accommodated in the space S4, and pivotably connected to the first part 922 or the second part 923.

Figure 37:
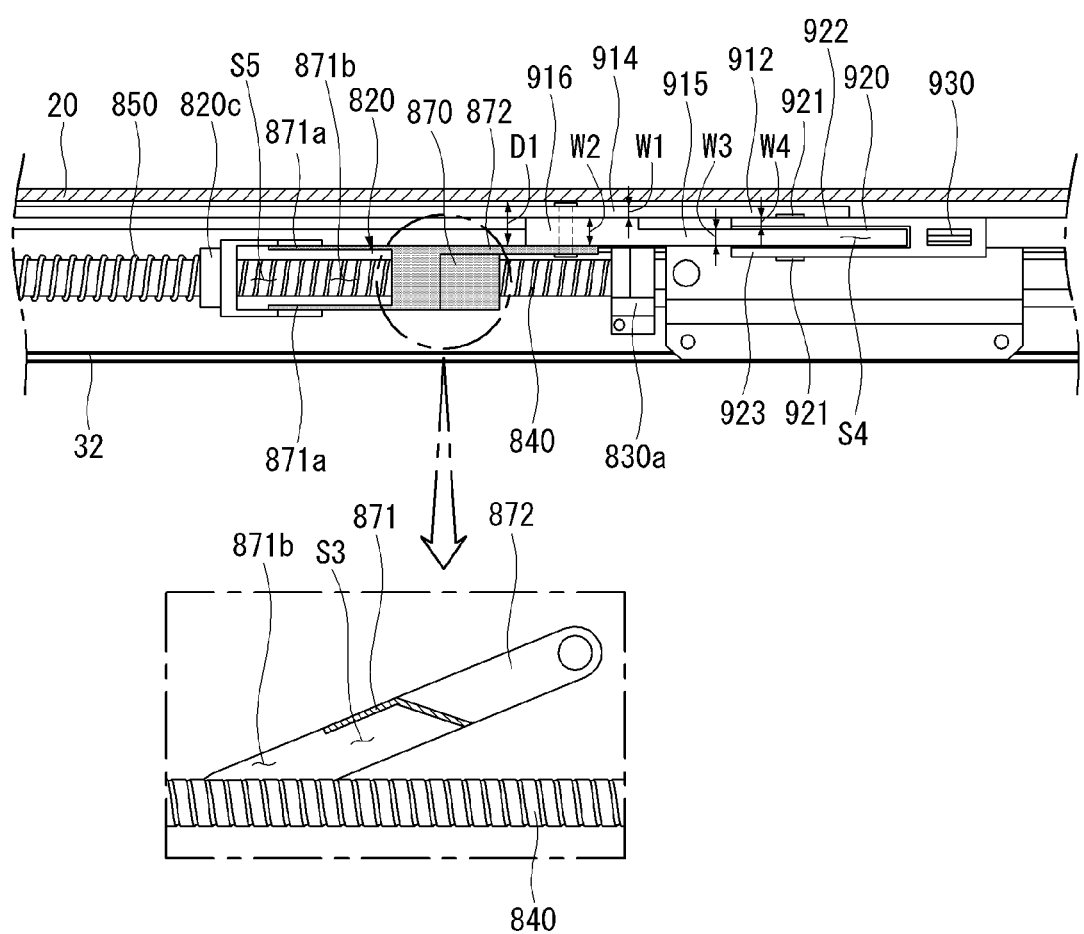

Referring to FIG. 37, the rod 870 may include a first part 871 and a second part 872. The first part 871 may include a connection portion 871a at one side. The second part 872 of the slide 820 may have a space S5 therein. The connection portion 871a may be inserted into the space S5. The connection portion 871a may be pivotably connected to the second part 820b (see FIG. 36) of the slide 820. The other side of the first part 871 may be connected to one side of the second part 872. The other side of the second part 872 may be pivotably connected to the second arm 912 or the third arm 915. The first part 871 may have a space S3 therein. The first part 871 may include a hole 871b. The lead screw 840 may be accommodated in the hole 871b or the space S3.

A distance between the second part 872 and the display unit 20 may be D1. The second arm 912 may have a thickness W1. A portion of the third arm 915, which is accommodated in a space S4 may have a thickness W3. The thickness W3 may be equal to a distance between the first part 922 and the second part 923. A portion of the third arm 915, which is accommodated in the space S4 may have a thickness W2. The first part 922 may have a thickness W4. The thickness W2 may be larger than the thickness W3. The thickness W2 may be equal to a sum of the thickness W3 and the thickness W4. D1 may be a sum of the thickness W1 and the thickness W2.

The second arm 912 may contact or may be positioned close to the rear surface of the display unit 20, and the third arm 915 may be positioned between the second arm 912 and the second part 872. The second part 872 may stably transfer a power for erecting the second arm 912 due to the third arm 915. The second part 872 may move forward with respect to a rotational shaft of the lead screw 840 and may be connected to the first part 871, in order to stably erect the second arm 912 or the third arm 915. As a result, a clearance between the second arm 912 and the second part 872 may be minimized.

Figure 38:
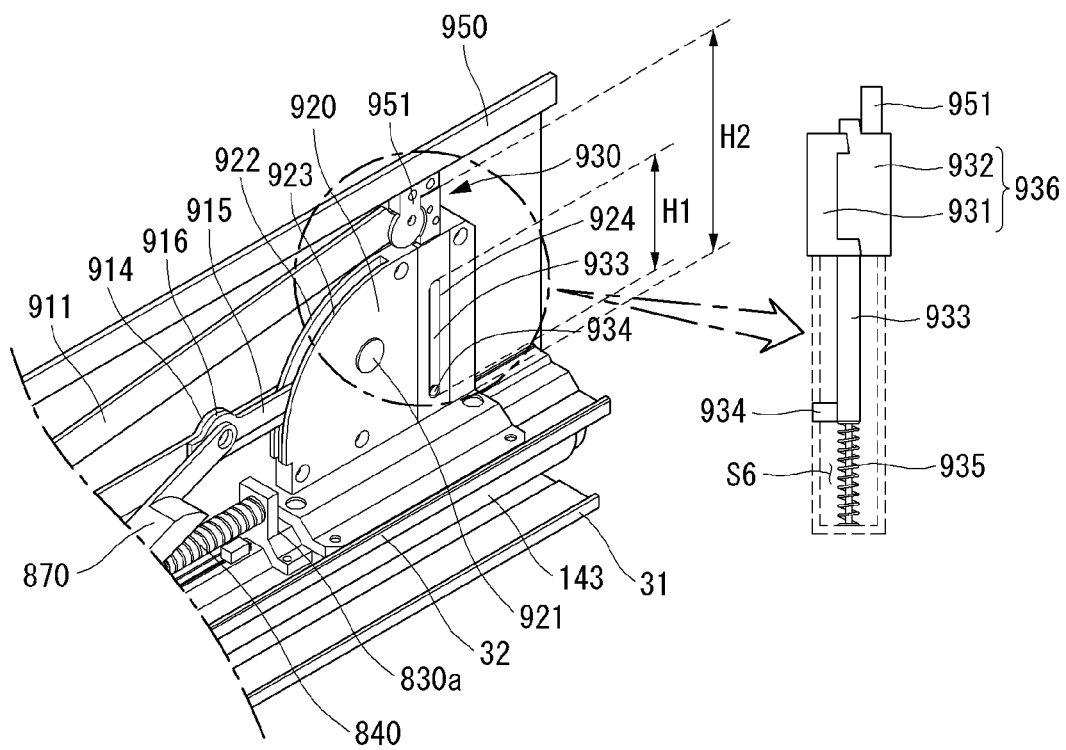

Referring to FIG. 38, a pusher 930 may be mounted on the link mount 920. The pusher 930 may be referred to as a lifter 930. The second part 932 may be fastened to the first part 931. The second part 932 may contact or may be separated from the link bracket 951. The second part 932 may be a material having high elasticity. The first part 931 may be a material having lower elasticity than the second part 932. The first part 931 may be a material having a higher rigidity than the second part 932. The first part 931 and the second part 932 may be collectively referred to as a head 936. The head 936 may be positioned at the top of the link mount 920.

The third part 933 may be connected to the first part 931. Alternatively, the third part 933 may be extended to the bottom of the first part 931. The third part 933 may be referred to as a tail 933. The fourth part 934 may protrude from the third part 933. The link mount 920 may have a space S6, and the third part 933 may be accommodated in the space S6. The space S6 may be opened to the upper side. The space S6 accommodating the third part 933 may be adjacent to the space S4 (see FIG. 37) accommodating the third arm 915. The second part 932 of the link mount 920 may include a hole 924. The hole 924 may be a long hole which elongates in a vertical direction. The length of the hole 924 may be H1. The fourth part 934 may be inserted into the hole 924. The spring 935 may be accommodated in the space S6. The spring 935 may be positioned at the bottom of the third part 933. The spring 935 may provide the elastic force in the vertical direction to the third part 933.

The head 936 may be larger than a diameter of the space S6. When the head 936 is suspended on the upper end of the space S6, a height of the head 936 from the second base 32 may be the minimum. A minimum height of the head 936 may be referred to as H2. When the height of the head 936 is the minimum, the fourth part 934 may be suspended ton the lower end of the space S6. When the height of the head 936 is the minimum, the spring 935 may be maximally compressed. When the height of the head 936 is the minimum, the elastic force provided by the spring 935 may be the maximum. When the height of the head 936 is the minimum, the height of the top case 950 may be the minimum.

While the pusher 930 contacts the link bracket 951, the pusher 930 may provide the elastic force to the link bracket 951. As a result, the load applied to the motor assembly 810 may be reduced in order to erect the link 910.

Figure 39:
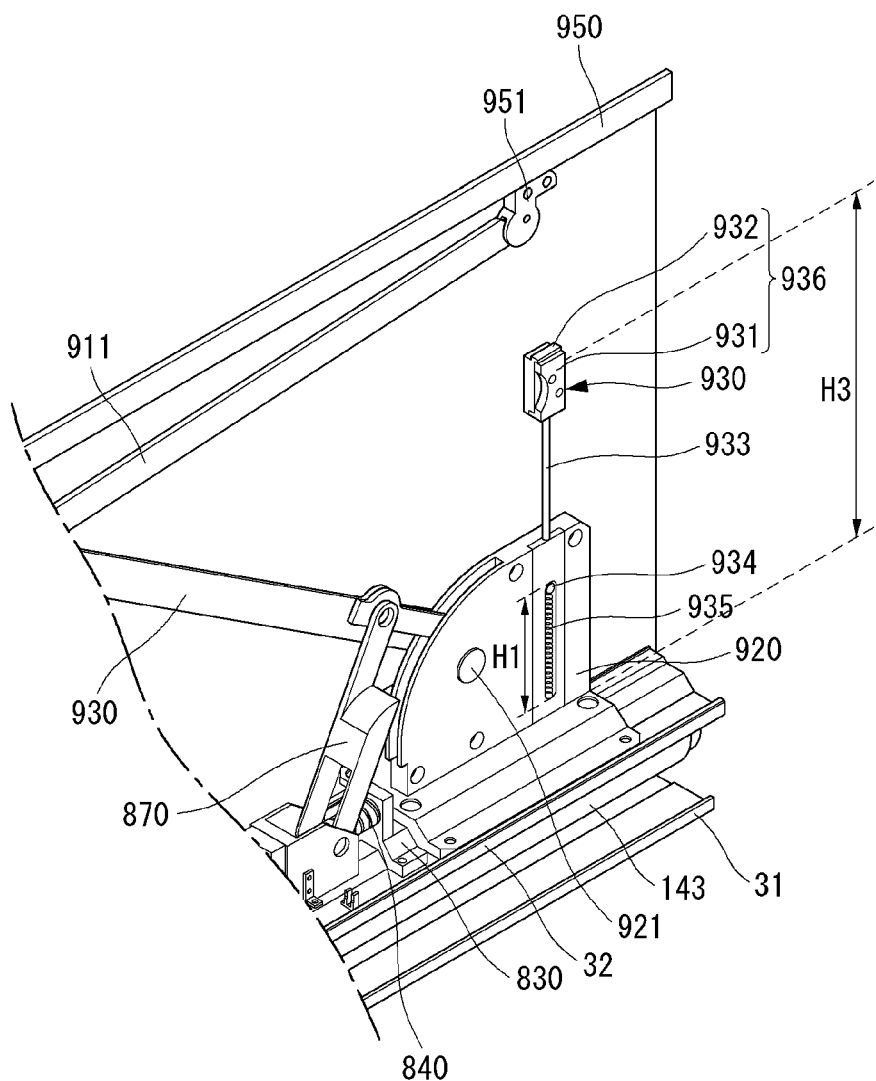

Referring to FIG. 39, when the link 910 is sufficiently erected, the pusher 930 may be separated from the link bracket 951. When the pusher 930 is separated from the link bracket 951, the height of the head 936 from the second base 32 may be the maximum. The maximum height of the head 936 may be referred to as H3. When the height of the head 936 is the maximum, the fourth part 934 may be suspended on the upper end of the hole 924 (see FIG. 38). When the height of the head 936 is the maximum, the spring 935 may be maximally tensioned. When the height of the head 936 is the maximum, the elastic force provided by the spring 935 may be the minimum. The maximum height H3 of the head 936 may be substantially equal to a sum of the minimum height H2 of the head 936 and the length H1 of the hole.

Figure 40:
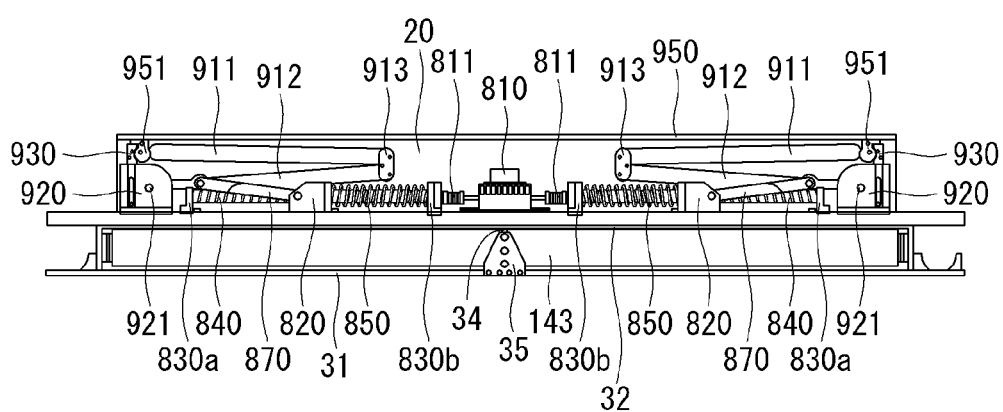

Referring to FIG. 40, the display unit 20 may be in a state of being maximally rolled on the roller 143. The display device 100 may be left and right symmetric based on the motor assembly 810. The height of the top case 950 may be the minimum. The slide 820 may be positioned maximally close to the inner bearing 830b. The slide 820 may be in a state of being suspended on the first stopper 861b. The spring 850 may be in a state of being maximally compressed. The pusher 930 may contact the link bracket 951. The height of the pusher 930 may be the minimum.

Figure 41:
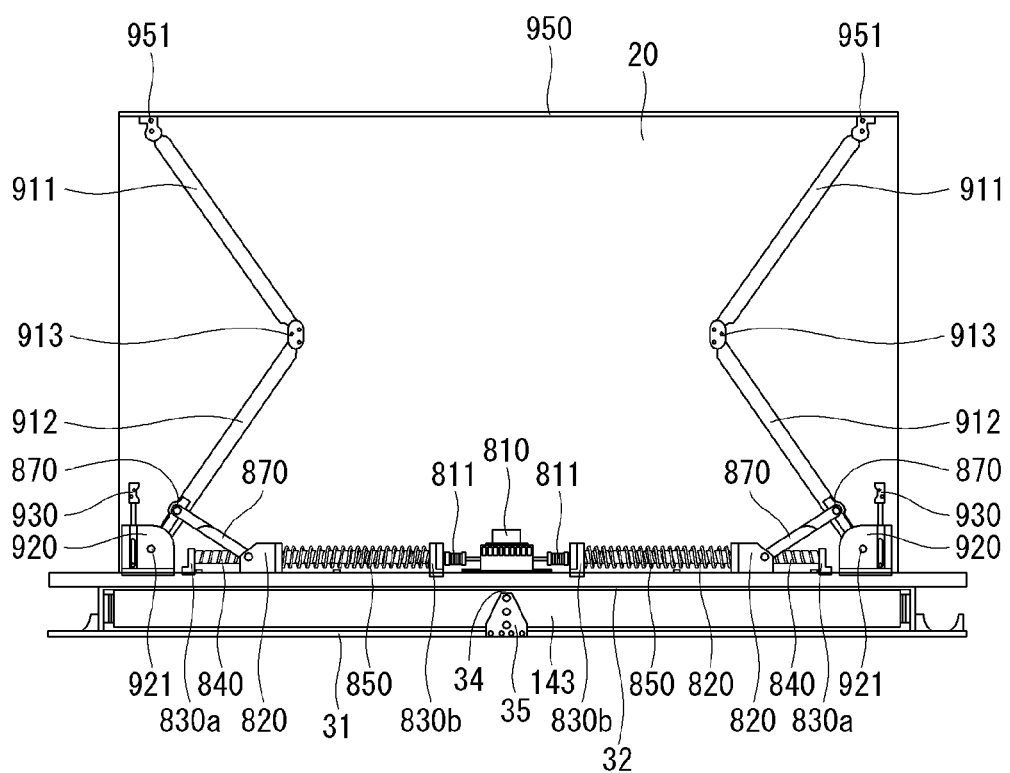

Referring to FIG. 41, the display unit 20 may be in a state in which approximately a half is rolled on the roller 143. The display device 100 may be left and right symmetric based on the motor assembly 810. The display unit 20 may be in a state in which approximately a half is unrolled from the roller 143. The slide 820 may be positioned between the first stopper 861b and the second stopper 861a. The pusher 930 may be separated from the link bracket 951. The height of the pusher 930 may be the maximum.

Figure 42:
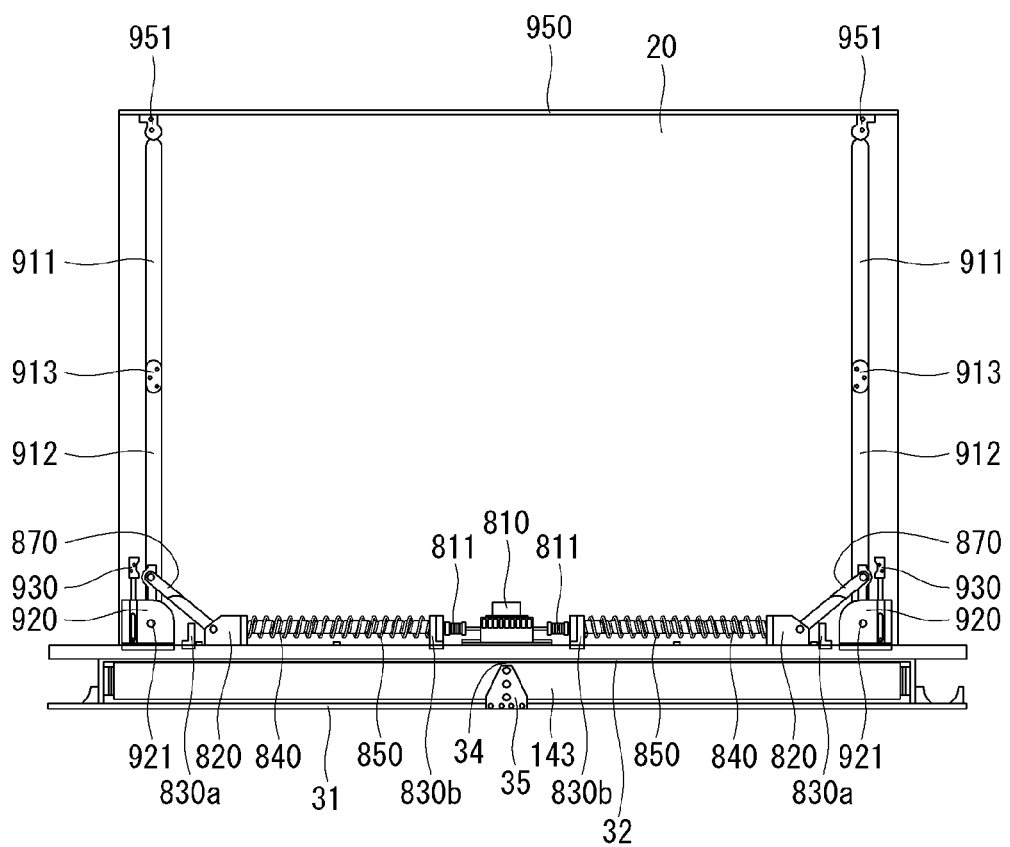
Figure 43:
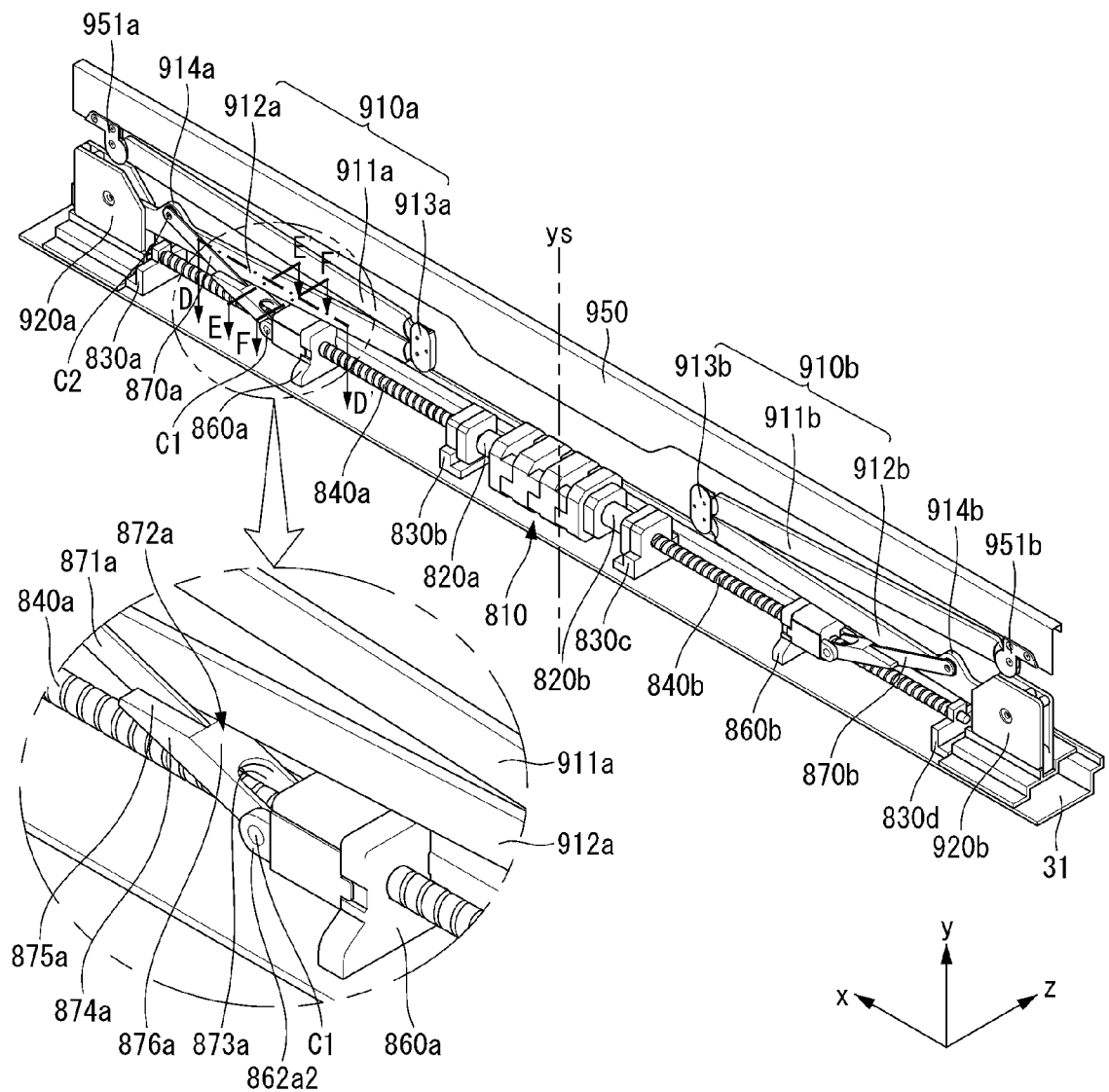
Figure 44:
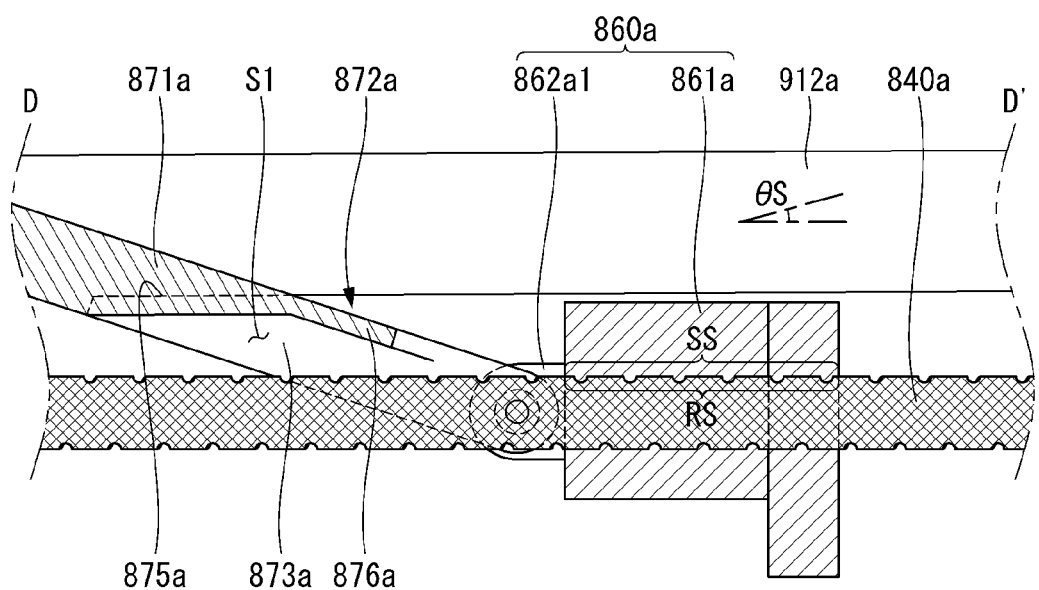
Figure 45:
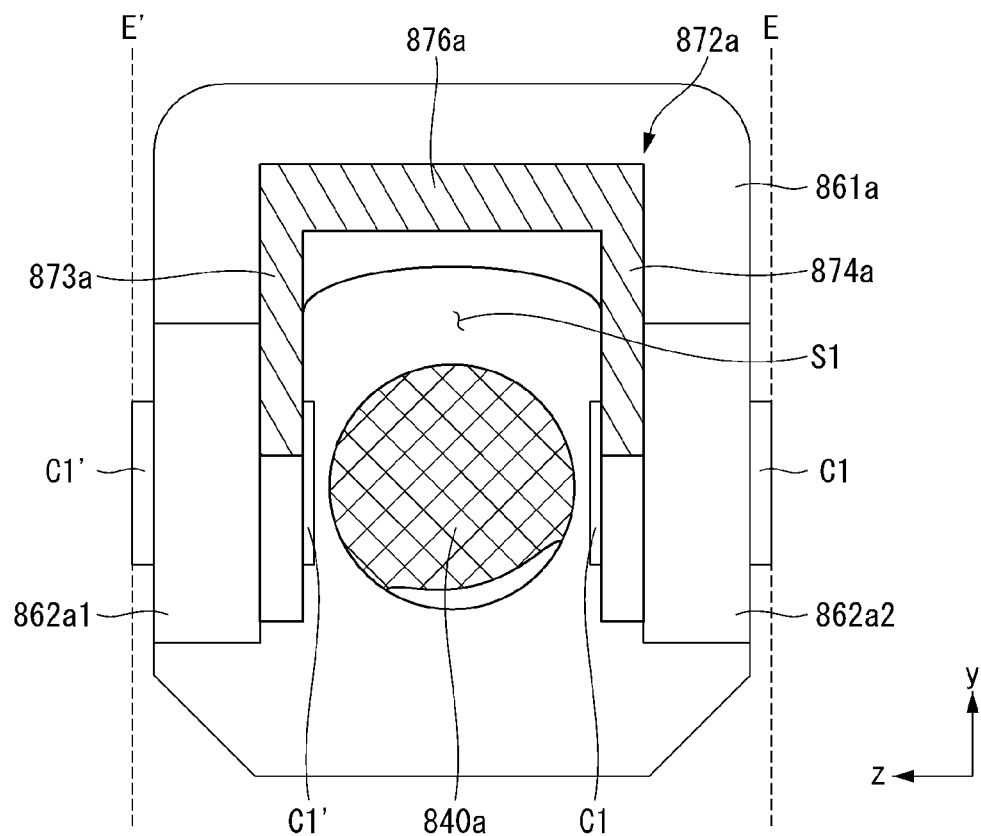
Figure 46:
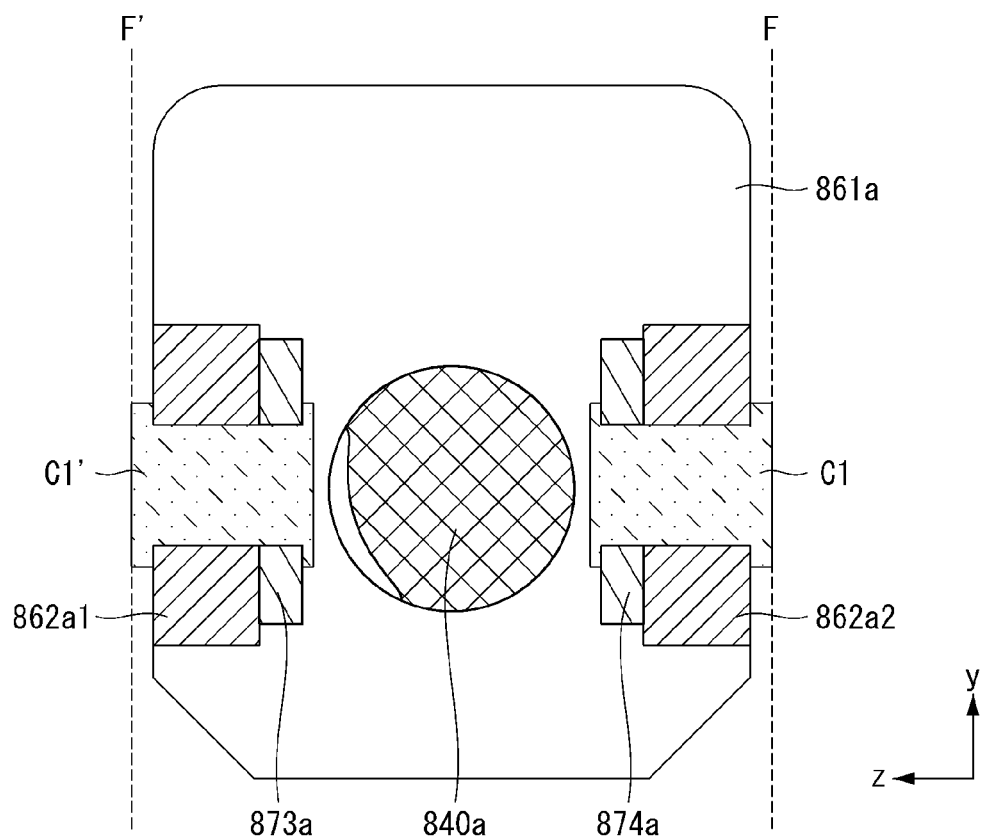

Referring to FIG. 42, the display unit 20 may be in a state of being maximally unrolled from the roller 143. The display device 100 may be left and right symmetric based on the motor assembly 810. The height of the top case 950 may be the maximum. The slide 820 may be positioned maximally close to the outer bearing 830a. The slide 820 may be in a state of being suspended on the second stopper 861a. The spring 850 may be in a state of being maximally tensioned. The pusher 930 may be separated from the link bracket 951. The height of the pusher 930 may be the maximum.

Referring to FIGS. 43 to 46, link mounts 920a and 920b may be installed in the base 31. The link mounts 920a and 920b may include a right link mount 920a spaced to a right side from a first right bearing 830a and a left link mount 920b spaced to a left side from a second left bearing 830d.

The links 910a and 910b may be connected to the link mounts 920a and 920b. The links 910a and 910b may include a right link 910a connected to a right link mount 920a and a left link 910b connected to a left link mount 920b.

The right link 910a may also be referred to as a first link. The left link 910b may also be referred to as a second link. The right link mount 920a may also be referred to as a first link mount 920a. The left link mount 920b may also be referred to as a second link mount 920b.

The links 910a and 910b may include first arms 911a and 911b, second arms 912a and 912b, and arm joints 913a and 913b. One-sides of the second arms 912a and 912b may be rotatably connected to the link mounts 920a and 920b. The other sides of the second arms 912a and 912b may be rotatably connected to the arm joints 913a and 913b. One-sides of the first arms 911a and 911b may be rotatably connected to the arm joints 913a and 913b. The other sides of the first arms 911a and 911b may be rotatably connected to the link brackets 951a and 951b.

The link brackets 951a and 951b may include a right link bracket 951a connected to the first arm 911a of the right link 910a and a left link bracket 951b connected to the first arm 911b of the left link 910b. The link brackets 951a and 951b may be coupled to the upper bar 950.

The upper bar 950 may connect the right link bracket 951a and the left link bracket 951b.

The rods 870a and 870b may connect sliders 860a and 860b and links 910a and 910b. One-sides of the rods 870a and 870b may be rotatably connected to the sliders 860a and 860b. The other sides of the rods 870a and 870b may be rotatably connected to the second arms 912a and 912b. The rods 870a and 870b may include a right rod 870a connecting a right slider 860a and the second arm 912a of the right link 910a and a left rod 870b connecting a left slider 860b and the second arm 912b of the left link 910b. The right rod 870a may also be referred to as a first rod 870a. The left rod 870b may also be referred to as a second rod 870b.

Specifically, a structure in which the right lead screw 840a, the right slider 860a, the right rod 870a, and the right link 910a will be described. The right slider 860a may include a body 861a and a rod mount 862a. A thread SS may be formed on an inner circumferential surface of the body 861a. The thread formed in the body 861a may be engaged with a thread RS of the right lead screw 840a. The right lead screw 840a may penetrate the body 861a.

The rod mount 862a may be formed at the right side of the body 861a. The rod mount 862a may be rotatably connected to one side of the right rod 870a. The rod mount 862a may include a first rod mount 862a1 and a second rod mount 862a2. The first rod mount 862a1 may be disposed in front of the right lead screw 840a. The second rod mount 862a2 may be disposed in the rear of the right lead screw 840a. The first rod mount 862a1 and the second rod mount 862a2 may be spaced apart from each other. The second rod mount 862a2 may be spaced apart from the first rod mount 862a1 in a −z-axis direction. The right lead screw 840a may be positioned between the first rod mount 862a1 and the second rod mount 862a2.

The rod mount 862a may be rotatably connected to one side of the rod 870a through a connection member C1. The connection member C1 may penetrate the rod mount 862a and the right rod 870a.

The rod mount 870a may be rotatably connected to the second arm 912a through a connection member C2. The connection member C2 may penetrate the second arm 912a and the right rod 870a.

The right rod 870a may include a transfer portion 871a connected to the second arm 912a of the right link 910a and a cover 872a connected to the rod mount 862a of the right slider 860a. The transfer portion 871a may transfer, to the right link 910a, a force generated as the right slider 860a advances and retreats along the right lead screw 840a.

The cover 872a may include a first plate 873a disposed in front of the right lead screw 840a. The first plate 873a may be disposed vertically to the base 31. Alternatively, the first plate 873a may face the right lead screw 840a.

The cover 872a may include a second plate 874a disposed in the rear of the right lead screw 840a. The second plate 874a may be disposed vertically to the base 31. Alternatively, the second plate 874a may face the right lead screw 840a. Alternatively, the second plate 874a may be spaced apart from the first plate 873a. The right lead screw 840a may be positioned between the first plate 873a and the second plate 874a.

The cover 872a may include a third plate 875a connecting the first plate 873a and the second plate 874a. The third plate 875a may be connected to the transfer portion. The third plate 875a may be positioned at the top of the right lead screw 840a.

The cover 872a may include a fourth plate 876a connecting the first plate 873a and the second plate 874a. The fourth plate 876a may be connected to the third plate 875a. The fourth plate 876a may be positioned at the top of the right lead screw 840a.

One side of the first plate 873a may be connected to the first rod mount 862a1. The first plate 873a and the first rod mount 862a1 may be connected through a connection member C1'. The other side of the first plate 873a may be connected to the third plate 875a.

One side of the second plate 874a may be connected to the second rod mount 862a2. The second plate 874a and the second rod mount 862a2 may be connected through the connection member C1. The other side of the second plate 874a may be connected to the third plate 875a.

When the right slider 860a moves to be close to the motor assembly 810, the right lead screw 840a and the right rod 870a may contact each other. When the right lead screw 840a and the right rod 870a may contact each other, mutual interference may occur and the movement of the right slider 860a may be restricted.

The cover 872a may provide a space S1 therein. The first plate 873a, the second plate 874a, the third plate 875a, and the fourth plate 876a may form the space S1. When the right slider 860a moves to be close to the motor assembly 810, the right lead screw 840a may be accommodated or escape into the space S1 provided by the cover 872a. Due to the space S1 provided by the cover 872a, the right slider 860a may move closer to the motor assembly 810 than a case where the cover 872a is not present. That is, the cover 872a provides the space S1 therein to widen a movable range of the right slider 860a. Further, the right lead screw 840a is accommodated in the cover 872a to reduce a size of the housing 30 (see FIG. 2).

Further, the cover 872a may restrict a minimum value of theta S which is the angle formed by the second arm 912a and the base 31. When theta S sufficiently decreases, the third plate 875a of the cover 872a may contact the second arm 912a and support the second arm 912a. The third plate 875a supports the second arm 912a to restrict the minimum value of theta S and prevent sagging of the second arm 912a. That is, the cover 872a may serve as a stopper that prevents the sagging of the second arm 912a. Further, the third plate 875a restricts the minimum value of theta S to reduce an initial load for erecting the second arm 912a.

The lead screws 840a and 840b may be driven by one motor assembly 810. The lead screws 840a and 840b are driven by one motor assembly 810, and as a result, the second arms 912a and 912b may be erected while being symmetric to each other. However, when the lead screws 840a and 840b are driven by one motor assembly 810, the load applied to the motor assembly 810 may be excessively increased in order to erect the second arms 912a and 912b. In this case, by restricting the third plate 875a restricts the minimum value of theta S, the load applied to the motor assembly 810 may be reduced in order to erect the second arms 912a and 912b.

A structure formed by the left lead screw 840b, the left slider 860b, the left rod 870b, and the left link 910b may be symmetric to a structure formed by the right lead screw 840a, the right slider 860a, the right rod 870a, and the right link 910a. In this case, a symmetric axis may be a symmetric axis ys of the motor assembly 810.

Figure 47:
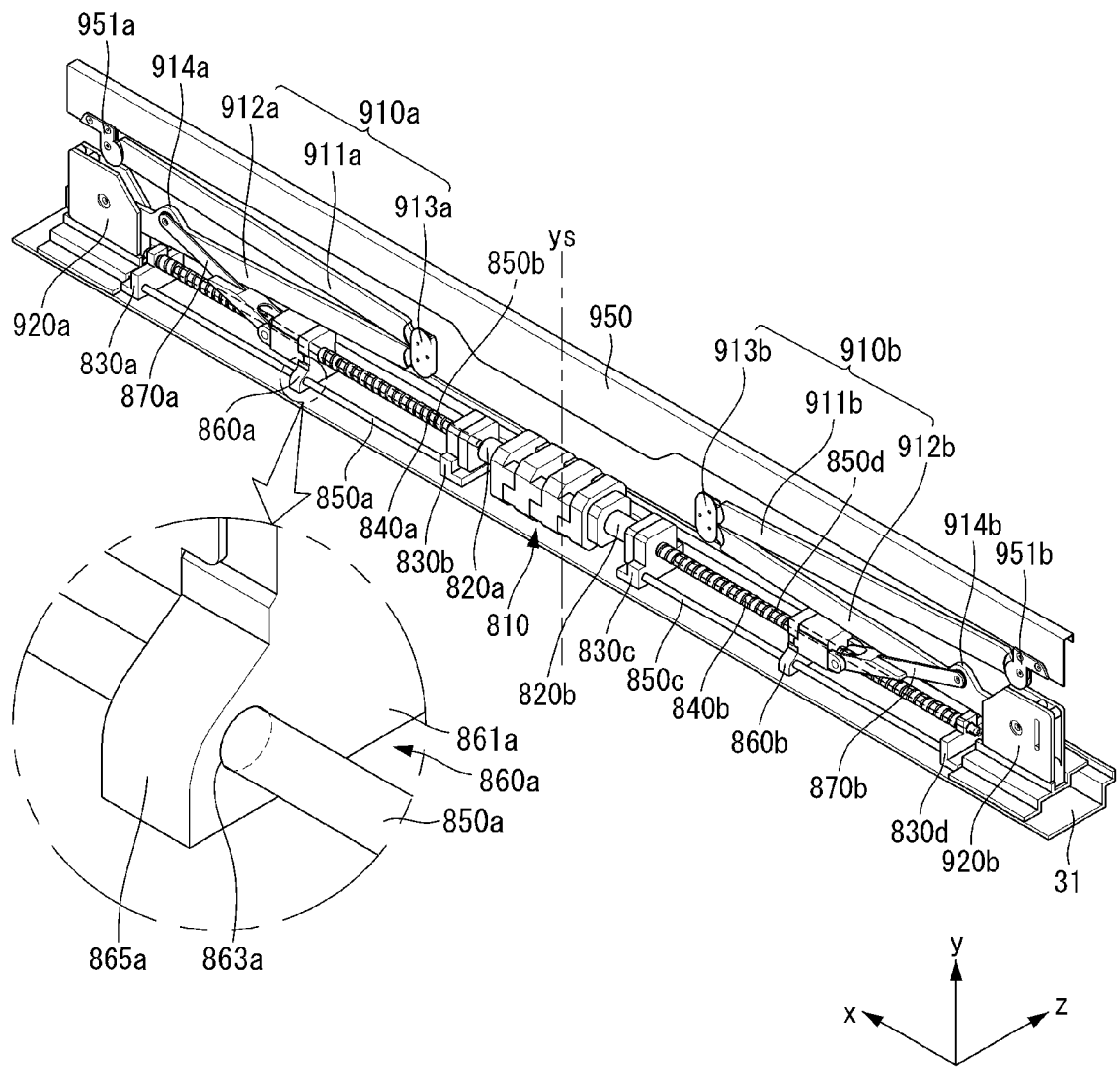

Referring to FIG. 47, guides 850a, 850b, 850c, and 850d may be connected to bearings 830a, 830b, 830c, and 830d. The guides 850a, 850b, 850c, and 850d may include right guides 850a and 850b disposed at the right side of the motor assembly 810 and left guides 850c and 850d disposed at the left side of the motor assembly 810.

One-sides of the right guides 850a and 850b may be connected to a first right bearing 30a and the other sides may be connected to a second right bearing 830b. The right guides 850a and 850b may be positioned in parallel to the right lead screw 840a. Alternatively, the right guides 850a and 850b may be spaced apart from the right lead screw 840a.

The right guides 850a and 850b may include a first right guide 850a and a second right guide 850b. The first right guide 850a and the second right guide 850b may be spaced apart from each other. The right lead screw 840a may be positioned between the first right guide 850a and the second right guide 850b.

The right slider 860a may include the protrusion. Alternatively, the display device may include the protrusion formed in the right slider 860a. The protrusion may be formed in the body of the slider. The protrusion may include a front protrusion (not illustrated) which protrudes from the body 861a of the right slider 860a in the +z-axis direction and a rear protrusion 865a which protrudes from the body of the slider in the −z-axis direction.

The first right guide 850a may penetrate the rear protrusion 865a. Alternatively, the first right guide 850a may include a first hole 863a and the first right guide 850a may penetrate the first hole 863a. The first hole 863a may be formed in an x-axis direction. The first hole 863a may also be referred to as a hole 863a.

A second right guide (not illustrated) may penetrate a front protrusion (not illustrated). Alternatively, the second right guide may include a second hole (not illustrated), and the second right guide may penetrate the second hole. The second hole may be formed in the x-axis direction.

The right guides 850a and 850b may guide the right slider 860a to more stably move when the right slider 860a advances and retreats along the right lead screw 840a. The right guides 850a and 850b stably guide the right slider 860a, and as a result, the right slider 860a may not rotate with respect to the right lead screw 840a, but advance and retreat along the right lead screw 840a.

A structure formed by the left guides 850c and 850d, the left bearings 830a, 830b, 830c, and 830d, the left slider 860b, and the left lead screw 840b may be symmetric to a structure formed by the right guides 850a and 850b, the right bearings 830a, 830b, 830c, and 830d, the right slider 860a, and the right lead screw 840a. In this case, the symmetric axis may be the symmetric axis ys of the motor assembly 810.

Figure 48:
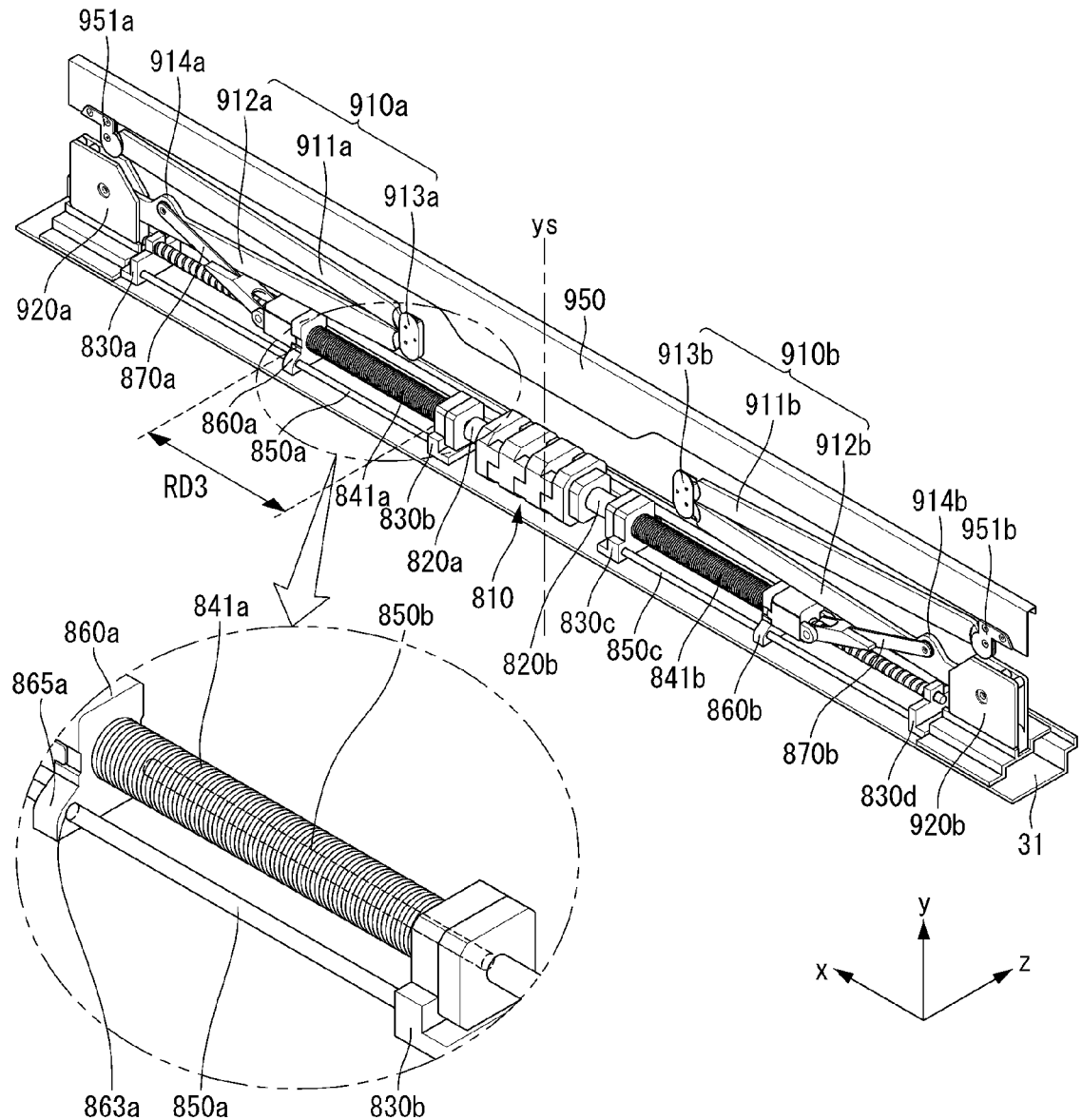

Referring to FIG. 48, the first springs 841a and 841b may be inserted into the lead screws 840a and 840b. Alternatively, the lead screws 840a and 840b may penetrate the first springs 841a and 841b. The first springs 841a and 841b may include a first right spring 841a disposed at the right side of the motor assembly 810 and a first left spring 841b disposed at the left side of the motor assembly 810.

The first right spring 841a may be disposed between the right slider 860a and the second right bearing 830b. One end of the first right spring 841a may be contacted with or separated from the right slider 860a. The other end of the first right spring 841a may be contacted with or separated from the second right bearing 830b.

When the second arm 912a is completely laid with respect to the base 31, a distance between the right slider 860a and the second right bearing 830b may be a distance RD3. The first right spring 841a may have a length larger than the distance RD3 while being not compressed or tensioned. Accordingly, when the second arm 912a is completely laid with respect to the base 31, the first right spring 841a may be compressed between the right slider 860a and the second right bearing 830b. In addition, the first right spring 841a may provide a restoration force to the right slider 860a in the +x-axis direction.

When the second arm 912a is changed from the state of being completely laid with respect to the base 31 from a state of being erected, the restoration force provided by the first right spring 841a may assist the second arm 912a to be erected. The first right spring 841a assists the second arm 912a to be erected to reduce the load of the motor assembly 810.

The lead screws 840a and 840b may be driven by one motor assembly 810. The lead screws 840a and 840b are driven by one motor assembly 810, and as a result, the second arms 912a and 912b may be erected while being symmetric to each other. However, when the lead screws 840a and 840b are driven by one motor assembly 810, the load applied to the motor assembly 810 may be excessively increased in order to erect the second arms 912a and 912b. In this case, the first right spring 841a assists the second arm 912a to be erected to reduce the load of the motor assembly 810, and may reduce the load applied to the motor assembly 810 in order to erect the second arm 912a.

Alternatively, when the second arm 912a is changed from the state of being erected with respect to the base 31 to the state of being completely laid, the restoration force provided by the first right spring 841a may assist the second arm 912a to be erected. That is, the first right spring 841a may serve as a damper when the second arm 912a is laid with respect to the base 31. The first right spring 841a serves as the damper to reduce the load of the motor assembly 810.

A structure formed by the first left spring 841b, the left bearings 830a, 830b, 830c, and 830d, the left slider 860b, the left lead screw 840b, and the second arm 912a may be symmetric to a structure formed by the first right spring 841a, the right bearings 830a, 830b, 830c, and 830d, the right slider 860a, the right lead screw 840a, and the second arm 912a. In this case, the symmetric axis may be the symmetric axis ys of the motor assembly 810.

Figure 49:
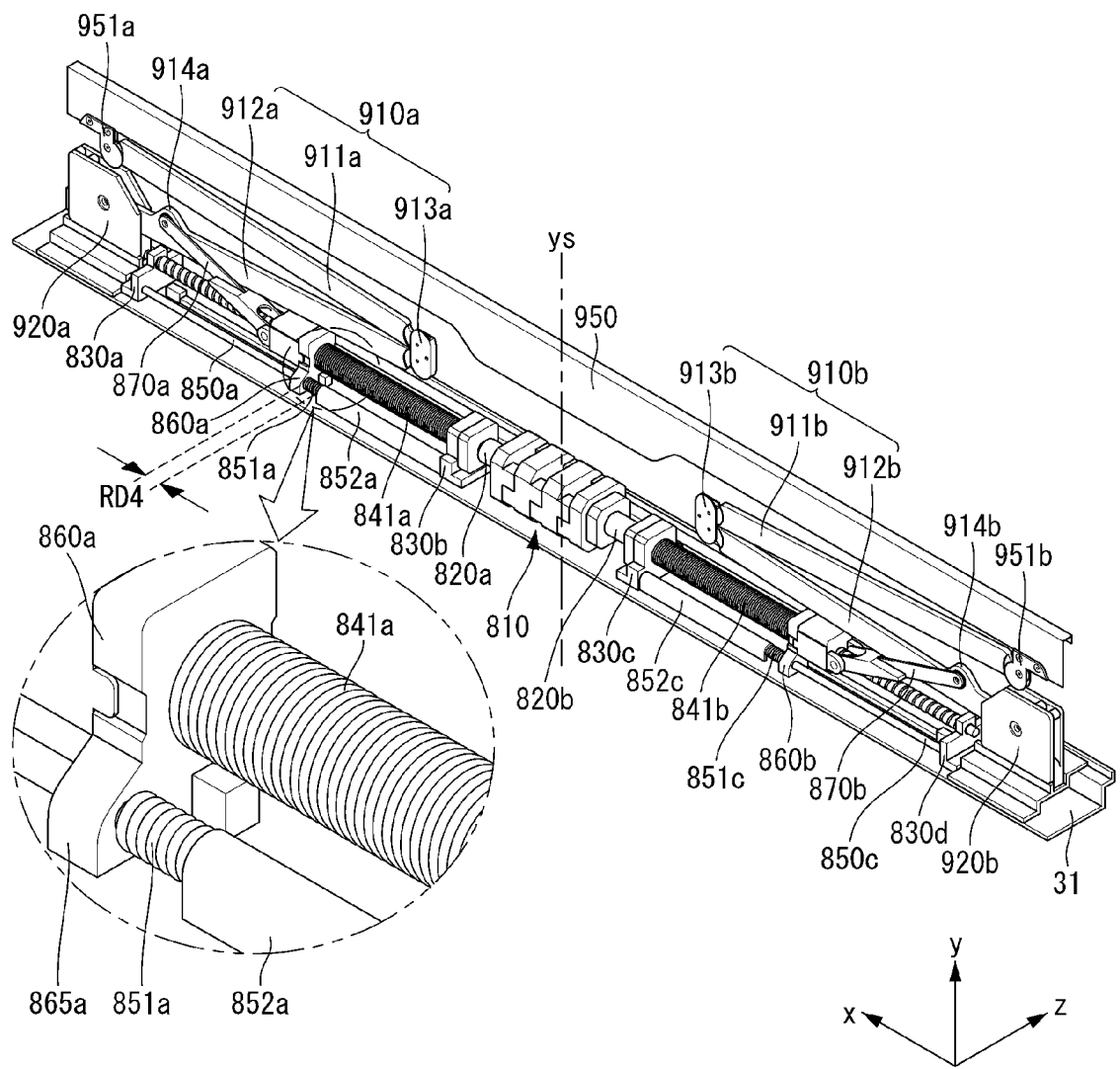

Referring to FIG. 49, the second springs 851a and 851b may be inserted into the guides 850a, 850b, 850c, and 850d. Alternatively, the guides 850a, 850b, 850c, and 850d may penetrate the second springs 851a and 851b. The second springs 851a and 851b may include a second right spring 851*a* disposed at the right side of the motor assembly 810 and a second left spring 851*b* disposed at the left side of the motor assembly 810.

A plurality of right springs 851*a* may be formed. The second right spring 851*a* may include springs 940*a* and 940*b* inserted into the first right guide 850*a* and springs 940*a* and 940*b* inserted into the second right guide 850*b*. Alternatively, the second right spring 851*a* may include springs 940*a* and 940*b* penetrated by the first right guide 850*a* and springs 940*a* and 940*b* penetrated by the second right guide 850*b*.

The guides 850*a*, 850*b*, 850*c*, and 850*d* may include projections 852*a* and 852*b*. The second springs 852*a* and 852*b* may include a right projection 852*a* disposed at the right side of the motor assembly 810 and a left projection 852*b* disposed at the left side of the motor assembly 810.

The right projection 852*a* may be disposed between the right slider 860*a* and the second right bearing 830*b*. In addition, the second right spring 851*a* may be disposed between the right slider 860*a* and the second right bearing 830*b*. One end of the second right spring 851*a* may be contacted with or separated from the right slider 860*a*. One end of the second right spring 851*a* may be contacted with or separated from the right projection 852*a*.

When the second arm 912*a* is completely laid with respect to the base 31, a distance between the right slider 860*a* and the right projection 852*a* may be a distance RD4. The second right spring 851*a* may have a length larger than the distance RD4 while being not compressed or tensioned. Accordingly, when the second arm 912*a* is completely laid with respect to the base 31, the second right spring 851*a* may be compressed between the right slider 860*a* and the right projection 852*a*. In addition, the second right spring 851*a* may provide the restoration force to the right slider 860*a* in the +x-axis direction.

When the second arm 912*a* is changed from the state of being completely laid with respect to the base 31 from a state of being erected, the restoration force provided by the second right spring 851*a* may assist the second arm 912*a* to be erected. The second right spring 851*a* assists the second arm 912*a* to be erected to reduce the load of the motor assembly 810.

The lead screws 840*a* and 840*b* may be driven by one motor assembly 810. The lead screws 840*a* and 840*b* are driven by one motor assembly 810, and as a result, the second arms 912*a* and 912*b* may be erected while being symmetric to each other. However, when the lead screws 840*a* and 840*b* are driven by one motor assembly 810, the load applied to the motor assembly 810 may be excessively increased in order to erect the second arms 912*a* and 912*b*. In this case, the second right spring 851*a* assists the second arm 912*a* to be erected to reduce the load of the motor assembly 810, and may reduce the load applied to the motor assembly 810 in order to erect the second arm 912*a*.

Alternatively, when the second arm 912*a* is changed from the state of being erected with respect to the base 31 to the state of being completely laid, the restoration force provided by the second right spring 851*a* may assist the second arm 912*a* to be erected. That is, the second right spring 851*a* may serve as the damper when the second arm 912*a* is laid with respect to the base 31. The second right spring 851*a* serves as the damper to reduce the load of the motor assembly 810.

A structure formed by the second left spring 851*b*, the left projection 852*b*, the left slider 860*b*, the left guides 850*c* and 850*d*, and the second arm 912*a* may be symmetric to a structure formed by the second right spring 851*a*, the right projection 852*a*, the right slider 860*a*, the right guides 850*a* and 850*b*, and the second arm 912*a*. In this case, the symmetric axis may be the symmetric axis ys of the motor assembly 810.

Figure 50:
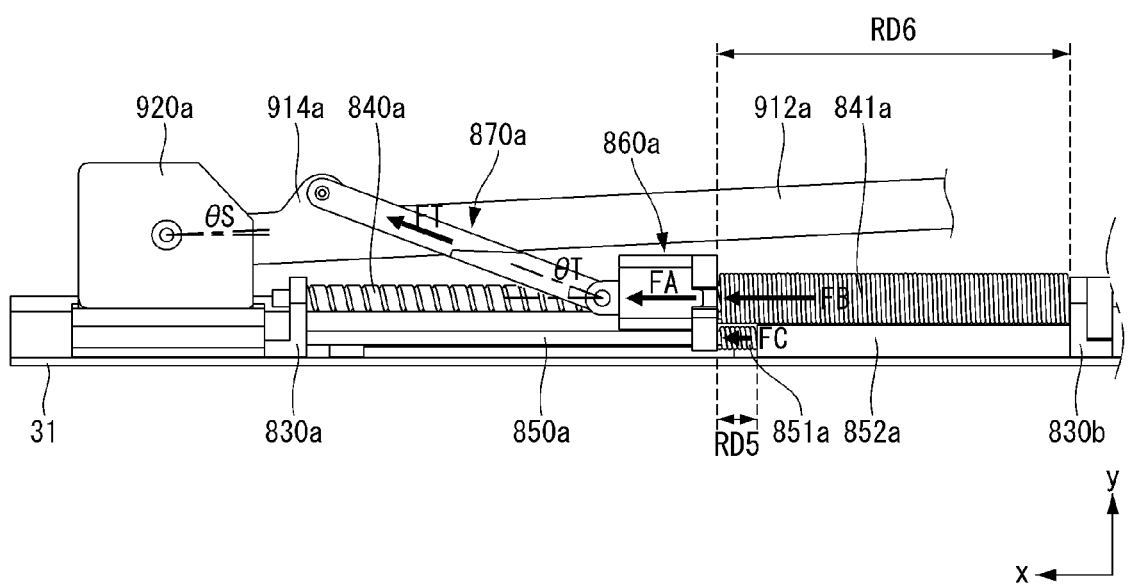
Figure 51:
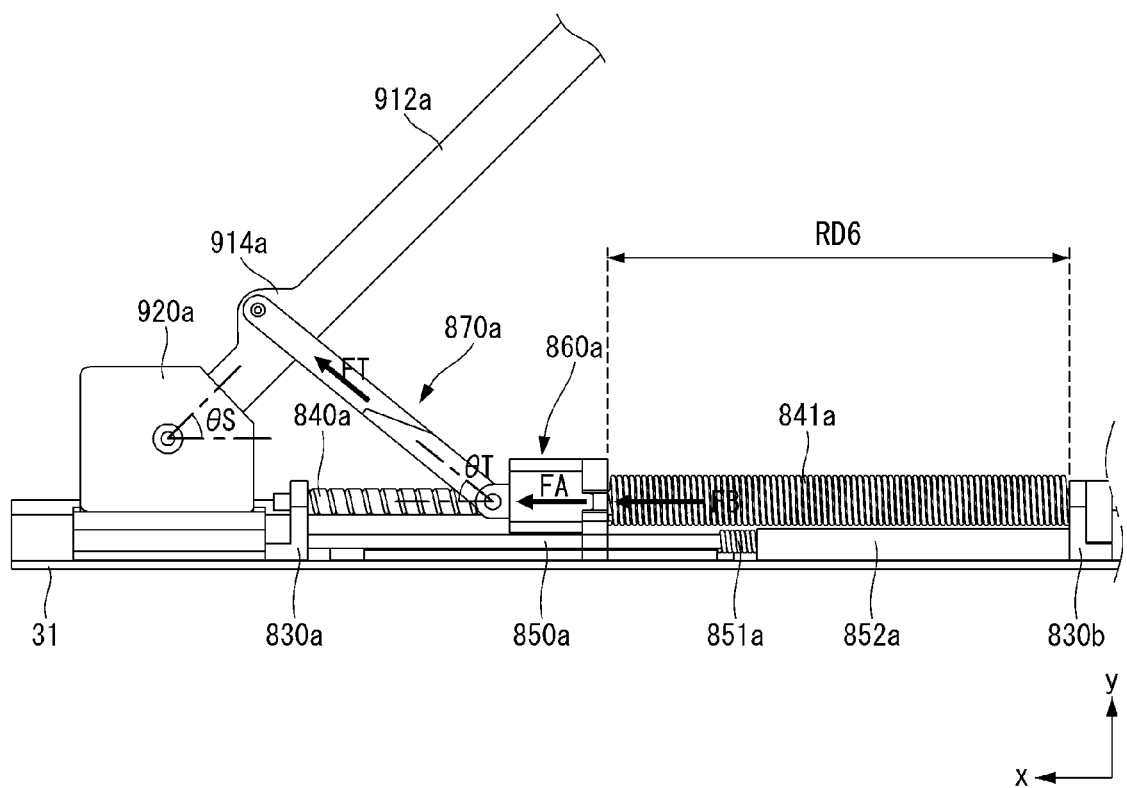
Figure 52:
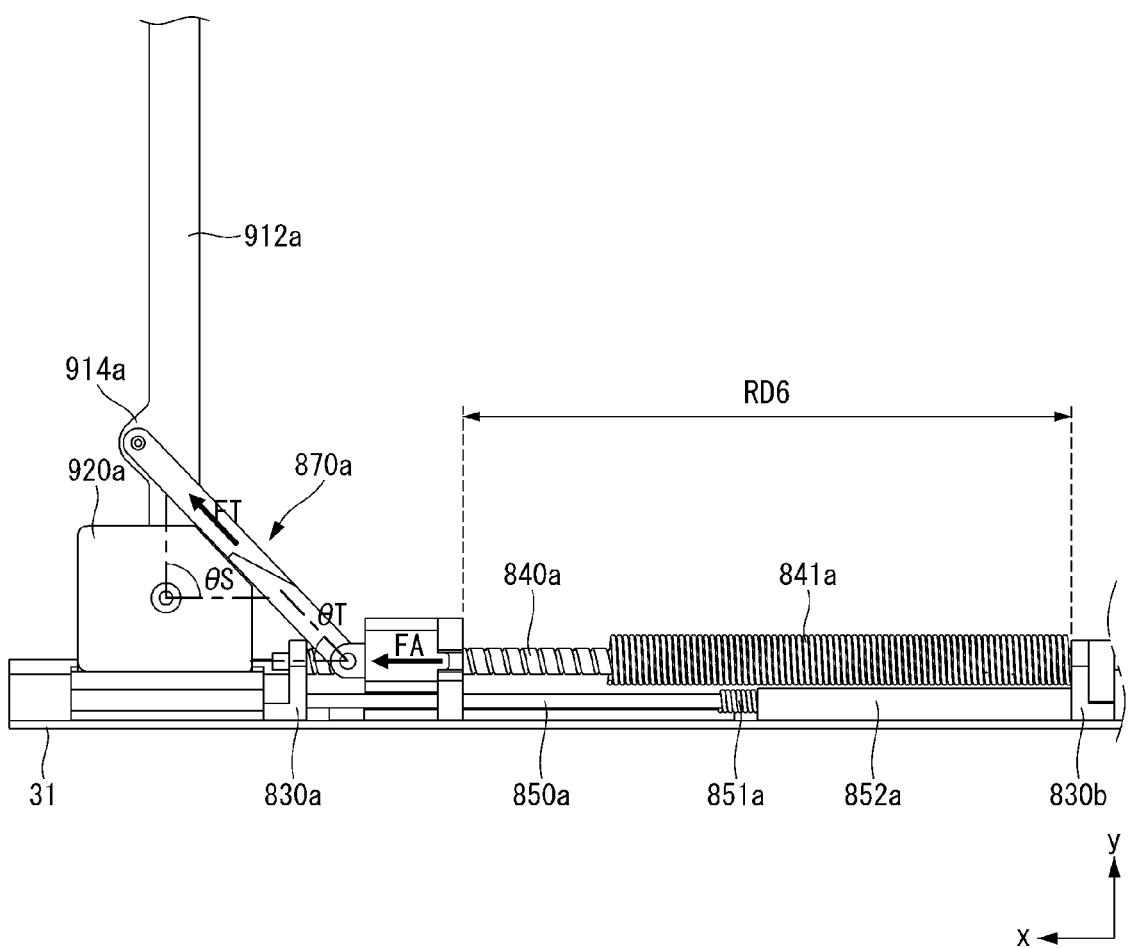

Referring to FIGS. 50 to 52, the second arm 912*a* receives the restoration force from the first right spring 841*a* and the second right spring 851*a* to be erected.

An angle formed by the second arm 912*a* and the base 31 may be referred to as an angle theta S. An angle formed by the right rod 870*a* and the base 31 may be referred to as an angle theta T. A force for to the motor assembly 810 to move the right slider 860*a* in the +x-axis direction may be referred to as FA. A force which the first right spring 841*a* applies to the right slider 860*a* may be referred to as FB. A force which the second right spring 851*a* applies to the right slider 860*a* may be referred to as FC. A force which the right rod 870*a* transfers to the second arm 912*a* may be referred to as FT.

When the second arm 912*a* is completely laid with respect to the base 31, the angle theta S and the angle theta T may have the minimum values. When the second arm 912*a* is changed from the state of being completely laid with respect to the second base 31 to the state of being erected, the angle theta S and the angle theta T may gradually increase.

When the second arm 912*a* is completely laid with respect to the base 31, the first right spring 841*a* may be compared. The compressed first right spring 841*a* may provide the restoration force FB to the right slider 860*a*. The restoration force FB may be applied in a +x direction. When the second arm 912*a* is completely laid with respect to the base 31, a compression displacement of the first right spring 841*a* may be the maximum and a magnitude of the restoration force FB may have a maximum value. When the second arm 912*a* is changed from the state of being completely laid with respect to the base 31 to the state of being erected, the compression displacement of the first right spring 841*a* may gradually decease and the magnitude of the restoration force FB may gradually decrease.

When the second arm 912*a* is completely laid with respect to the base 31, the second right spring 851*a* may be compared. The compressed second right spring 851*a* may provide the restoration force FC to the right slider 860*a*. The restoration force FC may be applied in the +x direction. When the second arm 912*a* is completely laid with respect to the base 31, the compression displacement of the second right spring 851*a* may be the maximum and the magnitude of the restoration force FC may have the maximum value. When the second arm 912*a* is changed from the state of being completely laid with respect to the base 31 to the state of being erected, the compression displacement of the second right spring 851*a* may gradually decease and the magnitude of the restoration force FC may gradually decrease.

A force FT which the right rod 870*a* transfers to the second arm 912*a* may be a sum force of the force FA with which the motor assembly 810 moves the right slider 860*a* to a +x axis and the restoration force FB of the first right spring 841*a*, and the restoration force FC of the second right spring 851*a*.

When the second arm 912*a* starts to be erected while the second arm 912*a* is completely laid with respect to the base 31, the load of the motor assembly 810 may be the maximum. In this case, the magnitude of the restoration force FB provided by the first right spring 841*a* may be the maximum. Further, the magnitudes of the restoration forces FC provided by the second springs 851*a* and 851*b* may be the maximum.

When the second arm 912*a* is changed from the state of being completely laid with respect to the base 31 from the state of being erected, the restoration force provided by the second right spring 851*a* may assist the second arm 912*a* to be erected. The first right spring 841*a* and the second right spring 851*a* assist the second arm 912*a* to be erected to reduce the load of the motor assembly 810.

The first right spring 841*a* and the second right spring 851*a* may simultaneously provide the restoration force (the sum force of the restoration force FB and the restoration force FC) to the right slider 860*a*. The restoration force (the sum force of the restoration force FB and the restoration force FC) may be provided to the right slider 860*a* until a distance RD5 between the right slider 860*a* and the right projection 852*a* is equal to the length of the second right spring 851*a*.

When the distance RD5 between the right slider 860*a* and the right projection 852*a* is equal to the length of the second right spring 851*a*, the compression displacement of the second right spring 851*a* may become 0. When the compression displacement of the second right spring 851*a* becomes 0, the restoration force FC which the second right spring 851*a* provides to the right slider 860*a* may become 0.

When the distance RD5 between the right slider 860*a* and the right projection 852*a* becomes larger than the length of the second right spring 851*a*, only the first right spring 841*a* may provide the restoration force FB to the right slider 860*a*. The restoration force FB may be provided to the right slider 860*a* until a distance RD6 between the right slider 860*a* and the second right bearing 830*b* becomes equal to the length of the first right spring 841*a*.

When the distance RD6 between the right slider 860*a* and the second right bearing 830*b* becomes equal to the length of the first right spring 841*a*, the compression displacement of the first right spring 841*a* may become 0. When the compression displacement of the first right spring 841*a* becomes 0, the restoration force FB which the first right spring 841*a* provides to the right slider 860*a* may become 0.

When the distance RD6 between the right slider 860*a* and the second right bearing 830*b* becomes larger than the length of the first right spring 841*a*, the motor assembly 810 may not receive the restoration force from the first right spring 841*a* or the second right spring 851*a*, but erect the second arm 912*a*.

A structure formed by the first left spring 841*b*, the second left spring 851*b*, the left projection 852*b*, the left slider 860*b*, the left guides 850*c* and 850*d*, the left lead screw 840*b*, the left rod 870*b*, and the second arm 912*a* may be symmetric to a structure formed by the first right spring 841*a*, the second right spring 851*a*, the right projection 852*a*, the right slider 860*a*, the right guides 850*a* and 850*b*, the right lead screw 840*a*, the right rod 870*a*, and the second arm 912*a*. In this case, the symmetric axis may be the symmetric axis ys of the motor assembly 810.

Figure 53:
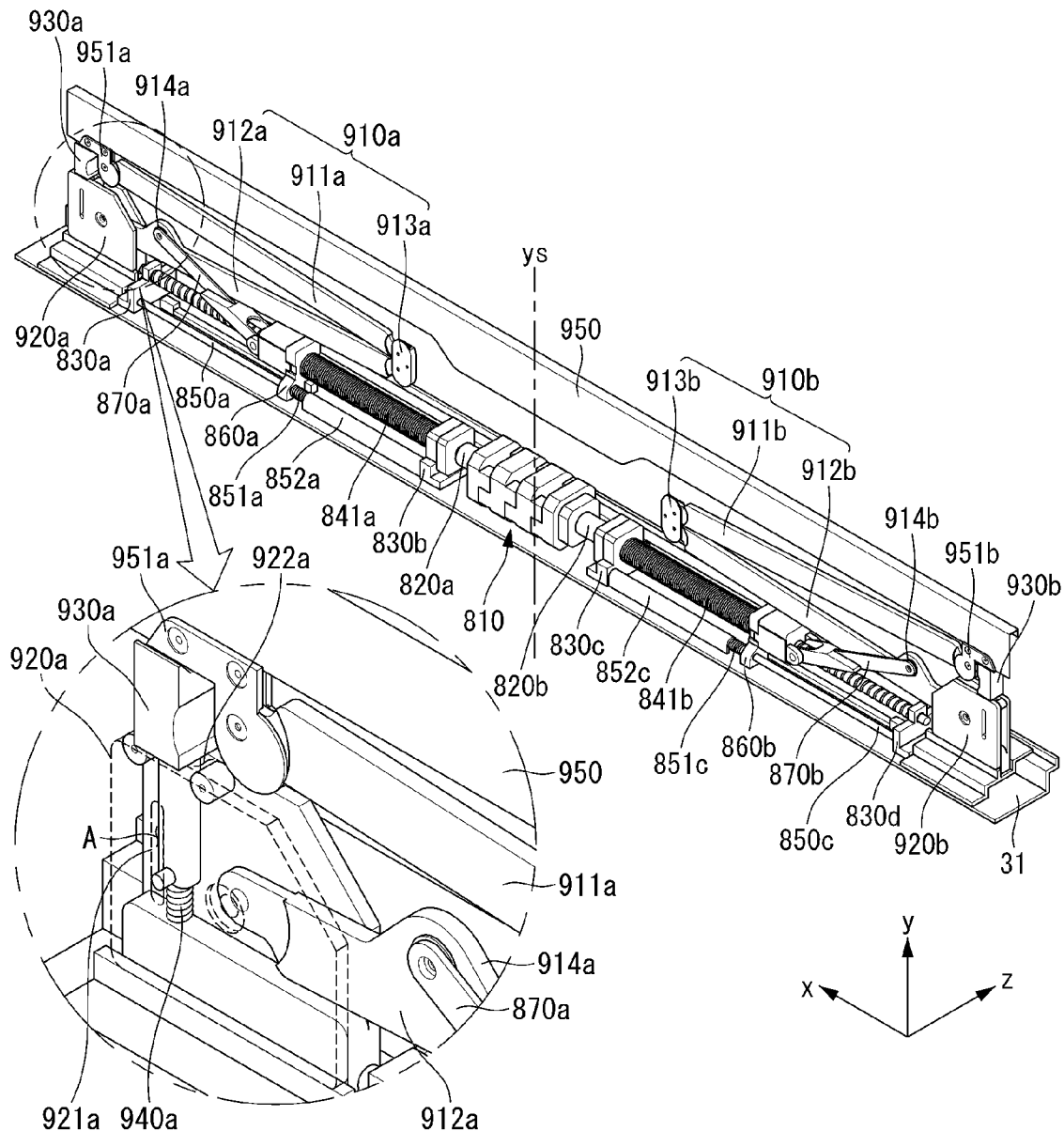

Referring to FIG. 53, the pushers 930*a* and 930*b* may be connected to the link mounts 920*a* and 920*b*. The pushers 930*a* and 930*b* may include a right pusher 930*a* disposed at the right side of the motor assembly 810 and a left pusher 930*b* disposed at the left side of the motor assembly 810.

The link mounts 920*a* and 920*b* may form an accommodation space A. The accommodation space A may accommodate the springs 940*a* and 940*b* and the pushers 930*a* and 930*b*. The springs 940*a* and 940*b* may include a right projection 940*a* disposed at the right side of the motor assembly 810 and a left projection 940*b* disposed at the left side of the motor assembly 810. The accommodation space A may also be referred to as an internal space A.

The link mounts 920*a* and 920*b* may include a first hole 922*a* connecting the accommodation space A and an external space (a first hole corresponding to reference numeral 920*b* is not illustrated). The first hole 922*a* may be connected to the upper surfaces of the link mounts 920*a* and 920*b*. The first hole 922*a* may also be referred to as a hole 922*a*.

The pushers 930*a* and 930*b* may be positioned vertically to the base 31. Alternatively, the pushers 930*a* and 930*b* may be disposed in parallel to a y axis. The springs 940*a* and 940*b* may be positioned vertically to the base 31. Alternatively, the springs 940*a* and 940*b* may be disposed in parallel to the y axis.

The pushers 930*a* and 930*b* may include first parts 931*a* and 931*b* and second parts 932*a* and 932*b*. The second parts 932*a* and 932*b* may be connected to the lower sides of the first parts 931*a* and 931*b*. The bottoms of the second part 932*a* and 932*b* may be connected to the springs 940*a* and 940*b*. The entirety or a part of the second parts 932*a* and 932*b* may be accommodated in an accommodation space A formed by the link mounts 920*a* and 920*b*. The second parts 932*a* and 932*b* may have a diameter which is equal to the diameter of the first hole 922*a* or smaller than the diameter of the first hole 922*a*. The second parts 932*a* and 932*b* may penetrate the first hole 922*a*.

The first parts 931*a* and 931*b* may be positioned outside the link mounts 920*a* and 920*b*. Alternatively, the first parts 931*a* and 931*b* may be positioned outside the accommodation space A of the link mounts 920*a* and 920*b*. The first parts 931*a* and 931*b* may have a diameter larger than the diameter of the first hole 922*a*.

The first parts 931*a* and 931*b* may be contacted with or separated from the link brackets 951*a* and 951*b*. For example, when the second arms 912*a* and 912*b* are completely laid with respect to the base 31, the first parts 931*a* and 931*b* may be contacted with the link brackets 951*a* and 951*b*. Alternatively, when the second arms 912*a* and 912*b* are completely erected with respect to the base 31, the first parts 931*a* and 931*b* may be separated from the link brackets 951*a* and 951*b*.

When the first parts 931*a* and 931*b* are contacted with the link brackets 951*a* and 951*b*, the pushers 930*a* and 930*b* may receive a force received from the link brackets 951*a* and 951*b*. The force received by the pushers 930*a* and 930*b* may be a lower direction. Alternatively, the force received by the pushers 930*a* and 930*b* may be a −y-axis direction. Alternatively, the link brackets 951*a* and 951*b* may pressurize the pushers 930*a* and 930*b*. A direction in which the link bracket 951*a*, 951*b* pressurize the pusher 930*a*, 930*b* may be the lower direction. Alternatively, the direction in which the link bracket 951*a*, 951*b* pressurize the pusher 930*a*, 930*b* may be a −y-axis direction.

When the first part 931*a*, 931*b* receives the force, the spring 940*a*, 940*b* may be compressed. The compressed spring 940*a*, 940*b* may provide the restoration force to the pusher 930*a*, 930*b*. The restoration force may be applied in a direction opposite to a direction of the force applied to the first part 931*a*, 931*b*. Alternatively, the restoration force may be applied in the +y direction.

The link mount 920*a*, 920*b* may include a second hole 921*a* (a second hole corresponding to reference numeral 920*b* is not illustrated). The second hole 921*a* may connect the accommodation space A and the external space. The entirety or a part of the spring 940*a*, 940*b* may be exposed to the outside through the second hole 921*a*. The entirety or a part of the pusher 930*a*, 930*b* may be exposed to the outside through the second hole 921*a*. Upon maintaining or repairing the display device, a service provider may check an operation state of the pusher 930*a*, 930*b* through the second hole 921a. The second hole 921a may provide maintenance or repairing convenience to the service provider.

Figure 54:
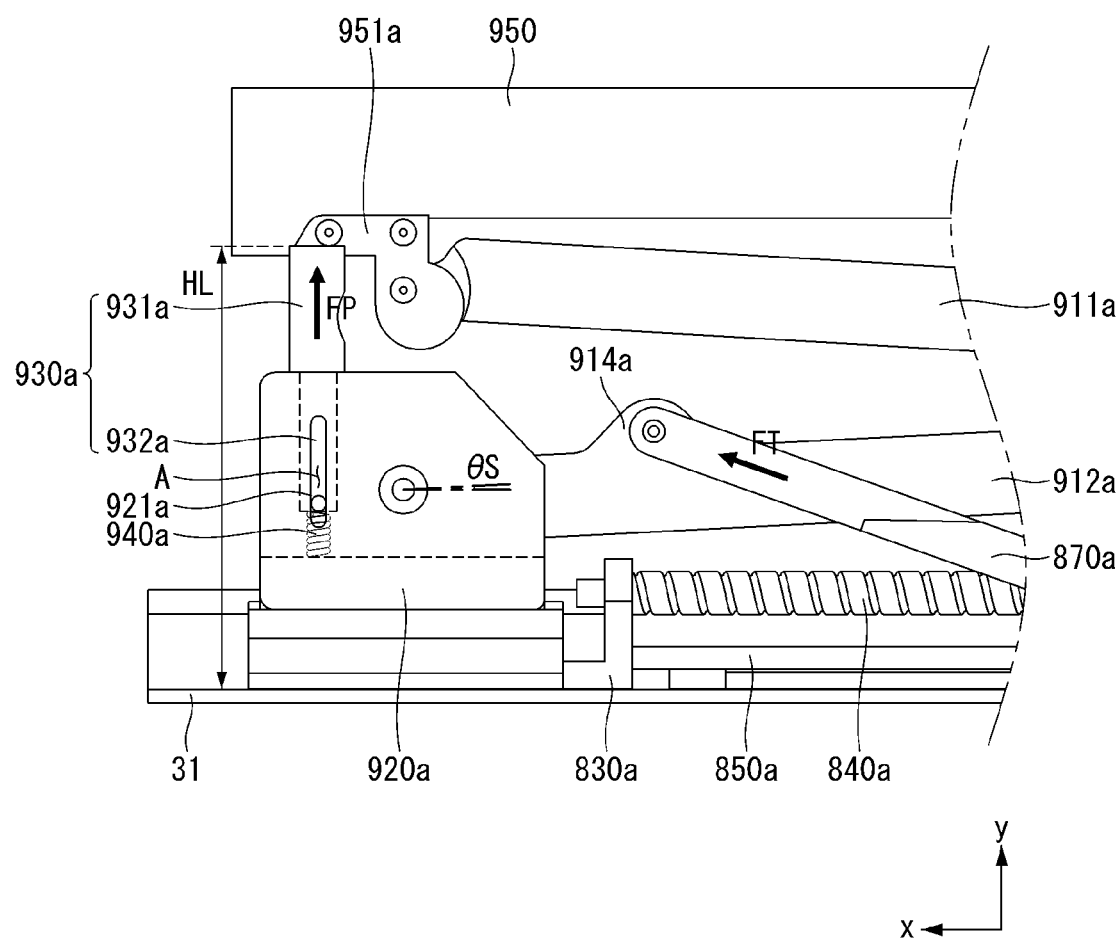
Figure 55:
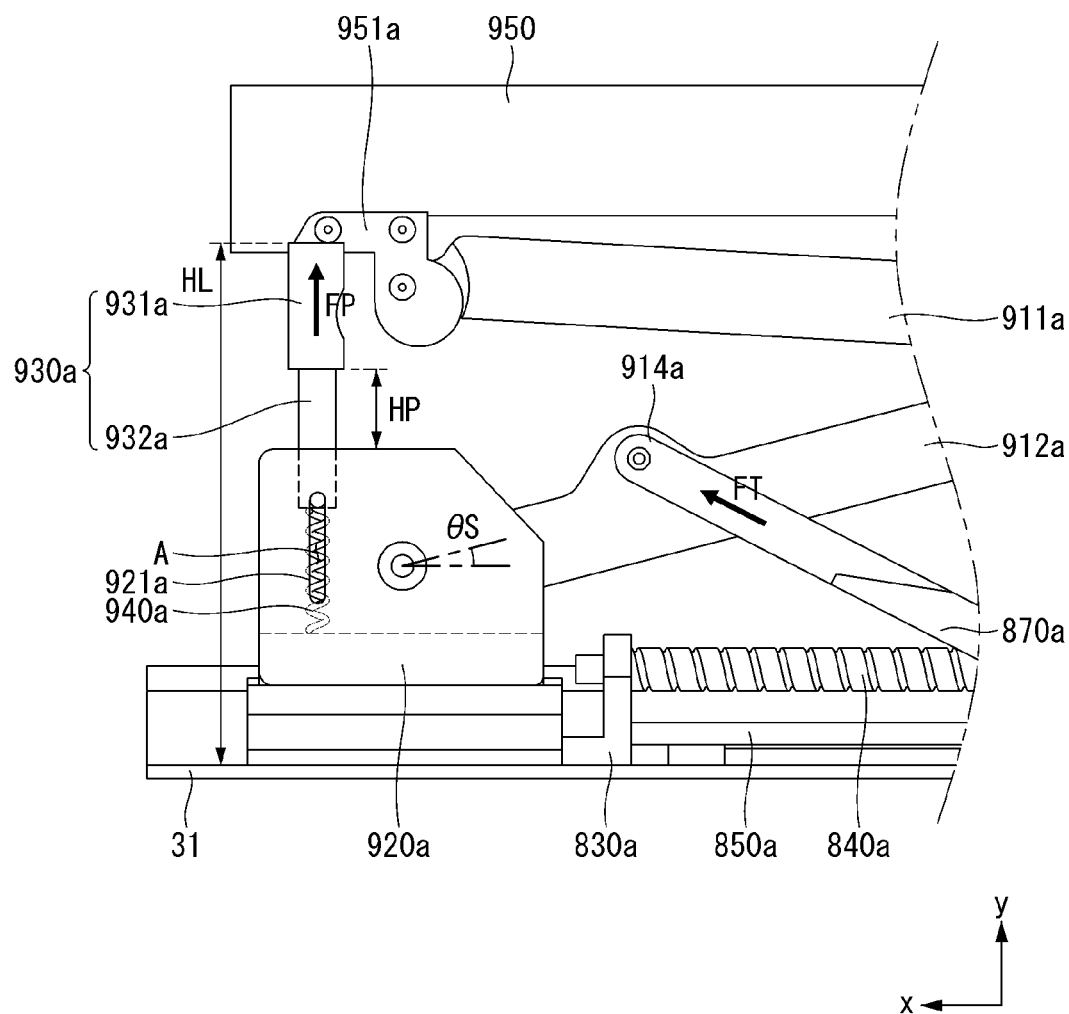
Figure 56:
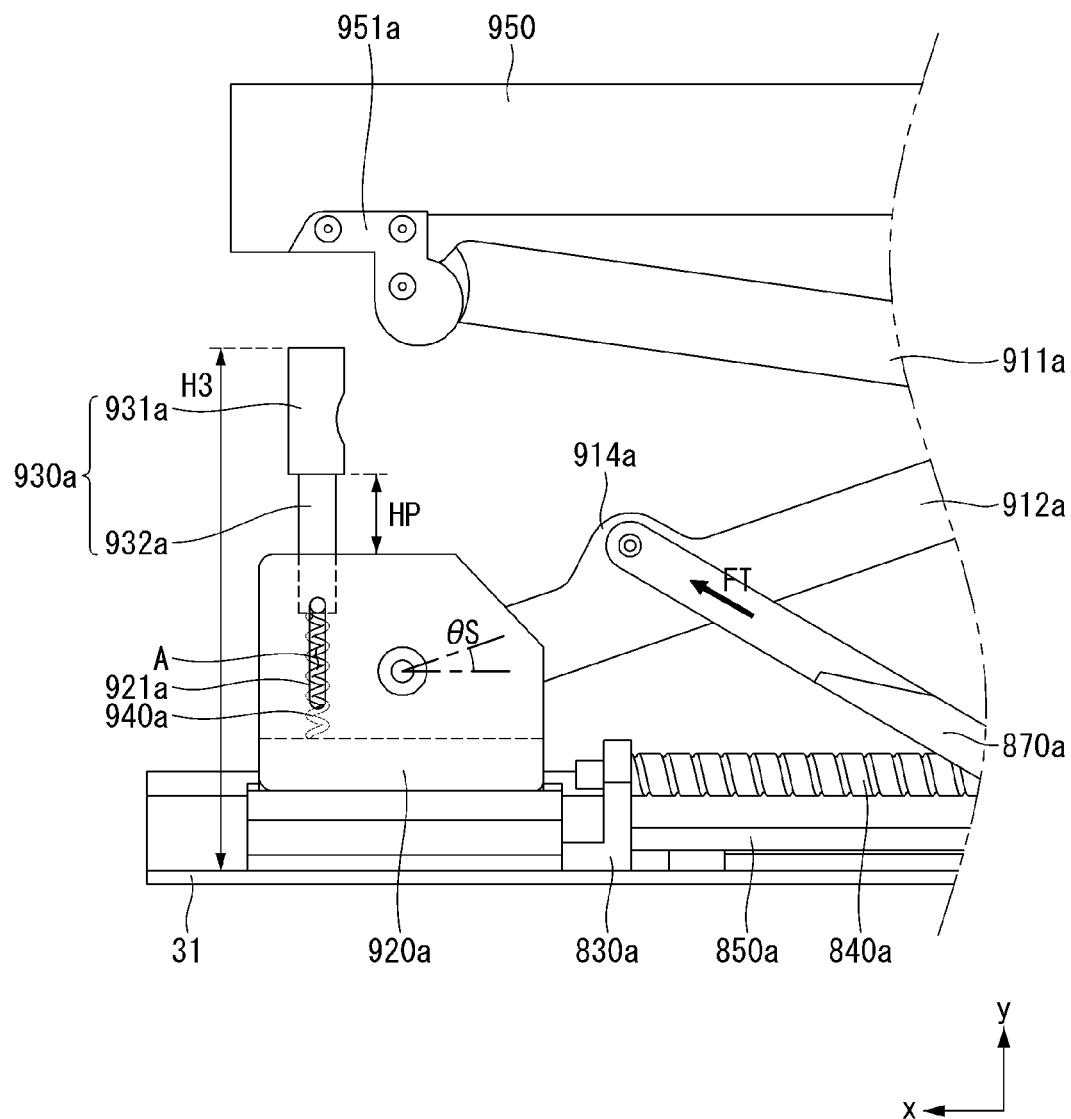

Referring to FIGS. 54 to 56, the right link 910a receives the restoration force from the right pusher 930a to be erected. The right link 910a will be described as a reference.

An angle formed by the second arm 912a and the base 31 may be referred to as an angle theta S. A force which the right rod 870a transfers to the second arm 912a may be referred to as FT. A force which the right pusher 930a transfers to the right link bracket 951a may be referred to as FP.

Referring to FIG. 54, when the second arm 912a is completely laid with respect to the base 31, the angle theta S may have the minimum value. The right spring 940a connected to the right pusher 930a may be maximally compressed, and the magnitude of the restoration force FP may have the maximum value. The compressed right spring 940a may provide the restoration force FP to the right pusher 930a. The right pusher 930a may transfer the restoration force FP to the right link bracket 951a. The restoration force FP may be applied in the +y direction.

When the second arm 912a is completely laid with respect to the base 31, a distance HL from the base 31 up to the upper end of the right pusher 930a may have the minimum value. The first part 931a of the right pusher 930a may protrude to the outside of the right link mount 920a and the entirety of the second part 932a of the right pusher 930a may be accommodated in an accommodation space 923a of the right link mount 920a.

Referring to FIG. 55, when the second arm 912a is changed from the state of being completely laid with respect to the base 31 to the state of being erected, the angle theta S may gradually increase. The compression displacement of the right spring 940a may gradually decrease and the magnitude of the restoration force FP may gradually decrease.

As the angle theta S gradually increases, at least a part of the second part 932a of the right pusher 930a may protrude to the outside of the right link mount 920a. A length of the second part 932a of the right pusher 930a, which protrudes to the outside of the right link mount 920a may be referred to as a length HP. A distance HL from the base 31 to the upper end of the right pusher 930a may increase by HP as compared with the case where the second arm 912a is completely laid with respect to the base 31.

Referring to FIG. 56, when the second arm 912 is erected with respect to the base 31, the right pusher 930a and the right link bracket 951a may be separated from each other. The compression displacement of the right spring 940a may become 0. When the compression displacement of the first right spring 940a becomes 0, the restoration force FB which the first right spring 930a provides to the right slider 951a may become 0.

The length HP of the second part 932a of the right pusher 930a, which protrudes to the outside of the right link mount 920a may have the maximum value. In addition, the distance HL from the base 31 up to the upper end of the right pusher 930a may have the maximum value.

That is, while the right pusher 930a and the right link bracket 951a are in contact with each other, the right pusher 930a applies the restoration force to the right link bracket 951a to assist the second arm 912a to be erected and reduce the load of the motor assembly 810.

The lead screws 840a and 840b may be driven by one motor assembly 810. The lead screws 840a and 840b are driven by one motor assembly 810, and as a result, the second arms 912a and 912b may be erected while being symmetric to each other. However, when the lead screws 840a and 840b are driven by one motor assembly 810, the load applied to the motor assembly 810 may be excessively increased in order to erect the second arms 912a and 912b. In this case, the right pusher 930a applies the restoration force to the right link bracket 951a to assist the second arm 912a to be erected and reduce the load of the motor assembly 810.

Alternatively, when the second arm 912a is changed from the state of being erected with respect to the base 31 to the state of being completely laid, the restoration force provided to the right link bracket 951a by the right pusher 930a may relieve an impact generated when the link 910a is laid with respect to the base 31. That is, the restoration force provided to the right link bracket 951a by the right pusher 930a may serve as the damper when the link 910a is laid with respect to the base 31. The right pusher 930a serves as the damper to reduce the load of the motor assembly 810.

A structure formed by the left pusher 930b, the left spring 940b, the left link bracket 951b, the left link mount 920b, and the left rod 870b may be symmetric to a structure formed by the right pusher 930a, the right spring 940a, the right link bracket 951a, the right link mount 910a, and the left rod 870a. In this case, the symmetric axis may be the symmetric axis of the motor assembly 810.

Figure 57:
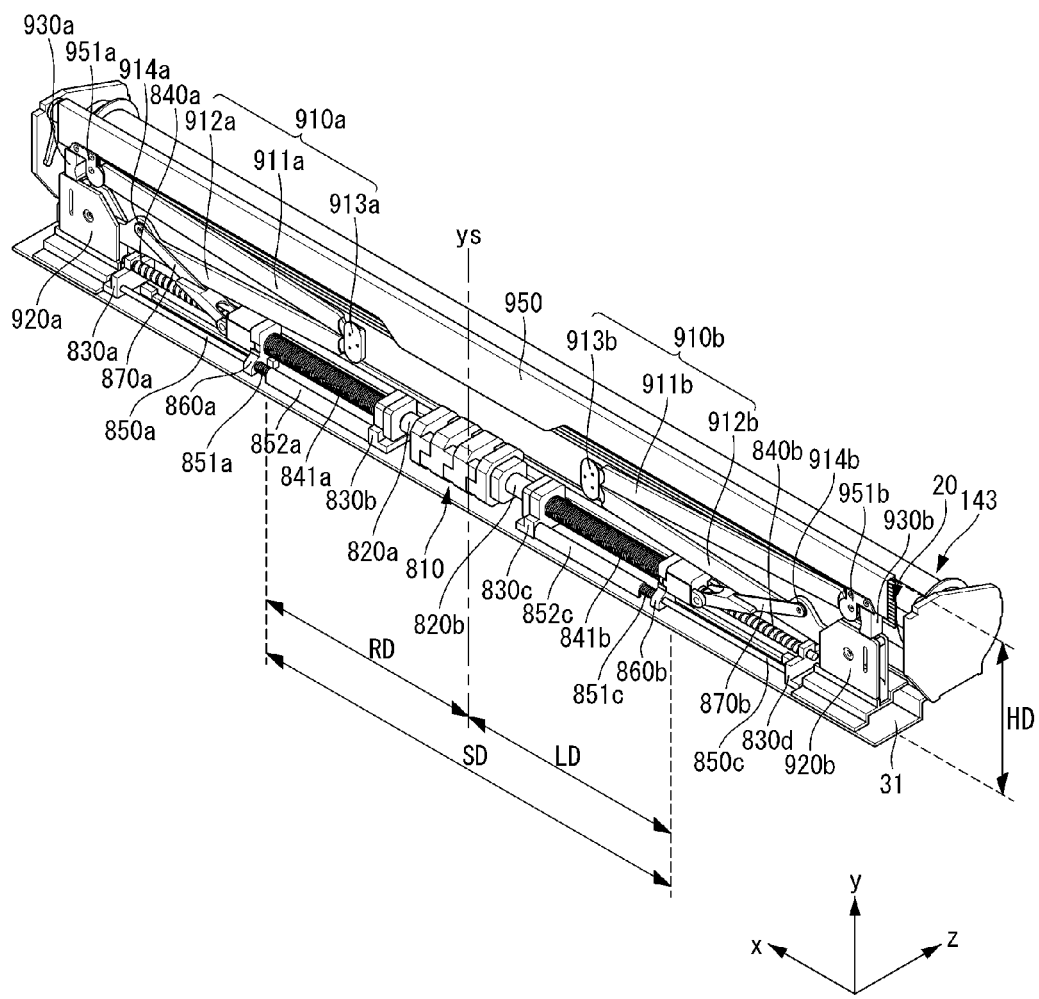
Figure 58:
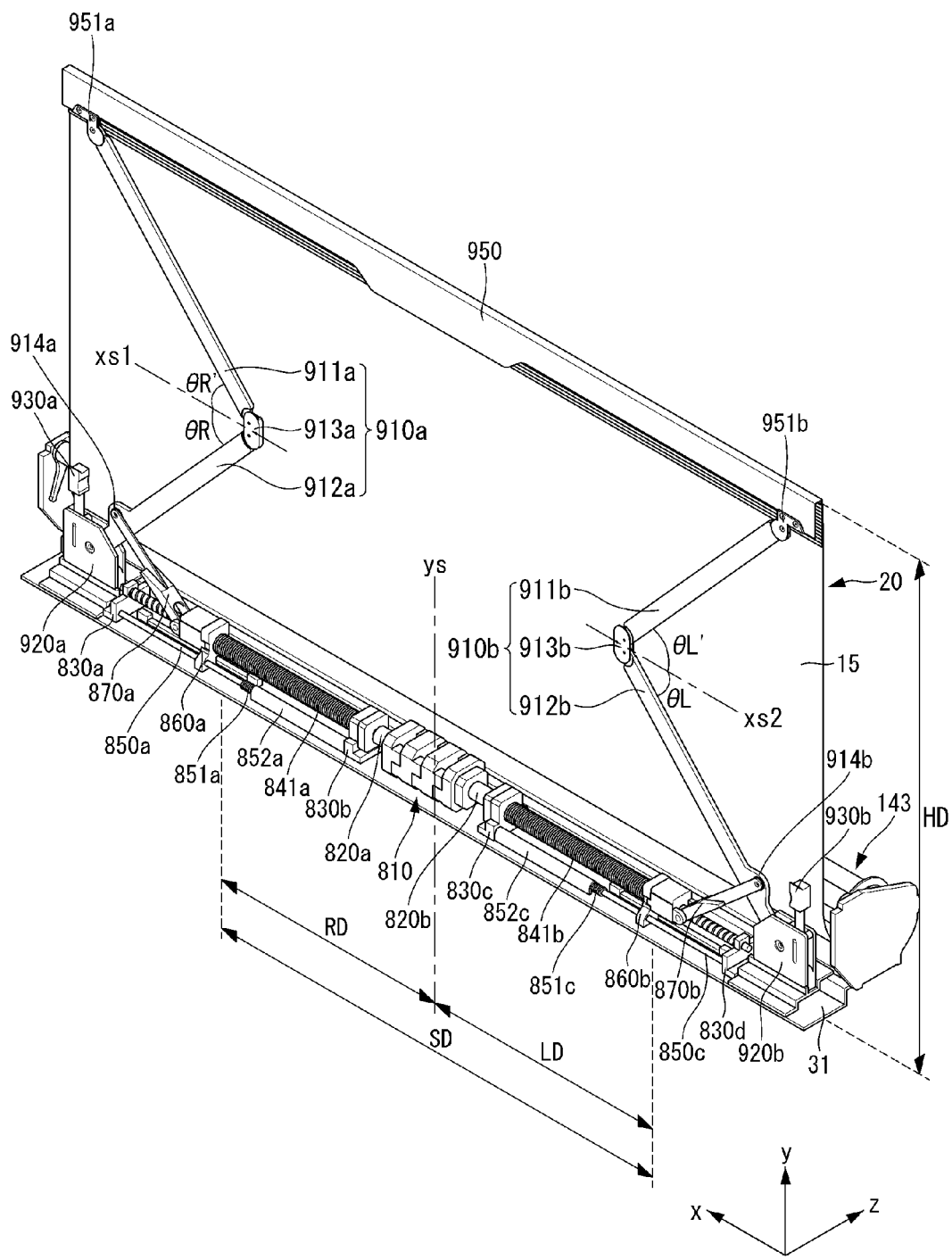
Figure 59:
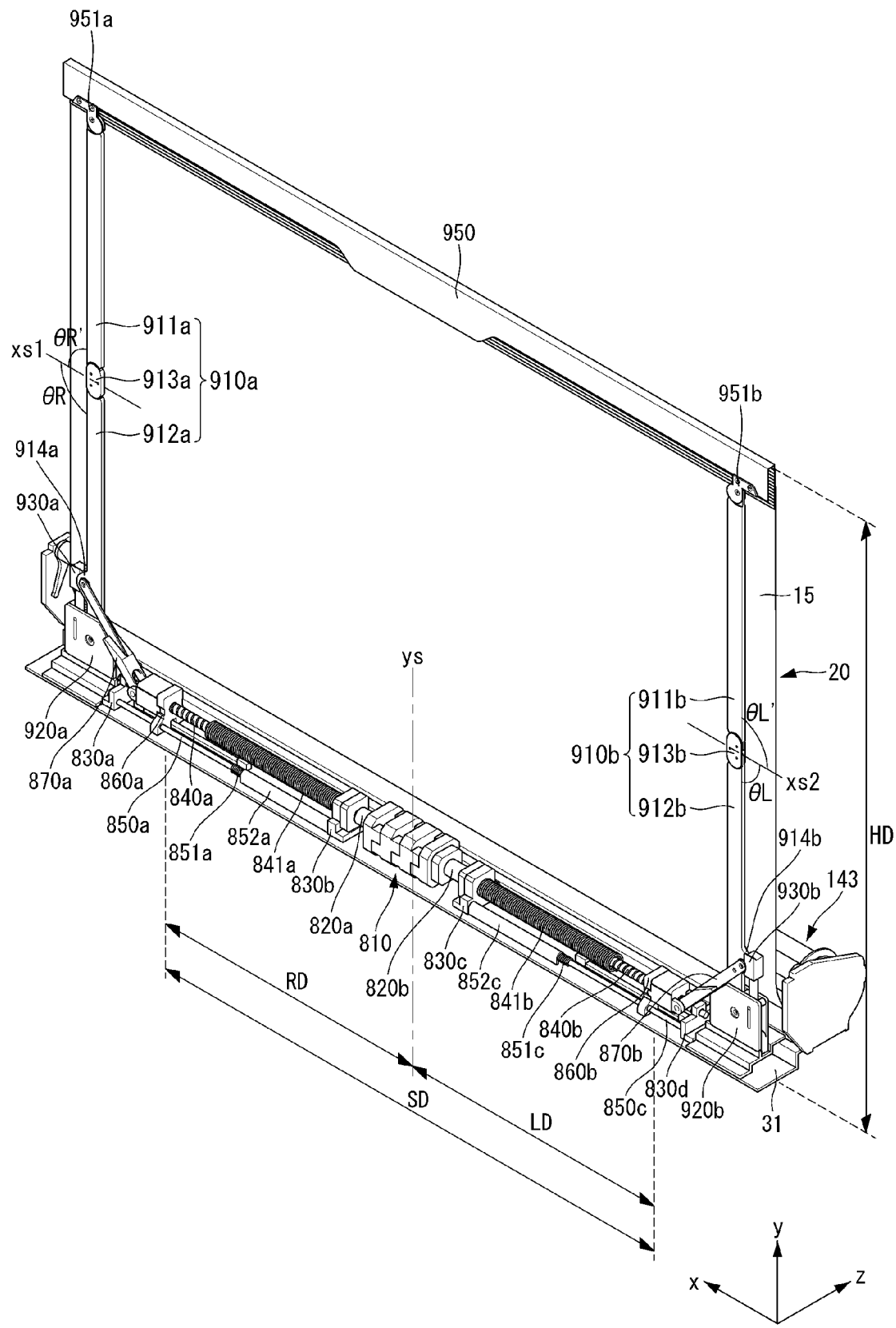

Referring to FIGS. 57 to 59, the panel roller 143 may be installed in the base 31. The panel roller 143 may be installed in front of the lead screws 840a and 840b. Alternatively, the panel roller 143 may be disposed in line with the longitudinal directions of the lead screws 840a and 840b. Alternatively, the panel roller 143 may be spaced apart from the lead screws 840a and 840b.

The display unit 20 may include the display panel 10 and the module cover 15. The bottom of the display unit 20 may be connected to the panel roller 143 and the top of the display unit 20 may be connected to the upper bar 75. The display unit 20 may be rolled on or unrolled from the panel roller 143.

A distance from the symmetric axis ys of the motor assembly 810 up to the right slider 860a may be referred to as a distance RD. A distance from the symmetric axis ys of the motor assembly 810 up to the left slider 860a may be referred to as a distance LD. A distance between the right slider 860a and the left slider 860b may be referred to as a distance SD. The distance SD may be a sum of the distance RD and the distance LD. A distance from the base 31 up to the upper end of the display unit 20 may be referred to as a distance HD.

Referring to FIG. 57, when the second arms 912a and 912b are completely laid with respect to the base 31, the distance SD between the right slider 860a and the left slider 860b may have the minimum value. The distance RD from the symmetric axis ys of the motor assembly 810 up to the right slider 860a and the distance LD from the symmetric axis ys of the motor assembly 810 up to the left slider 860a may be equal to each other.

When the second arms 912a and 912b are completely laid with respect to the base 31, a distance HD from the base 31 up to the upper end of the display unit 20 may have the minimum value.

When the second arms 912a and 912b are completely laid with respect to the base 31, the first springs 841a and 841b may be contacted with the sliders 860a and 860b. Further, the second springs 851a and 851b may be contacted with the sliders 860a and 860b. Further, the pushers 930a and 930b may be contacted with the link brackets 951a and 951b.

When the second arms 912a and 912b are completely laid with respect to the base 31, compression amounts of the first springs 841a and 841b may have the maximum values, and the magnitudes of the restoration forces which the first springs 841a and 841b provide to the sliders 860a and 860b may have the maximum values.

When the second arms 912a and 912b are completely laid with respect to the base 31, compression amounts of the second springs 851a and 851b may have the maximum values, and the magnitudes of the restoration forces which the second springs 851a and 851b provide to the sliders 860a and 860b may have the maximum values.

When the second arms 912a and 912b are completely laid with respect to the base 31, compression amounts of the springs 940a and 940b may have the maximum values, and the magnitudes of the restoration forces which the springs 940a and 940b provide to the pushers 930a and 930b may have the maximum values.

When the second arms 912a and 912b start to be erected with respect to the base 31, the second arms 912a and 912b receive the restoration forces from the first springs 841a and 841b, the second springs 851a and 851b, and the springs 940a and 940b to be erected. As a result, the load applied to the motor assembly 810 may be reduced.

Referring to FIG. 58, as the second arms 912a and 912b are erected with respect to the base 31, the distance SD between the right slider 860a and the left slider 860b may gradually increase. Even though the distance SD increases, the distance LD and the distance RD may be equal to each other. That is, the right slider 860a and the left slider 860b may be positioned symmetric to each other based on the symmetric axis ys of the motor assembly 810. Further, a degree at which the second arms 912a and 912b of the right link 910a are erected with respect to the base 31 and a degree at which the second arms 912a and 912b of the left link 910b are erected with respect to the base 31 may be equal to each other.

As the second arms 912a and 912b are erected with respect to the base 31, the distance HD from the base 31 up to the upper end of the display unit 20 may gradually increase. The display unit 20 may be unrolled from the panel roller 143. Alternatively, the display unit 20 may be unfolded from the panel roller 143.

When the second arms 912a and 912b are sufficiently erected with respect to the base 31, the first springs 841a and 841b may be separated from the sliders 860a and 860b. Further, when the second arms 912a and 912b are sufficiently erected with respect to the base 31, the second springs 851a and 851b may be separated from the sliders 860a and 860b. Further, when the second arms 912a and 912b are sufficiently erected with respect to the base 31, the pushers 930a and 930b may be separated from the link brackets 951a and 951b.

The first springs 841a and 841b being separated from the sliders 860a and 860b, the second springs 851a and 851b being separated from the sliders 860a and 860b, and the pushers 930a and 930b being separated from the link brackets 951a and 951b may be performed independently from each other. That is, orders of the first springs 841a and 841b being separated from the sliders 860a and 860b, the second springs 851a and 851b being separated from the sliders 860a and 860b, and the pushers 930a and 930b being separated from the link brackets 951a and 951b may be mutually variable.

An angle formed by an axis xs1 parallel to the base 31 and the second arm 912a may be referred to as theta R. In addition, an angle formed by the axis xs1 parallel to the base 31 and the first arm 911a may be referred to as theta R'. The axis xs1 and the x axis may be in line with each other.

When the second arm 912a is completely laid with respect to the base 31, while the second arm 912a is erected with respect to the base 31, or when the erection of the second arm 912a with respect to the base 31 is completed, theta R and theta R' may be maintained to be equal to each other.

An angle formed by an axis xs1 parallel to the base 31 and the second arm 912b may be referred to as theta L. In addition, an angle formed by the axis xs2 parallel to the base 31 and the first arm 911B may be referred to as theta L'. The axis xs2 and the x axis may be in line with each other.

When the second arm 912b is completely laid with respect to the base 31, while the second arm 912b is erected with respect to the base 31, or when the erection of the second arm 912b with respect to the base 31 is completed, theta L and theta L' may be maintained to be equal to each other.

The axis xs1 and the axis xs2 may be axes equal to each other.

Referring to FIG. 59, when the second arms 912a and 912b are completely erected with respect to the base 31, the distance SD between the right slider 860a and the left slider 860b may have the maximum value. Even when the distance SD is the maximum, the distance LD and the distance RD may be equal to each other.

When the second arms 912a and 912b are completely erected with respect to the base 31, the distance HD from the base 31 up to the base 31 up to the upper end of the display unit 20 may have the maximum value.

Figure 60:
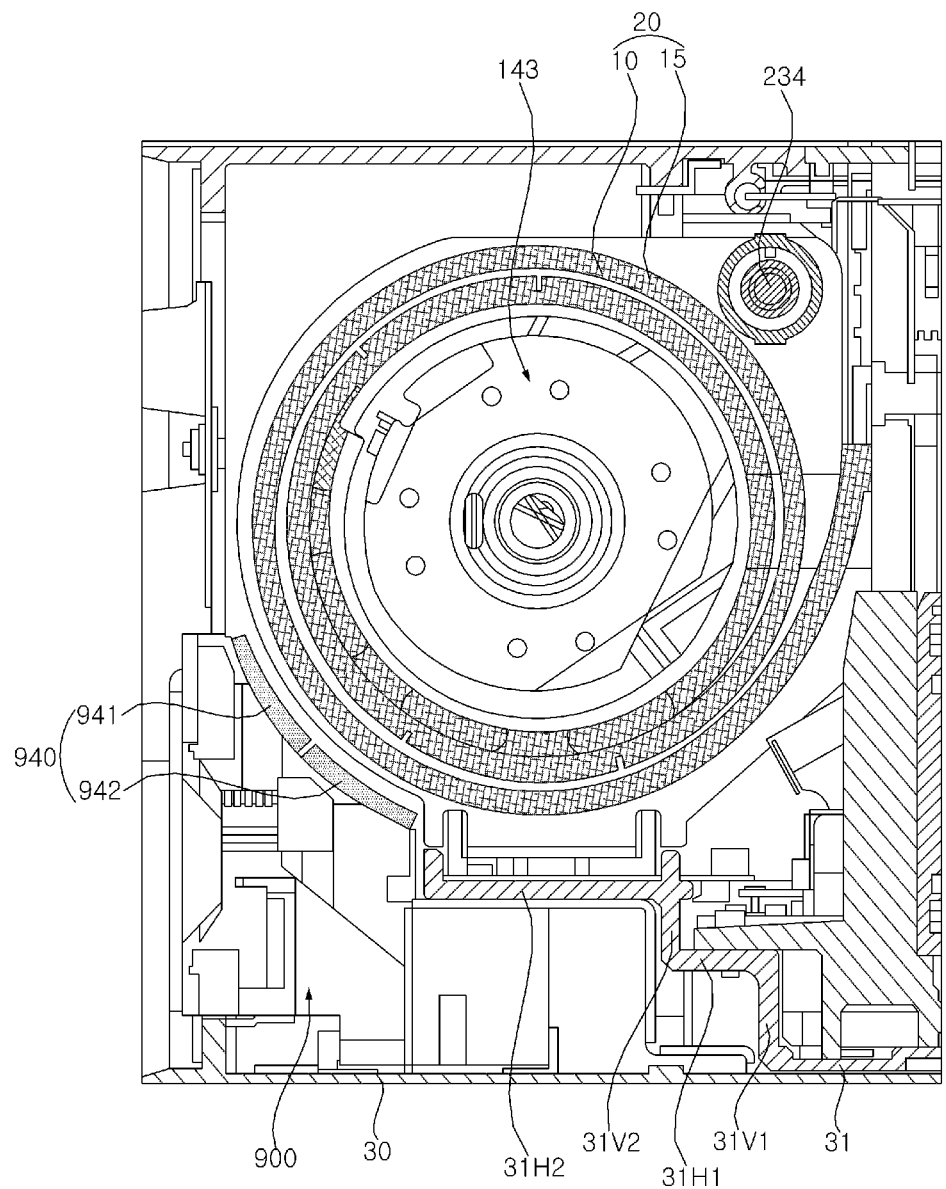

Referring to FIG. 60, the panel roller 143 may be rotatably installed inside the housing 30. The module cover 15 and the display panel 10 may be rolled on the panel roller 143 inside the housing 30. The module cover 15 and the display panel 10 rolled on the panel roller 143 may be unrolled or sagged from the panel roller 143 due to vibration or an external impact. A portion stretched while the module cover 15 or unrolled or sagged may be impacted with structures installed below the panel roller 143.

The base 31 may include a first vertical portion 31V1, a first horizontal portion 31H1, a second vertical portion 31V2, and a second horizontal portion 31H2. The first vertical portion 31V1, the first horizontal portion 31H1, the second vertical portion 31V2, and the second horizontal portion 31H2 may form a step shape on the whole while forming a step. The second horizontal portion 31H2 may be positioned vertically below the panel roller 143.

A speaker assembly 900 may be installed at a front lower side of the panel roller 143. The speaker assembly 900 may be positioned in front of the second horizontal portion 31H2. Sounds provided from sound units 901 and 902 (see FIG. 61) of the speaker assembly 900 may be provided to the front of the housing 30.

Figure 61:
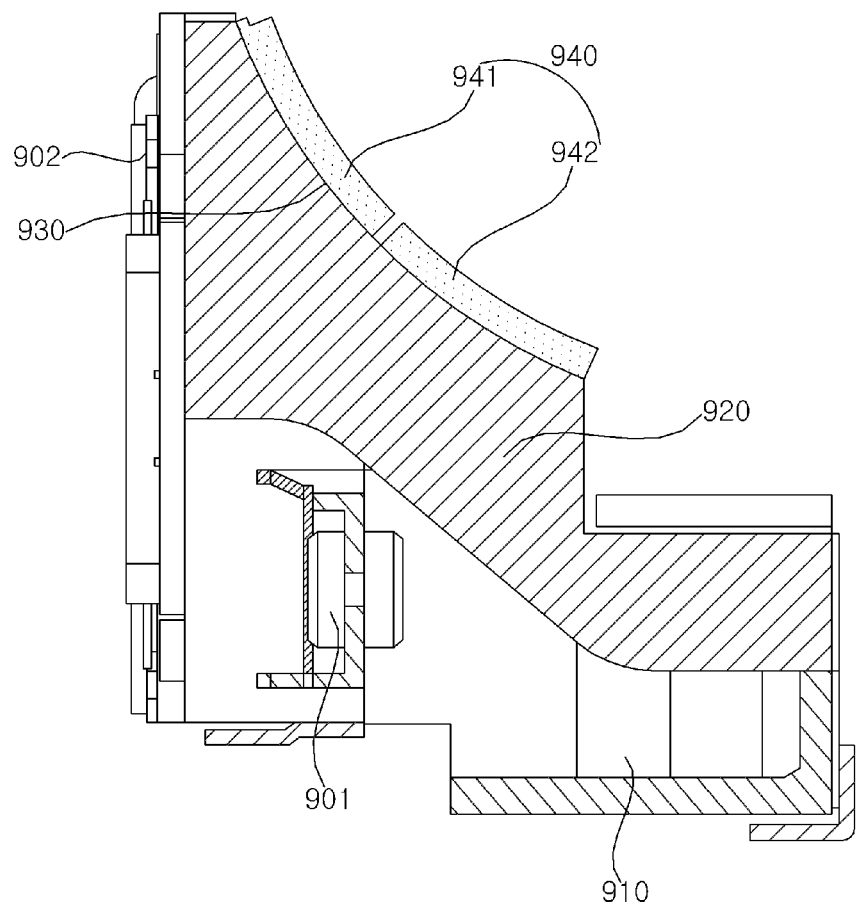

Referring to FIGS. 60 and 61, the speaker assembly 900 may include a first case 910 and a second case 920. The first case 910 may form a lower portion of the speaker assembly 900 and the second case 920 may form an upper portion of the speaker assembly 900. The first case 910 is partitioned from the second case 920, but may be integrally formed. A first speaker unit 901 may be mounted on a front surface of the first case 910 and a second speaker unit 902 may be mounted on the front surface of the second case 920. For example, the first speaker unit 901 may be a woofer and the second speaker unit 902 may be a tweeter.

The second case 920 may include a curved surface 930. The curved surface 930 of the second case 920 may have a curvature corresponding to a curvature of the panel roller 143 (see FIG. 60). The curved surface 930 of the second case 920 may be spaced apart from the panel roller 143 by a predetermined interval. The curved surface 930 may be positioned at an upper rear side of the second case 920.

A buffer member 940 may be fixed to the curved surface 930 of the second case 920. The buffer member 940 may include a plurality of sub buffer members 940. The first sub buffer member 941 may be positioned adjacent to the second sub buffer member 942. For example, the buffer member 940 may be a sponge or a reinforced sponge. As another example, the buffer member 940 may be rubber. The first sub buffer member 941 may be attached to the upper portion of the curved surface 930 and the second sub buffer member 942 may be attached to the lower portion of the curved surface 930. As a result, durability of a state in which the buffer members 940 are bonded to the curved surface may be enhanced by the curvature of the curved surface 930.

As a result, even though the module cover 15 rolled on the panel roller 143 is unrolled or sagged from the panel roller 143 due to the vibration or the external impact, an impact which the cases 920 and 930 of the speaker 900 apply may be prevented.

Figure 62:
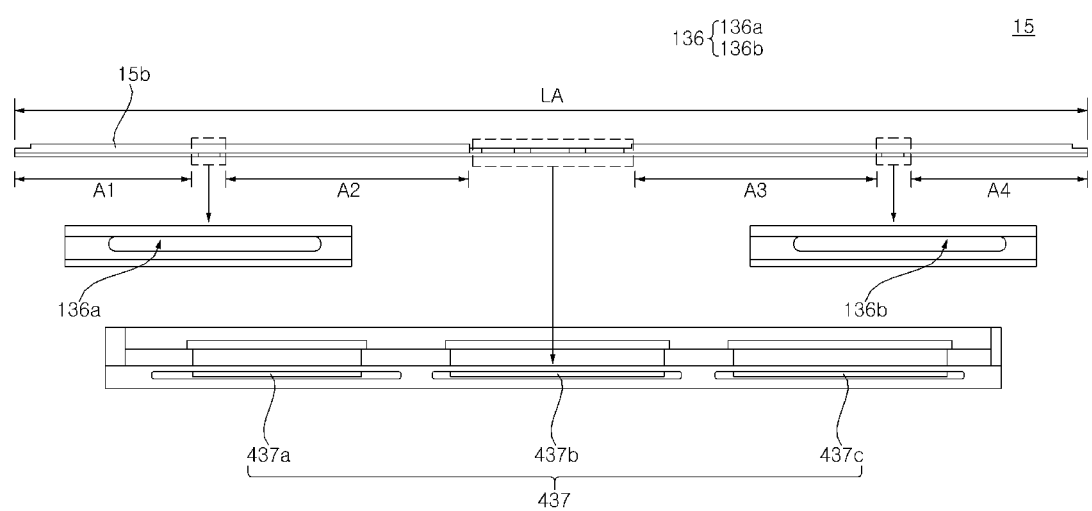

Referring to FIG. 62, a segment 15b of the module cover 15 may be a plate or bar which elongates. For example, the segment 15b may be extruded metal. The segment 15b may include a bead 136 vertically penetrating the segment 15b in a width direction crossing the longitudinal direction. A first bead 136a may be positioned at a left center of the segment 15b. A second bead 136b may be positioned at a right center of the segment 15b.

There may be a plurality of penetration portions 437, and the plurality of penetration portions 437 may be formed at a central area of the segment 15b. A second penetration portion 437b may be positioned at a center of the segment 15b, a first penetration portion 437a may be positioned at a left side of the segment 15b adjacent to the second penetration portion 437b, and a third penetration portion 437c may be positioned at a right side of the segment 15b adjacent to the second penetration portion 437b.

An area between a left end of the segment 15b and the first bead 136a may be defined as a first area A1, an area between the first bead 136a and the first penetration portion 437a may be defined as a second area A2, an area between the third penetration portion 437c and the second bead 136b may be defined as a third area A3, and an area between the second bead 136b and a right end of the segment 15b may be defined as a fourth area A4. The first area A1, the second area A2, the third area A3, and the fourth area A4 of the segment 15b may be portions where the segment 15b is not hollowed.

Figure 63:
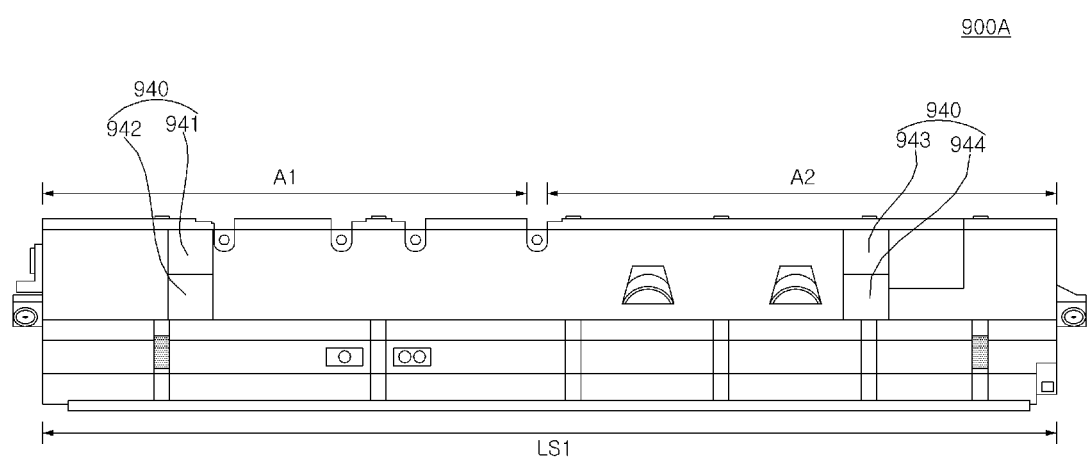
Figure 64:
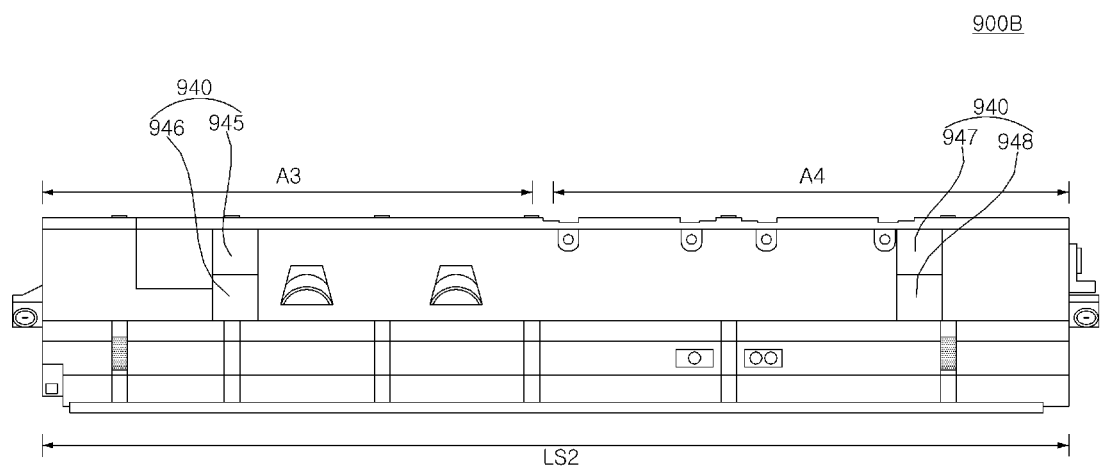

Referring to FIGS. 62, 63, and 64, the speaker assembly 900 may include a first speaker assembly 900A and a second speaker assembly 900B, and may be disposed in series in the longitudinal direction of the segment 15b. A length La of the segment 15b may be larger than a sum of a length Ls1 of the first speaker assembly 900A and a length Ls2 of the second speaker assembly 900B. First buffer members 941 and 942 may be positioned in the first area A1, second buffer members 943 and 944 may be positioned in the second area A2, third buffer members 945 and 946 may be positioned in the third area A3, and fourth buffer members 947 and 948 may be positioned in the fourth area A4.

As a result, even though the curved surface 930 of the speaker assembly 900 impacts an outer surface of the module cover 15b, a damage of the module cover 15 may be prevented and deformation of the segment 15b may be prevented.

Figure 65:
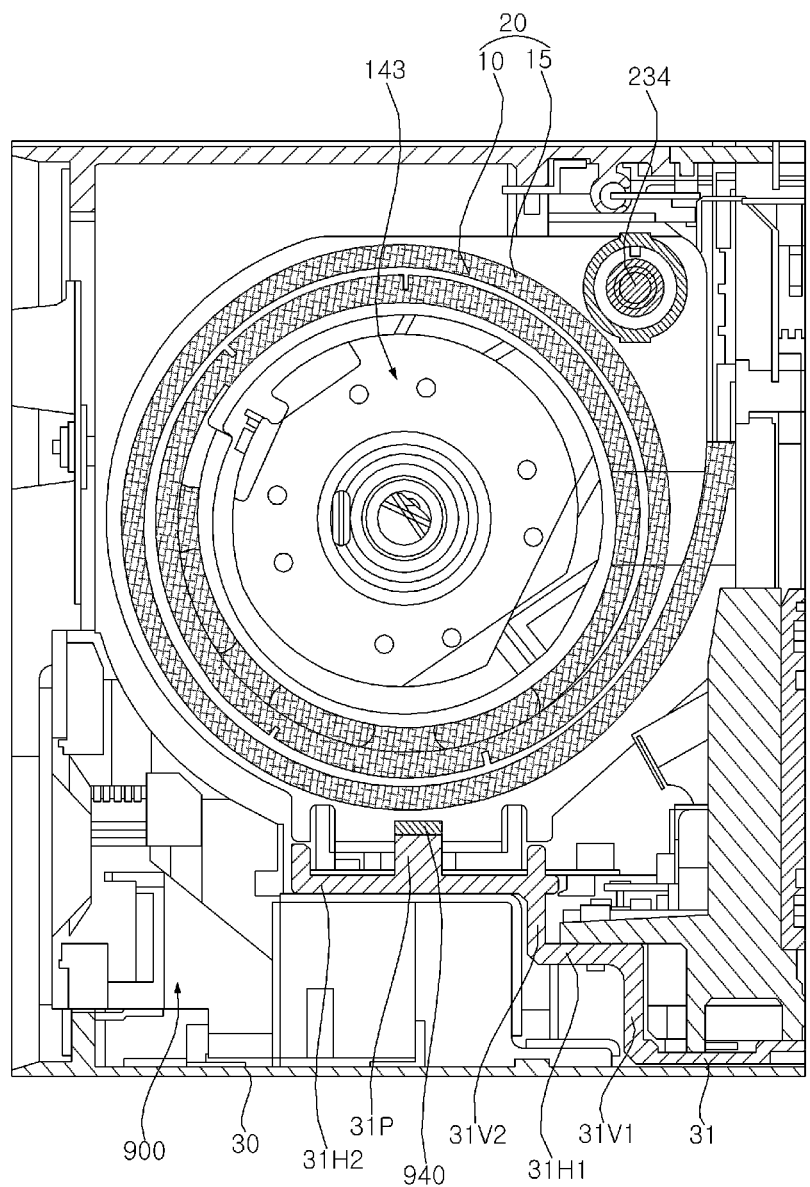

Referring to FIG. 65, a bumper 31P may be mounted on the base 31 between the panel roller 143 and the base 31.

The bumper 31P may be positioned contiguous to a bottom circumferential surface of the panel roller 143. The bumper 31P may protrude toward the panel roller 143 from the second horizontal portion 31H2 of the base 31. The buffer member 940 may be fixed onto the bumper 31P. The buffer member 940 may be fixed to the upper end of the bumper 31P. For example, the bumper 31P may be metal and the buffer member 940 may be the rubber, the sponge, or the reinforced sponge.

As a result, even though the curved surface 930 of the speaker assembly 900 impacts an outer surface of the module cover 15b, a damage of the module cover 15 may be prevented and deformation of the segment 15b may be prevented.

Certain embodiments or other embodiments of the present disclosure described above are not mutually exclusive or distinct from each other. Any or all elements of the embodiments of the present disclosure described above may be combined or combined with each other in configuration or function.

For example, the case means that a configuration A described in a specific embodiment and/or figure and a configuration B described in another embodiment and/or figure are may be combined with each other. Namely, although the combination between the components is not directly described, the combination is possible except in the case where it is described that the combination is impossible.

It should be considered that the detailed description should not be construed as restrictive in all terms and is exemplary. The scope of the present disclosure should be determined by rational construing of the appended claims and all modifications within an equivalent scope of the present disclosure are included in the scope of the present disclosure.

The invention claimed is:

1. A display device comprising:
    a housing having a base, the housing configured to elongate;
    a roller installed on the base inside the housing;
    a display panel configured to be rolled on to the roller and unrolled from the roller;
    a module cover configured to elongate in a longitudinal direction of the housing, the module cover including a plurality of segments sequentially arranged in an up-down direction of the display panel in a rear of the display panel, the module cover configured to be rolled on the roller and unrolled from the roller jointly with the display panel;
    a foldable link which is positioned in the rear of the display panel, the foldable link having one side that is pivotably connected to the housing and an other side that is pivotably connected to a top of the module cover, the foldable link configured to erect the display panel and the module cover while unrolling the display panel and the module cover from the roller;
    a speaker assembly installed inside the housing, and including a curved surface corresponding to a curvature of the roller and spaced apart from an outer peripheral surface of the roller; and
    a buffer member fixed to the curved surface of the speaker assembly between the curved surface of the speaker assembly and the outer peripheral surface of the roller.

2. The display device of claim 1, wherein the buffer member includes:
    a first sub buffer member positioned at a top of the curved surface, and a second sub buffer member positioned at a bottom of the curved surface and positioned adjacent to the first sub buffer member.

3. The display device of claim 1,
wherein a segment of the plurality of segments includes:
   a first bead positioned adjacent to one end of the segment and penetrating the segment up and down,
   a second bead positioned adjacent to the other end of the segment and penetrating the segment up and down, and
   a penetration portion positioned between the first bead and the second bead, and penetrating the segment up and down, and
wherein the module cover includes
   a first area positioned between one end of the segment and the first bead,
   a second area positioned between the first bead and the penetration portion,
   a third area positioned between the penetration portion and the second bead, and
   a fourth area positioned between the second bead and the other end of the segment.

4. The display device of claim 3,
wherein the speaker assembly includes:
   a first speaker assembly which elongates in the longitudinal direction of the housing toward the center from one side of the housing, and
   a second speaker assembly which elongates in the longitudinal direction of the housing toward the center from the other side of the housing, and
wherein a length of the segment of the module cover is larger than a sum of the length of the first speaker assembly and the length of the second speaker assembly.

5. The display device of claim 4, wherein the buffer member includes:
   a first buffer member corresponding to the first area and positioned in the first speaker assembly,
   a second buffer member corresponding to the second area and positioned in the first speaker assembly,
   a third buffer member corresponding to the third area and positioned in the second speaker assembly, and
   a fourth buffer member corresponding to the fourth area and positioned in the second speaker assembly.

6. A display device comprising:
a housing configured to elongate;
a roller installed inside the housing;
a display panel configured to be rolled on to the roller and unrolled from the roller;
a module cover configured to elongate in a longitudinal direction of the housing, the module cover including a plurality of segments sequentially arranged in an up-down direction of the display panel in a rear of the display panel, the module cover configured to be rolled on the roller and unrolled from the roller jointly with the display panel;
a foldable link which is positioned in the rear of the display panel, the foldable link having one side that is pivotably connected to the housing and an other side that is pivotably connected to a top of the module cover, the foldable link configured to erect the display panel and the module cover while unrolling the display panel and the module cover from the roller;
a base mounted on a lower end of the housing; and
a bumper which protrudes toward an outer peripheral surface of the roller from the base and spaced apart from the outer peripheral surface of the roller.

7. The display device of claim 6, further comprising:
a buffer member fixed to an upper end of the buffer.

8. The display device of claim 7,
wherein the base includes:
   a vertical portion extended toward the roller from the base, and
   a horizontal portion bent from the vertical portion of the base and positioned adjacent to a lower end of the outer peripheral surface of the roller, and
wherein the bumper is formed on the horizontal portion.

* * * * *